(12) United States Patent
Yang et al.

(10) Patent No.: US 11,064,846 B2
(45) Date of Patent: Jul. 20, 2021

(54) LIQUID DISPENSING UNITS

(71) Applicant: simplehuman, LLC, Torrance, CA (US)

(72) Inventors: Frank Yang, Rancho Palos Verdes, CA (US); David Wolbert, Manhattan Beach, CA (US); Joseph Sandor, Newport Beach, CA (US); Orlando Cardenas, Laguna Niguel, CA (US); Guy Cohen, Marina Del Rey, CA (US)

(73) Assignee: simplehuman, LLC, Torrance, CA (US)

( * ) Notice: Subject to any disclaimer, the term of this patent is extended or adjusted under 35 U.S.C. 154(b) by 0 days.

(21) Appl. No.: 15/707,806

(22) Filed: Sep. 18, 2017

(65) Prior Publication Data

US 2018/0220850 A1 Aug. 9, 2018

Related U.S. Application Data

(62) Division of application No. 14/661,372, filed on Mar. 18, 2015, now Pat. No. 9,763,546, which is a division
(Continued)

(51) Int. Cl.
*A47K 5/12* (2006.01)
*H05K 13/00* (2006.01)
(Continued)

(52) U.S. Cl.
CPC .......... *A47K 5/1211* (2013.01); *A47K 5/1217* (2013.01); *B05B 11/3043* (2013.01);
(Continued)

(58) Field of Classification Search
CPC ............................ A47K 5/1211; A47K 5/1217; B05B 11/3043; B05B 12/122; B05B 9/0861; B65D 25/00; H05K 13/00; B67D 7/08
(Continued)

(56) References Cited

U.S. PATENT DOCUMENTS 2,017,867 A 10/1935 Nantz
2,106,043 A 1/1938 Urquhart et al.
(Continued)

FOREIGN PATENT DOCUMENTS

AU 364945 10/2015
AU 201613950 9/2016
(Continued)

OTHER PUBLICATIONS

U.S. Appl. No. 29/587,080, filed Dec. 9, 2016, Yang et al.
(Continued)

*Primary Examiner* — Vishal Pancholi
*Assistant Examiner* — Robert K Nichols, II
(74) *Attorney, Agent, or Firm* — Knobbe, Martens, Olson & Bear, LLP

(57) ABSTRACT

A soap dispenser can be configured to dispense an amount of liquid soap, for example, upon detecting the presence of an object. Certain embodiments of the dispenser include a housing, reservoir, pump, motor, sensor, electronic processor, and nozzle. In certain embodiments, the sensor can be configured to generate a signal based on a distance between an object and the sensor. In certain embodiments, the electronic processor can be configured to receive the signal from the sensor and to determine a dispensation volume of the liquid. The dispensation volume can vary as a function of the distance between the object and the sensor. The processor can be configured to control the motor to dispense approximately the dispensation volume of the liquid.

32 Claims, 61 Drawing Sheets

Related U.S. Application Data of application No. 13/762,265, filed on Feb. 7, 2013, now Pat. No. 9,265,383.

(60) Provisional application No. 61/609,213, filed on Mar. 9, 2012, provisional application No. 61/596,672, filed on Feb. 8, 2012.

(51) Int. Cl.
  *B65D 25/00* (2006.01)
  *B05B 12/12* (2006.01)
  *B05B 11/00* (2006.01)

(52) U.S. Cl.
  CPC ............ *B05B 12/122* (2013.01); *B65D 25/00* (2013.01); *H05K 13/00* (2013.01); *Y10T 29/49002* (2015.01)

(58) Field of Classification Search
  USPC .................... 141/83, 94, 198; 222/63; 4/623
  See application file for complete search history.

(56) References Cited

U.S. PATENT DOCUMENTS

| | | |
|---|---|---|
| 2,651,545 A | 9/1953 | Shotton |
| 2,697,446 A | 12/1954 | Harrington |
| 2,772,817 A | 12/1956 | Jauch |
| 3,023,922 A | 3/1962 | Arrington et al. |
| 3,149,754 A | 9/1964 | Kogan et al. |
| 3,220,954 A | 11/1965 | Malbe |
| 3,531,021 A | 9/1970 | Bassett |
| 3,631,736 A | 1/1972 | Saari |
| 3,701,482 A | 10/1972 | Sachnik |
| 4,046,289 A | 9/1977 | Teranishi |
| 4,056,050 A | 11/1977 | Brown |
| 4,113,147 A | 9/1978 | Frazier et al. |
| 4,202,387 A | 5/1980 | Upton |
| 4,217,993 A | 8/1980 | Jess et al. |
| 4,457,455 A | 7/1984 | Meshberg |
| 4,498,843 A | 2/1985 | Schneider et al. |
| 4,524,805 A | 6/1985 | Hoffman |
| 4,693,854 A | 9/1987 | Yau |
| 4,722,372 A | 2/1988 | Hoffman et al. |
| 4,801,249 A | 1/1989 | Kakizawa |
| 4,915,347 A | 4/1990 | Iqbal et al. |
| 4,921,131 A | 5/1990 | Binderbauer et al. |
| 4,938,384 A | 7/1990 | Pilolla |
| 4,946,070 A | 8/1990 | Albert et al. |
| 4,967,935 A | 11/1990 | Celest |
| 5,028,328 A | 7/1991 | Long |
| 5,082,150 A | 1/1992 | Steiner et al. |
| 5,105,992 A | 4/1992 | Fender et al. |
| 5,169,040 A | 12/1992 | Wiley |
| 5,186,360 A | 2/1993 | Mease et al. |
| 5,199,118 A | 4/1993 | Cole et al. |
| 5,255,822 A | 10/1993 | Mease et al. |
| 5,271,528 A | 12/1993 | Chien |
| 5,305,916 A | 4/1994 | Suzuki et al. |
| 5,449,280 A | 9/1995 | Maki et al. |
| 5,466,131 A | 11/1995 | Altham et al. |
| 5,472,719 A | 12/1995 | Favre |
| 5,477,984 A | 12/1995 | Sayama et al. |
| 5,509,578 A | 4/1996 | Livingstone |
| 5,632,414 A | 5/1997 | Merriweather, Jr. |
| 5,771,925 A | 6/1998 | Lewandowski |
| 5,823,390 A | 10/1998 | Muderlak et al. |
| 5,829,636 A | 11/1998 | Vuong et al. |
| 5,836,482 A | 11/1998 | Ophardt et al. |
| 5,855,356 A * | 1/1999 | Fait .................. E03C 1/057 236/12.12 |
| 5,868,311 A * | 2/1999 | Cretu-Petra ............ E03C 1/057 236/12.12 |
| 5,960,991 A | 10/1999 | Ophardt |
| D416,154 S | 11/1999 | Diehl |
| 5,988,451 A | 11/1999 | Hanna |
| 6,021,705 A | 2/2000 | Dijs |
| 6,021,960 A | 2/2000 | Kehat |
| 6,036,056 A | 3/2000 | Lee et al. |
| 6,048,183 A | 4/2000 | Meza |
| D426,093 S | 6/2000 | Cayouette |
| D426,413 S | 6/2000 | Kreitemier et al. |
| 6,126,290 A | 10/2000 | Veigel |
| D433,944 S | 11/2000 | Bernard |
| 6,142,340 A | 11/2000 | Watanabe et al. |
| D438,041 S | 2/2001 | Huang |
| 6,209,752 B1 | 4/2001 | Mitchell et al. |
| RE37,173 E | 5/2001 | Jefferson, Jr. et al. |
| 6,269,735 B1 | 8/2001 | Rolfes |
| 6,279,460 B1 | 8/2001 | Pope |
| 6,279,777 B1 | 8/2001 | Goodin et al. |
| 6,311,868 B1 | 11/2001 | Krietemeier et al. |
| 6,325,604 B1 | 12/2001 | Du |
| 6,375,038 B1 | 4/2002 | Daansen et al. |
| 6,390,329 B1 | 5/2002 | Maddox |
| 6,443,328 B1 | 9/2002 | Fehl et al. |
| 6,444,956 B1 | 9/2002 | Witcher et al. |
| D471,047 S | 3/2003 | Gordon et al. |
| 6,557,584 B1 | 5/2003 | Lucas et al. |
| 6,594,105 B1 | 7/2003 | Brittner |
| D477,956 S | 8/2003 | Grisdale et al. |
| 6,619,938 B2 | 9/2003 | Woodruff |
| D483,974 S | 12/2003 | Reed |
| D484,573 S | 12/2003 | Haug et al. |
| D486,335 S | 2/2004 | Sonneman |
| 6,698,616 B2 | 3/2004 | Hidle et al. |
| 6,722,265 B2 | 4/2004 | Priley |
| D490,262 S | 5/2004 | Graves et al. |
| 6,748,850 B1 | 6/2004 | Kraan |
| 6,777,007 B2 | 8/2004 | Cai |
| 6,805,042 B2 | 10/2004 | Mordini et al. |
| 6,824,369 B2 | 11/2004 | Raymond |
| D499,295 S | 12/2004 | Grisdale et al. |
| 6,832,542 B2 | 12/2004 | Hu et al. |
| 6,892,899 B2 | 5/2005 | Minard et al. |
| 6,929,150 B2 | 8/2005 | Muderlak et al. |
| 6,971,549 B2 | 12/2005 | Leifheit et al. |
| 7,008,073 B2 | 3/2006 | Stuhlmacher |
| D530,954 S | 10/2006 | Snell |
| D531,440 S | 11/2006 | Lo |
| D531,441 S | 11/2006 | Soriano |
| D531,845 S | 11/2006 | Christianson |
| D534,753 S | 1/2007 | Christianson |
| 7,178,746 B2 | 2/2007 | Gross |
| 7,213,593 B2 | 5/2007 | Hochrainer |
| D554,412 S | 11/2007 | Yang et al. |
| 7,296,765 B2 | 11/2007 | Rodrian |
| D560,942 S | 2/2008 | Hanna |
| D564,273 S | 3/2008 | Yang et al. |
| 7,337,635 B2 | 3/2008 | Cerruti et al. |
| D565,878 S | 4/2008 | Krus |
| 7,354,015 B2 | 4/2008 | Byrd et al. |
| D581,193 S | 11/2008 | Ghiorghie |
| D582,187 S | 12/2008 | Yang et al. |
| 7,479,000 B2 | 1/2009 | Klassen |
| D593,784 S | 6/2009 | Chan |
| 7,540,397 B2 | 6/2009 | Muderlak et al. |
| D604,544 S | 11/2009 | Daams |
| 7,637,893 B2 | 12/2009 | Christensen et al. |
| D608,578 S | 1/2010 | Yang et al. |
| D622,991 S | 9/2010 | MacDonald et al. |
| D626,365 S | 11/2010 | Yang et al. |
| D644,523 S | 9/2011 | Howell et al. |
| D644,529 S | 9/2011 | Padain et al. |
| D644,530 S | 9/2011 | Padain et al. |
| D644,531 S | 9/2011 | Padain et al. |
| 8,087,543 B2 | 1/2012 | Yang et al. |
| 8,096,445 B2 | 1/2012 | Yang et al. |
| 8,109,301 B1 | 2/2012 | Denise |
| 8,109,411 B2 | 2/2012 | Yang et al. |
| 8,152,027 B1 | 4/2012 | Baker |
| D658,915 S | 5/2012 | Fernandes et al. |
| D659,452 S | 5/2012 | Yang et al. |
| D659,454 S | 5/2012 | Fritz et al. |

(56) References Cited

U.S. PATENT DOCUMENTS

| | | |
|---|---|---|
| D660,061 S | 5/2012 | Fernandes et al. |
| D661,531 S | 6/2012 | Tompkin |
| D661,933 S | 6/2012 | Delgigante et al. |
| D663,983 S | 7/2012 | Yang et al. |
| D664,387 S | 7/2012 | Kennedy |
| D672,177 S | 12/2012 | Zeng |
| D674,636 S | 1/2013 | Yang et al. |
| 8,360,285 B2 | 1/2013 | Grbesic |
| D676,116 S | 2/2013 | Judd |
| D682,589 S | 5/2013 | Cheng |
| D688,488 S | 8/2013 | Wang |
| D689,299 S | 9/2013 | Kassem Llano et al. |
| D690,129 S | 9/2013 | Clough et al. |
| D690,130 S | 9/2013 | Clough et al. |
| D690,131 S | 9/2013 | Clough et al. |
| D690,530 S | 10/2013 | Clough et al. |
| 8,550,378 B2 | 10/2013 | Mazooji et al. |
| D693,597 S | 11/2013 | Yang et al. |
| D699,047 S | 2/2014 | Lissoni |
| D699,475 S | 2/2014 | Yang et al. |
| D699,574 S | 2/2014 | Cox et al. |
| 8,662,356 B2 | 3/2014 | Padain et al. |
| 8,678,244 B2 | 3/2014 | Yang et al. |
| D706,549 S | 6/2014 | Cho |
| D717,066 S | 11/2014 | Deacon |
| 8,893,928 B2 * | 11/2014 | Proper ............... B67D 7/76 222/173 |
| D721,279 S | 1/2015 | Van Handel et al. |
| D727,653 S | 4/2015 | Bjerre-Poulsen et al. |
| D731,203 S | 6/2015 | Watson et al. |
| D731,204 S | 6/2015 | Watson et al. |
| D732,308 S | 6/2015 | Enga et al. |
| D746,136 S | 12/2015 | Liu |
| 9,265,383 B2 | 2/2016 | Yang et al. |
| 9,375,741 B2 | 6/2016 | Turner |
| D770,798 S | 11/2016 | Yang et al. |
| D773,847 S | 12/2016 | Judd |
| D773,848 S | 12/2016 | Yang et al. |
| D785,970 S | 5/2017 | Yang et al. |
| D786,579 S | 5/2017 | Beck et al. |
| 9,763,546 B2 | 9/2017 | Yang et al. |
| D818,741 S | 5/2018 | Yang et al. |
| 10,076,216 B2 | 9/2018 | Yang et al. |
| D829,465 S | 10/2018 | Yang et al. |
| 10,588,467 B2 | 3/2020 | Yang et al. |
| 10,806,305 B2 | 10/2020 | Yang et al. |
| 2002/0179643 A1 | 12/2002 | Knight et al. |
| 2002/0185002 A1 | 12/2002 | Herrmann |
| 2003/0068242 A1 | 4/2003 | Yamakawa |
| 2004/0032749 A1 | 2/2004 | Schindler et al. |
| 2004/0050875 A1 | 3/2004 | Kobayashi |
| 2004/0077187 A1 | 4/2004 | Belongia et al. |
| 2004/0103792 A1 | 6/2004 | Cirigliano et al. |
| 2004/0134924 A1 | 7/2004 | Hansen et al. |
| 2004/0226962 A1 | 11/2004 | Mazursky et al. |
| 2005/0006407 A1 | 1/2005 | Lawson et al. |
| 2005/0139612 A1 | 6/2005 | Matthews et al. |
| 2005/0279783 A1 * | 12/2005 | Lo ............... B05B 9/0866 222/639 |
| 2006/0067546 A1 | 3/2006 | Lewis et al. |
| 2006/0173576 A1 | 8/2006 | Goerg et al. |
| 2006/0243740 A1 | 11/2006 | Reynolds et al. |
| 2007/0000941 A1 | 1/2007 | Hadden et al. |
| 2007/0138202 A1 | 6/2007 | Evers |
| 2007/0138208 A1 | 6/2007 | Scholz et al. |
| 2007/0158359 A1 | 7/2007 | Rodrian |
| 2007/0274853 A1 | 11/2007 | Merendeiro et al. |
| 2008/0149669 A1 | 6/2008 | Nicholson et al. |
| 2008/0277411 A1 | 11/2008 | Beland et al. |
| 2008/0277421 A1 | 11/2008 | Zlatic et al. |
| 2008/0283556 A1 | 11/2008 | Snodgrass |
| 2009/0026225 A1 | 1/2009 | Lickstein |
| 2009/0088836 A1 | 4/2009 | Bishop et al. |
| 2009/0140004 A1 | 6/2009 | Scorgie |
| 2009/0184134 A1 | 7/2009 | Ciavarella et al. |
| 2009/0200340 A1 | 8/2009 | Ophardt et al. |
| 2010/0031982 A1 | 2/2010 | Hornsby et al. |
| 2010/0051642 A1 | 3/2010 | Wong et al. |
| 2010/0282772 A1 | 11/2010 | Ionidis |
| 2010/0320227 A1 | 12/2010 | Reynolds |
| 2011/0017769 A1 | 1/2011 | Ophardt |
| 2011/0114669 A1 | 5/2011 | Yang et al. |
| 2012/0111895 A1 | 5/2012 | Fitzpatrick et al. |
| 2012/0138632 A1 | 6/2012 | Li et al. |
| 2012/0138637 A1 | 6/2012 | Ciavarella et al. |
| 2012/0285992 A1 | 11/2012 | Ciavarella et al. |
| 2012/0318820 A1 * | 12/2012 | Amsel ............... A47K 5/1217 222/63 |
| 2013/0119083 A1 | 5/2013 | Ophardt et al. |
| 2013/0140323 A1 | 6/2013 | Yun et al. |
| 2013/0200109 A1 | 8/2013 | Yang et al. |
| 2013/0214011 A1 | 8/2013 | Vandekerchkhove et al. |
| 2014/0103072 A1 | 4/2014 | Pelfrey |
| 2014/0137982 A1 * | 5/2014 | Nicholls ............... B67D 1/0007 141/83 |
| 2015/0265106 A1 | 9/2015 | Rospierski |
| 2016/0256016 A1 | 9/2016 | Yang et al. |
| 2017/0015541 A1 | 1/2017 | Vulpitta et al. |
| 2018/0263432 A1 | 9/2018 | Yang et al. |
| 2018/0360276 A1 | 12/2018 | Yang et al. |

FOREIGN PATENT DOCUMENTS

| | | |
|---|---|---|
| CA | 141847 | 4/2012 |
| CA | 144016 | 4/2012 |
| CA | 147357 | 4/2013 |
| CA | 152683 | 5/2014 |
| CA | 2677130 C | 8/2015 |
| CA | 164020 | 4/2016 |
| CA | 164266 | 5/2016 |
| CA | 169670 | 3/2017 |
| CA | 177019 | 4/2018 |
| CN | 1285899 A | 2/2001 |
| CN | 101606828 A | 12/2009 |
| CN | 102058336 A | 5/2011 |
| CN | 302362836 S | 3/2013 |
| CN | 303102706 S | 2/2015 |
| CN | 303662896 S | 5/2016 |
| CN | 103619226 B | 9/2016 |
| CN | 304007050 S | 1/2017 |
| CN | 104203058 B | 7/2017 |
| CN | ZL 201730168630.4 | 2/2018 |
| DE | 3718967 C2 | 5/1994 |
| EP | 0455431 A1 | 11/1991 |
| EP | 0493865 A1 | 7/1992 |
| EP | 2135538 A1 | 12/2009 |
| EP | 2322068 A2 | 5/2011 |
| EP | 001342687-0001 | 9/2012 |
| EP | 2546523 A2 | 1/2013 |
| EP | 2738387 A1 | 6/2014 |
| EP | 001438402-0001 | 11/2015 |
| EP | 002764860-0001 | 11/2015 |
| EP | 3064114 | 9/2016 |
| EP | 003313204-0001 | 9/2016 |
| EP | 2811881 B1 | 11/2016 |
| EP | 004350817-0001 | 9/2017 |
| EP | 3403555 A1 | 11/2018 |
| GB | 6018576 | 11/2017 |
| JP | H07-23876 | 1/1995 |
| JP | D1117308 | 6/2001 |
| JP | D1266683 | 2/2006 |
| JP | 2013-133754 A | 7/2013 |
| JP | D1553147 | 6/2016 |
| JP | 1613152 | 8/2018 |
| KR | 3002845520000 | 11/2001 |
| WO | WO 2008/095187 | 8/2008 |
| WO | WO 2008/103300 A2 | 8/2008 |
| WO | WO 2012/122056 | 9/2012 |
| WO | WO 2012/154642 A1 | 11/2012 |

(56) References Cited

FOREIGN PATENT DOCUMENTS

WO     WO 2013/119642 A1     8/2013
WO     WO 2013/119874 A1     8/2013

OTHER PUBLICATIONS

U.S. Appl. No. 15/922,227, filed Mar. 15, 2018, Yang et al.
Simplehuman® Rechargeable Sensor Soap Dispenser, Item No. 201881, https://www.sharperimage.com/si/view/product/Rechargeable-Sensor-Soap-Dispenser/201881?trail, published on Sep. 3, 2013, in 3 pages.
Manring et al., "The Theoretical Flow Ripple of an External Gear Pump," Transactions of the ASME, vol. 125, Sep. 2003, pp. 396-404.
The Sharper Image Soap Genie SI335, Mar. 2006, in 8 pages.
International Search Report in corresponding PCT Application No. PCT/US2013/025227, dated Feb. 25, 2014, in 15 pages.
International Preliminary Report on Patentability in corresponding PCT Application No. PCT/US2013/025227, dated Aug. 21, 2014, in 10 pages.
Office Action in corresponding Canadian Application No. 2862506, dated Nov. 23, 2018, in 7 pages.
Office Action in corresponding Chinese Application No. 201380016516.9, dated Mar. 28, 2016, in 12 pages.

\* cited by examiner

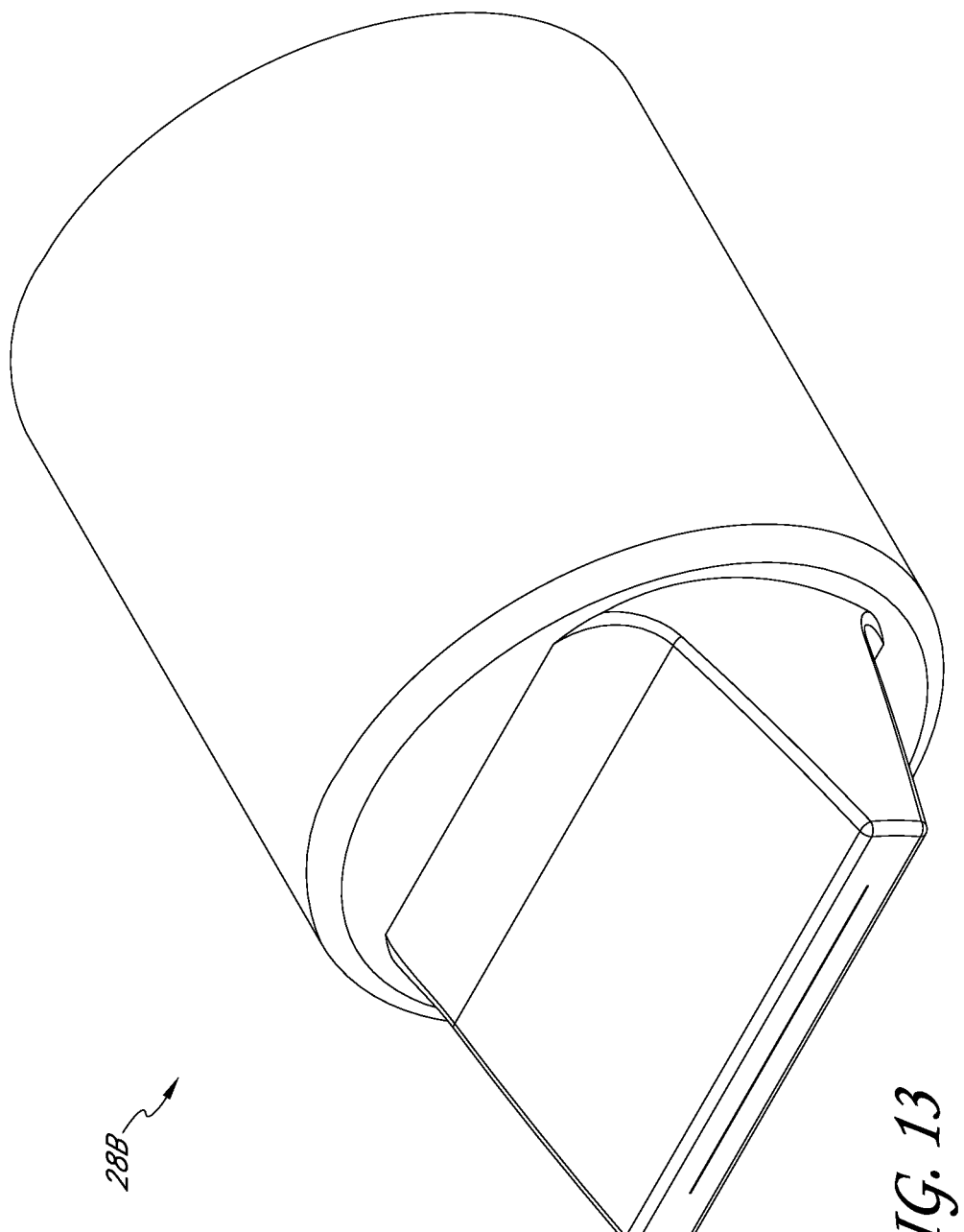

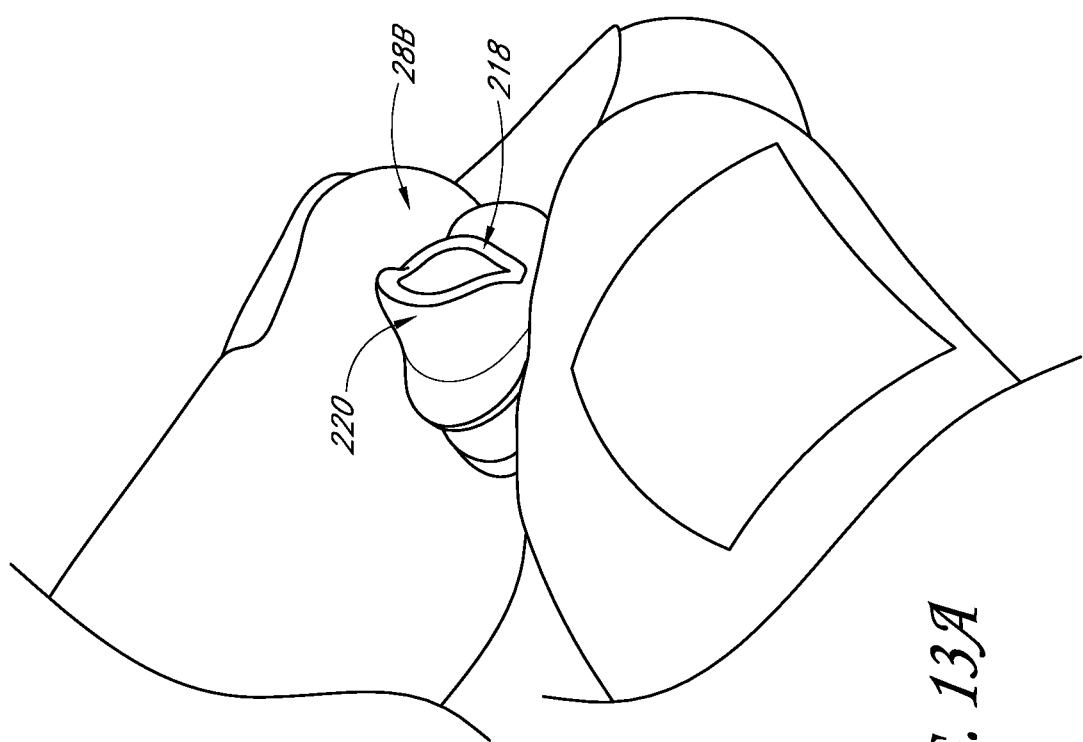

LIQUID DISPENSING UNITS

CROSS-REFERENCE TO RELATED APPLICATIONS

This present application is a divisional of U.S. application Ser. No. 14/661,372, filed Mar. 18, 2015, entitled "Liquid Dispensing Units," which is a divisional of U.S. application Ser. No. 13/762,265, filed Feb. 7, 2013, entitled "Liquid Dispensing Units," which claims priority benefit under 35 U.S.C. § 119(e) to U.S. Provisional Application No. 61/596,672, filed Feb. 8, 2012, entitled "Soap Dispensing Units," and U.S. Provisional Application No. 61/609,213, filed Mar. 9, 2012, entitled "Soap Dispensing Units." All of the aforementioned applications are hereby incorporated by reference in their entirety.

BACKGROUND

Field

The present disclosure relates to liquid dispensers, and more particularly, some embodiments relate to electronic liquid dispensers.

Description of the Related Art

Users of modern public washroom facilities increasingly desire that each of the fixtures in the washroom operate automatically without being touched by the user's hand. This is important in view of increased user awareness of the degree to which germs and bacteria may be transmitted from one person to another in a public washroom environment. Today, it is not uncommon to find public washrooms with automatic, hands-free operated toilet and urinal units, hand washing faucets, soap dispensers, hand dryers, and door opening mechanisms. This automation allows the user to avoid touching any of the fixtures in the facility, and therefore lessens the opportunity for the transmission of disease-carrying germs or bacteria resulting from manual contact with the fixtures in the washroom.

SUMMARY

In some embodiments, a liquid dispenser such as a soap dispenser comprises a proximity sensor or a reflective type sensor configured to generate a signal representing the distance between an object and the sensor, and an electronic processor configured to generate an electronic signal to the motor for dispensing a volume of soap that varies depending on the distance between the object and the sensor.

In some embodiments, a liquid dispenser comprises a removable cartridge configured to contain a volume of liquid such as soap and a battery in a single disposable unit. The removable cartridge can include attachment members to help attach the cartridge to the pump during use in a manner that permits the cartridge to be removed after the liquid and/or battery is spent.

In some embodiments, a disposable cartridge for an electric liquid dispenser comprises a cartridge housing with attachment members configured to removably attach to a pump housing; a reservoir within or attached to the cartridge housing configured to contain a volume of liquid such as soap; a battery within or attached to the cartridge housing configured to provide sufficient electrical energy to power a liquid dispenser for at least the period during which the liquid such as soap contained within the reservoir will be used during normal usage.

Certain aspects of this disclosure are directed toward liquid dispensers including a housing, a reservoir, a fluid passage, a pump, a motor, a first sensor, and an electronic processor. The reservoir can be configured to store liquid. The fluid passage can be disposed in the housing and can include an inlet and an outlet. The pump can be disposed in the housing. The pump can include an opening disposed in a pump body, and the opening can be in fluid communication with the reservoir. The pump can be configured to allow air disposed therein to pass through the opening. The motor can be disposed in the housing. The motor can be configured to drive the pump, which can be configured to encourage a flow of liquid from the reservoir into the inlet and out of the outlet of the fluid passage. The first sensor can be configured to generate a signal representing a distance between an object and the first sensor. The electronic processor can be configured to receive the signal from the first sensor and to determine a dispensation volume of the liquid or another variable characteristic of the dispensed liquid, such as the type of liquid to be dispensed (e.g., soap or lotion or sanitizer, or different types or grades of these liquids, etc). In a system in which multiple types of liquid can be dispensed, a plurality of liquid reservoirs and valves can be utilized to control the flow of multiple liquids. The dispensation volume or other liquid characteristic can vary as a function of the distance between the object and the first sensor. The processor can be configured to control the motor to dispense approximately the desired dispensation volume of the liquid.

Any of the liquid dispenser features, structures, steps, or processes disclosed in this specification can be included in any embodiments. The motor can be configured to dispense a first volume of fluid when the object is within a first distance from the first sensor and dispense a second volume of fluid when the object is within a second distance from the first sensor. The first volume can be smaller than the second volume, and the first distance can be less than a second distance. The liquid dispenser can include a second sensor configured to generate a signal when the object is within a sensing region of the second sensor. The dispensation volume can be bound by an upper dispensation amount limit. The electronic processor can include one or more subroutines configured to generate an electronic signal to the motor for dispensing the upper dispensation amount limit of the liquid when the object is within the sensing region of the second sensor. The first sensor can be configured to be activated and deactivated. The electronic processor can be configured to deactivate the first sensor for a period of time after the first sensor generates the signal based on the distance between the object and the first sensor, thereby inhibiting the sensor from generating an additional instance of the signal during the period of time. The electronic processor can be configured to calibrate a first distance to correspond to a first volume and calibrate a second distance to correspond to a second volume. The liquid dispenser can include a port configured to connect the liquid dispenser to a computer. The liquid dispenser can include a user input device configured to manually dispense the volume of liquid.

Certain aspects of this disclosure are directed toward methods of manufacturing a soap dispenser. In certain aspects, the methods can include forming the soap dispenser. The soap dispenser can include a pump, a motor, a first sensor, and an electronic processor. In certain aspects, the methods can include configuring the first sensor to generate a signal representing a distance between an object and the first sensor. In certain aspects, the methods can include configuring the electronic processor to check for signals generated by the first sensor. In certain aspects, the methods can include configuring the electronic processor to generate a signal to the motor to dispense a volume of soap that varies depending on the distance between the object and the sensor.

The method of manufacturing steps disclosed in this specification can be used in any embodiments. Configuring the electronic processor to generate the signal to the motor can include generating a first signal to the motor to dispense a first volume of fluid when the object is within a first distance from the first sensor and generating a second signal to dispense a second volume of fluid when the object is within a second distance from the first sensor. The first volume can be smaller than the second volume, and the first distance can be less than the second distance. The methods can include generating a second signal with a second sensor of the soap pump and receiving the second signal in the processor. The methods can include configuring the electronic processor to generate a signal to the motor to dispense a predetermined volume of soap when the object is detected within a sensing region of a second sensor. The methods can include configuring the electronic processor to deactivate the first sensor for a period of time after the first sensor generates the signal representing the distance between the object and the first sensor.

Certain aspects of this disclosure are directed toward liquid dispensers such as soap dispensers having a removable cartridge. The liquid dispenser can include a housing, a fluid passage, a pump, and a motor. The fluid passage, the pump, and the motor can be disposed in the housing. The fluid passage can include an inlet and an outlet. The pump can include an opening disposed in a pump body, and the opening can be in fluid communication with the removable cartridge. The removable cartridge can comprise one or more liquid reservoirs configured to contain at least one liquid such as soap (or multiple liquids in some embodiments with a plurality of reservoirs), and a power source in a single disposable unit. The motor can be configured to a drive the pump to encourage a flow of liquid such as soap from the removable cartridge into the inlet and out of the outlet of the fluid passage.

The liquid dispenser features disclosed in this specification can be included in any embodiments. The power source can include a battery. The dispenser can include a removable cartridge capable of engaging a bottom portion of the housing. The pump can include at least two gears. The pump can be positioned near an upper portion of the soap dispenser. The motor can be disposed between the pump and a top surface of the housing. The pump can be configured to discharge liquid such as soap from a pump outlet in a generally vertical pathway. The liquid dispenser can include a user input device configured to manually dispense liquid. The liquid dispenser can include a removable cartridge having an indicator configured to indicate at least one characteristic of the cartridge to the pump. In certain aspects, the at least one characteristic of the cartridge is selected from the group consisting of a brand of the liquid, a viscosity of the liquid, a moisture content of the liquid, a volume of the liquid, the type of liquid or liquids (soap, lotion, sanitizer, etc), and a battery capacity. In certain aspects, at least one output characteristic of the pump can be adjusted based on the at least one characteristic of the cartridge. In certain aspects, the at least one output characteristic is selected from the group consisting of a dispensation volume, a dispensation period, a motor duty cycle, a pumping pressure, and an operational voltage.

Certain aspects of this disclosure are directed toward a disposable cartridge for an electric liquid dispenser. The cartridge can include a housing having attachment members configured to removably attach to a pump housing. The cartridge can include a reservoir or reservoirs within or attached to the cartridge housing and configured to contain a volume of liquid such as soap and/or other types of liquid. The reservoir can be configured to contain a volume of liquid such as soap. The volume of liquid can be configured to be about exhausted after a set number of dispensation cycles during normal use of the liquid dispenser. The cartridge can include a battery within or attached to the cartridge housing. The battery can be configured to provide sufficient electrical energy to power a motor of the soap dispenser for about or at least about the set number of dispensation cycles.

The features of the disposable cartridge disclosed in this specification can be included in any embodiments. The cartridge can include soap or another type of liquid in the reservoir. The battery can be configured to be exhausted at about the same time as a volume of soap is exhausted. The cartridge can include a one-way valve. The cartridge can include a seal configured to be punctured or otherwise moved or opened when the cartridge housing attaches to the soap pump housing.

Certain aspects of this disclosure are directed toward a fluid cartridge for an electrical fluid dispenser. The fluid cartridge can include a disposable housing configured to attach to a pump unit. The cartridge can include a reservoir, an engagement mechanism, and an indicator. The engagement mechanism can be configured to removably attach the housing to the pump unit. The indicator can be configured to indicate at least one characteristic of the cartridge to the pump unit, such as a characteristic regarding the one or more liquids in the one or more reservoirs in the cartridge, the volume of liquid left in one or more reservoirs in the cartridge, the remaining power of the battery in the cartridge, etc.

The features of the fluid cartridge disclosed in this specification can be included in any embodiments. The fluid cartridge can include a battery attached to the disposable housing. The at least one characteristic can be selected from the group consisting of a brand of a fluid in the reservoir, a viscosity of the fluid, a moisture content of the fluid, a volume of the fluid, and a battery capacity. The indicator can include a configuration of one or more structures, the configuration representing the at least one characteristic of the cartridge. The indicator can include electronic circuitry configured to produce an electronic signal. The electronic signal can represent the at least one characteristic of the cartridge. The engagement indication element can be configured to indicate that the fluid cartridge is properly engaged with the pump unit. The engagement mechanism can include one or more protrusions configured to be received in a corresponding one or more openings of the pump unit.

For purposes of summarizing the disclosure, certain aspects, advantages and features of the inventions have been described herein. It is to be understood that not necessarily any or all such advantages will be achieved in accordance with any or all particular embodiments of the inventions disclosed herein.

BRIEF DESCRIPTION OF THE DRAWINGS

Certain features, aspects, and advantages of the subject matter disclosed herein are described below with reference to the drawings, which are intended to illustrate and not to limit the scope of the disclosure. Various features of different disclosed embodiments can be combined to form additional embodiments, which are part of this disclosure. No structures, features, steps, or processes are essential or critical; any can be omitted in certain embodiments. The drawings comprise the following figures:

FIG. 13 illustrates a perspective view of the discharge nozzle of FIG. 10.

FIG. 13A illustrates a perspective view of the discharge nozzle of FIG. 13 in a compressed state squeezed between two fingers, showing the discharge nozzle in an open configuration.

DETAILED DESCRIPTION

A variety of soap dispensers are described below to illustrate various examples that may be employed to achieve one or more desired improvements. These examples are only illustrative and not intended in any way to restrict the general inventions presented and the various aspects and features of these inventions. Furthermore, the phraseology and terminology used herein is for the purpose of description and should not be regarded as limiting. No features, structure, or step disclosed herein is essential or indispensable.

Figure 1:
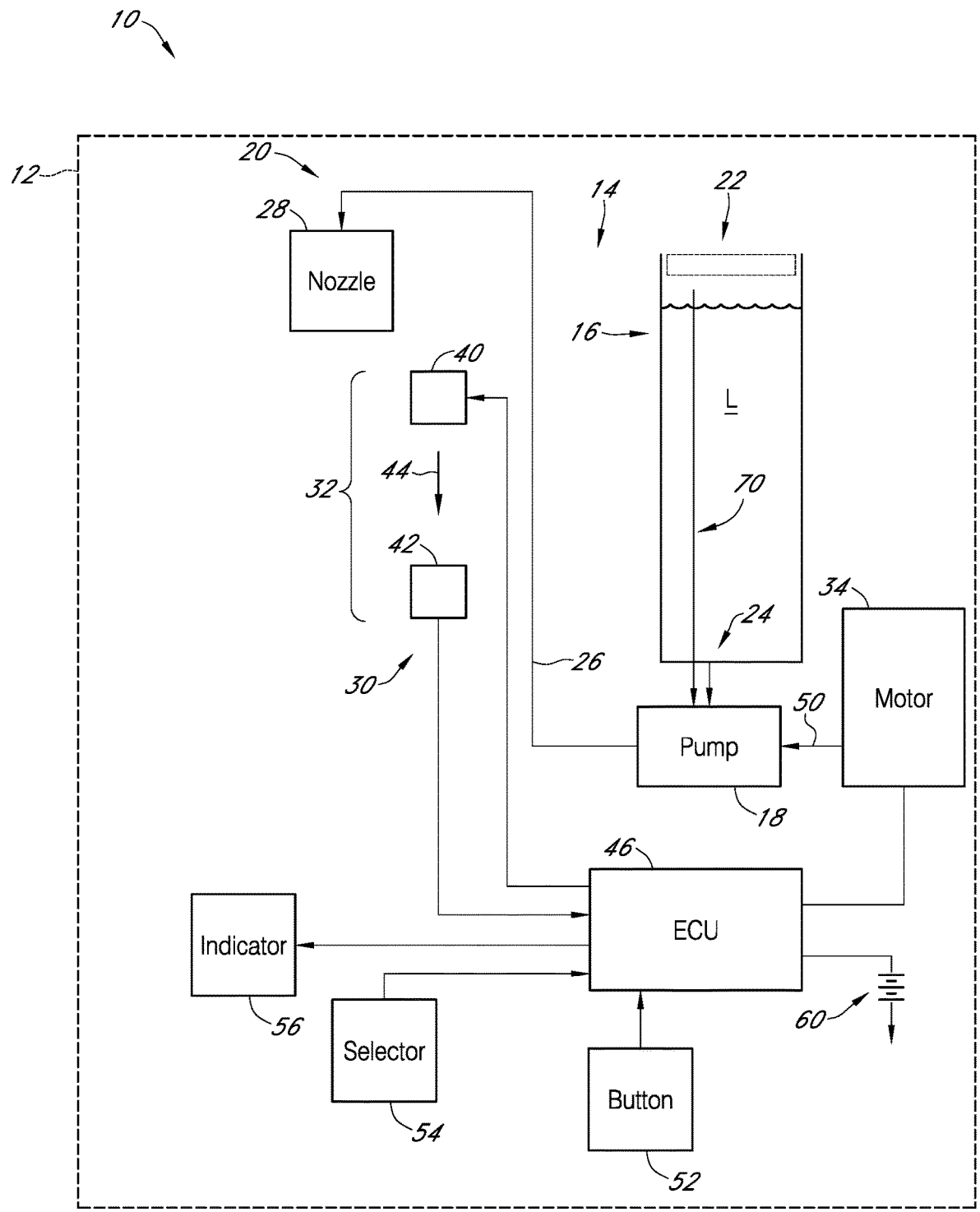
FIG. 1 schematically illustrates an automatic liquid soap dispenser.

With reference to FIG. 1, a liquid soap dispenser 10 can include a housing 12, which can take any shape. In some embodiments, the housing 12 can at least partially contain a liquid handling system 14. The liquid handling system 14 can include a reservoir 16, a pump 18, and a discharge assembly 20.

The reservoir 16 can be any type of container. In the illustrated embodiment, the reservoir 16 can be configured to contain a volume of liquid soap, such as liquid soap for hand washing. In some embodiments, the reservoir 16 can include a lid 22 configured to form a seal at the top of the reservoir 16 for maintaining the liquid soap L within the reservoir 16. In some embodiments, the lid 22 can include an air vent (not shown), which can allow air to enter the reservoir 16 as the level of liquid soap L falls within the reservoir 16. In some variants, the reservoir 16 can include an outlet 24 disposed at a lower end of the reservoir 16. In certain embodiments, the reservoir 16 can be connected to the pump 18 through the opening 24.

In some embodiments, the pump 18 can be disposed below (e.g., directly below) the outlet 24 of the reservoir 16. In certain embodiments, the pump 18 can be automatically primed due to the force of gravity drawing liquid soap L into the pump 18 through the opening 24. The pump 18 can be connected to the discharge system 20 with a conduit 26. Any type or diameter of conduit can be used.

The discharge assembly 20 can include a discharge nozzle 28, such as a flap-type nozzle as described in further detail below. The size and configuration of the discharge nozzle 28 can be determined to provide the appropriate flow rate and/or resistance against flow of liquid soap L from the pump 18. In some embodiments, the nozzle 28 can be disposed at a location spaced from the lower portion of the housing 12 so as to make it more convenient for a user to place their hand or other body part under the nozzle 28.

The dispenser 10 can include a power supply 60. In some embodiments, the power supply 60 can be a battery. In certain embodiments, the power supply 60 includes electronics for accepting AC or DC power. In some implementations, the power supply 60 can be configured to interface with a standard domestic electrical supply (e.g., 120 volt alternating current).

In certain embodiments, the dispenser 10 has a pump actuation system 30, which in turn includes a sensor device 32 and a light receiving portion 42. In some embodiments, a beam of light 44 can be emitted from the light emitting portion 40 and received by the light receiving portion 42.

The sensor 32 can be configured to emit a trigger signal when the light beam 44 is blocked. For example, if the sensor 32 is activated, and the light emitting portion 40 is activated, but the light receiving portion 42 does not receive the light emitted from the light emitting portion 40, then the sensor 32 can emit a trigger signal. This trigger signal can be used for controlling operation of the motor or an actuator 34, described in greater detail below. This type of sensor can provide further advantages.

For example, because in some embodiments the sensor 32 can be an interrupt-type sensor, it can be triggered when a body is disposed in the path of the beam of light 44. The sensor 32 is not or need not be triggered by movement of a body in the vicinity of the beam 44. Rather, in some embodiments, the sensor 32 can be triggered only if the light beam 44 is interrupted. To provide further or alternative prevention of unintentional triggering of the sensor 32, the sensor 32, including the light emitting portion 40 and the light receiving portion 42, can be recessed in the housing 12.

Some implementations provide other additional or alternative advantages. For example, the sensor 32 only requires enough power to generate the low power beam of light 44, which may or may not be visible to the human eye, and to power the light receiving portion 42. These types of sensors require far less power than infrared or motion-type sensors. In some embodiments, the sensor 32 can be operated in a pulsating mode. For example, the light emitting portion 40 can be powered on and off in a cycle such as, for example, for short bursts lasting for any desired period of time (e.g., less than or equal to about 0.01 second, less than or equal to about 0.1 second, or less than or equal to about 1 second) at any desired frequency (e.g., once per half second, once per second, once per ten seconds). These different time characteristics can be referred to as an activation period or frequency, which corresponds to the periodic activation of the sensor 32. Thus, an activation frequency of four times per second would be equivalent to an activation period of once per quarter second.

The other aspect of this characteristic can be referred to as an activation duration. Thus, if the sensor 32 is activated for 50 microseconds, 50 microseconds is the activation duration time period. Cycling can greatly reduce the power demand for powering the sensor 32. In operation, cycling does not degrade performance in some embodiments because the user generally maintains his or her body parts or other appendage or device in the path of the light beam 44 long enough for a detection signal to be generated and to trigger the sensor 32.

The sensor 32 can be connected to a circuit board, an integrated circuit, or other device for triggering the actuator 34. In some embodiments, the sensor 32 can be connected to an electronic control unit ("ECU") 46. The ECU 46 can include one or a plurality of circuit boards, which can provide hard wired feedback control circuits, a processor and memory devices for storing and performing control routines, or any other type of controller. In some embodiments, the ECU 46 can include an H-bridge transistor/MOSFET hardware configuration which allows for bidirectional drive of an electric motor, and a microcontroller such as Model No. PIC16F685 commercially available from the Microchip Technology Inc., and/or other devices.

The actuator 34 can be any type of actuator. For example, the actuator 34 can be an AC or DC electric motor, stepper motor, server motor, solenoid, stepper solenoid, or any other type of actuator. In some embodiments, the actuator 34 can be connected to the pump 18 with a transmitter device 50. For example, the transmitter device 50 can include any type of gear train or any type of flexible transmitter assembly.

The dispenser 10 can include a user input device 52. The user input device 52 can be any type of device allowing a user to input a command into the ECU 46. In some embodiments, the input device 52 can be in the form of a button configured to allow a user to depress the button so as to transmit a command to the ECU 46. For example, the ECU 46 can be configured to actuate the actuator 34 to drive the pump 18 any time the input device 52 can be actuated by a user. The ECU 46 can be configured to provide other functions upon the activation of the input device 52, described in greater detail below.

The dispenser 10 can include a selector device 54. The selector device 54 can be any type of configuration allowing the user to input a proportional command to the ECU 46. For example, the selector can have at least two positions, such as a first position and a second position. The position of the input device 54 can be used to control an aspect of the operation of the dispenser 10.

For example, the input device 54 can be used as a selector for allowing a user to select different amounts of liquid soap L to be dispensed from the nozzle 28 during each dispensation cycle. When the input device 54 is in a first position, the ECU 46 can operate the actuator 34 to drive the pump 18 to dispense a predetermined amount of liquid soap from the nozzle 28, each time the sensor 32 is triggered. When the input device 54 is in the second position, the ECU 46 can actuate the actuator 34 to dispense a larger amount of liquid soap L from the nozzle 28.

In some embodiments, the input device 54 can provide a virtually continuous range of output values to the ECU 46, or a larger number of steps, corresponding to different volumes of liquid soap L to be dispensed each dispensation cycle performed by the ECU 46. Although the positions of the input device 54 may correspond to different volumes of liquid soap L, the ECU 46 can correlate the different positions of the input device 54 to different duty cycle characteristics or durations of operation of the actuator 34, thereby at times discharging differing or slightly differing volumes of liquid soap L from the nozzle 28.

The dispenser 10 can include an indicator device 56 configured to issue a visual, aural, or other type of indication to a user of the dispenser 10. For example, in some embodiments, the indicator 56 can include a light and/or an audible tone perceptible to the operator of the dispenser 10. In some embodiments, the ECU 46 can be configured to actuate the indicator 56 to emit a light and/or a tone after a predetermined time period has elapsed after the actuator 34 has been driven to dispense a predetermined amount of liquid soap L from the nozzle 28. The indicator can provide a reminder to a user of the dispenser 10 to continue to wash their hands until the indicator has been activated. This predetermined time period can be at least about 20 seconds, although other amounts of time can be used. The indicator 56 can be used for other purposes as well.

Further advantages can be achieved where the indicator can be activated for a predetermined time after the pump has completed a pumping cycle (described in greater detail below with reference to FIG. 4). For example, the ECU 46 can be configured to activate the indicator 56 for 20 seconds after the pump 18 has been operated to discharge an amount of soap from the nozzle 28. The indicator 56 can be activated at the appropriate time for advising users as to how long they should wash their hands.

In some embodiments, the indicator 56 can be a Light Emitting Diode (LED) type light, and can be powered by the ECU 46 to blink throughout the predetermined time period. Thus, a user can use the length of time during which the indicator 56 blinks as an indication as to how long the user should continue to wash their hands with the soap disposed from the nozzle 28. Other types of indicators and predetermined time periods can be used.

In operation, the ECU 46 can activate the sensor 32, continuously or periodically, to detect the presence of an object between the light emitting portion 40 and the light receiving portion 42 thereof. When an object blocks the light beam 44, the ECU 46 determines that a dispensing cycle should begin. The ECU 46 can then actuate the actuator 34 to drive the pump 18 to thereby dispense liquid soap L from the nozzle 28.

As noted above, in some embodiments, the ECU 46 can vary the amount of liquid soap L dispensed from the nozzle 28 for each dispensation cycle, depending on a position of the selector 54. Thus, for example, the dispenser 10 can be configured to discharge a first volume of liquid soap L from the nozzle 28 when the selector is in a first position, and to discharge a second different amount of liquid soap L when the selector 54 is in a second position.

As noted above, the indicator 56 can be activated, by the ECU 46, after a predetermined amount of time has elapsed after each dispensation cycle. Further, the ECU 46 can be configured to cancel or prevent the indicator 56 from being activated if the button 52 has been actuated in accordance with a predetermined pattern. For example, the ECU 46 can be configured to cancel the activation of the indicator 56 if the button 52 has been pressed twice quickly. However, any pattern of operation of the button 52 can be used as the command for canceling the indicator 56. The dispenser 10 can include other input devices for allowing a user to cancel the indicator 56.

In some embodiments, the ECU 46 can be configured to continuously operate the actuator 34 or to activate the actuator 34 for a maximum predetermined time when the button 52 is depressed. This can allow an operator of the dispenser 10 to manually operate the dispenser to continuously discharge or discharge larger amounts of liquid soap L when desired. For example, if a user of the dispenser 10 wishes to fill a sink full of soapy water for washing dishes, the user can simply push the button 52 and dispense a larger amount of soap than would normally be used for washing one's hands, such as at least about 3 milliliters or at least about 4 milliliters.

Figure 2:
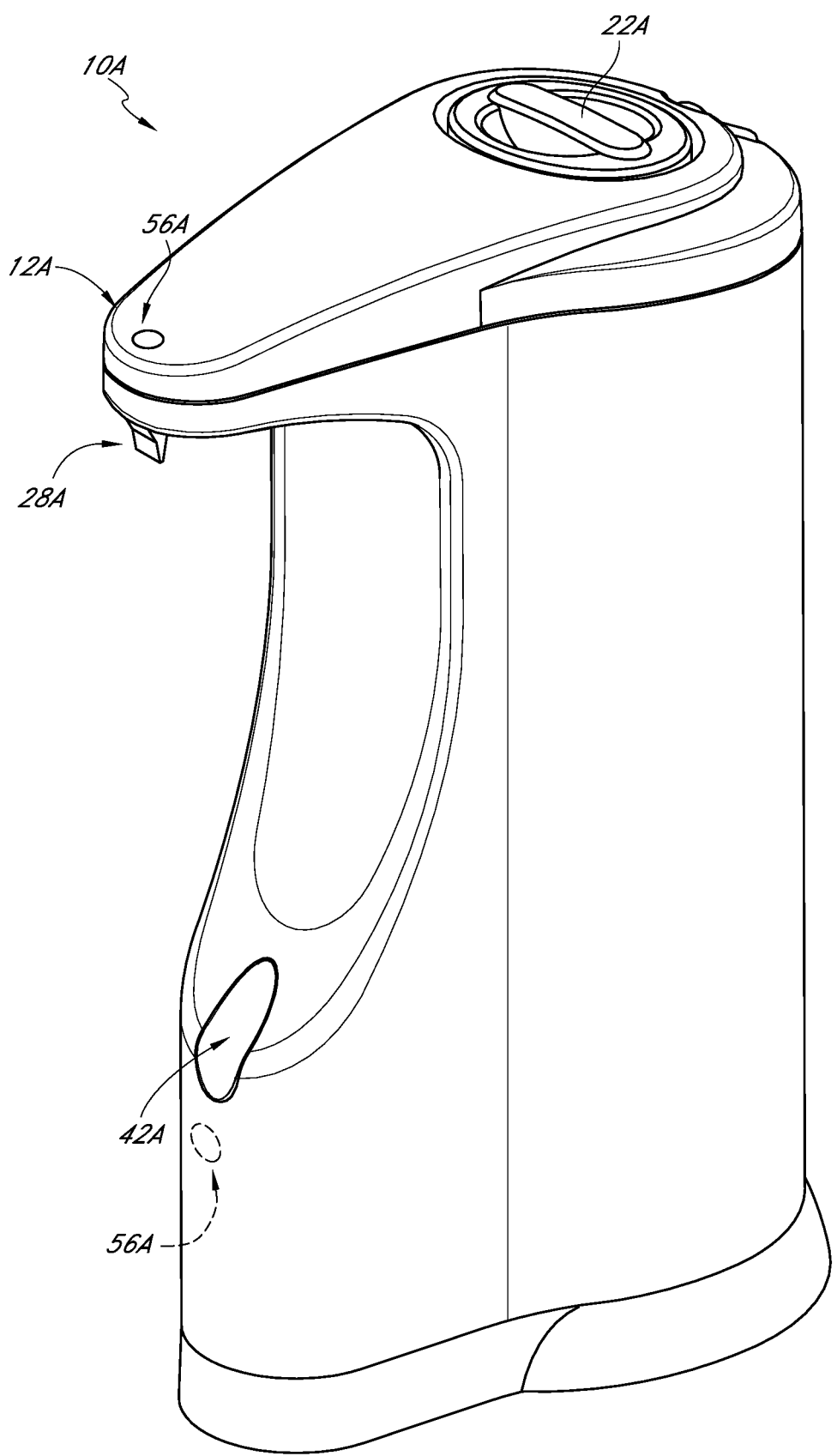
FIG. 2 illustrates a front, top, left side perspective view of an embodiment of an automatic liquid soap dispenser.
Figure 3:
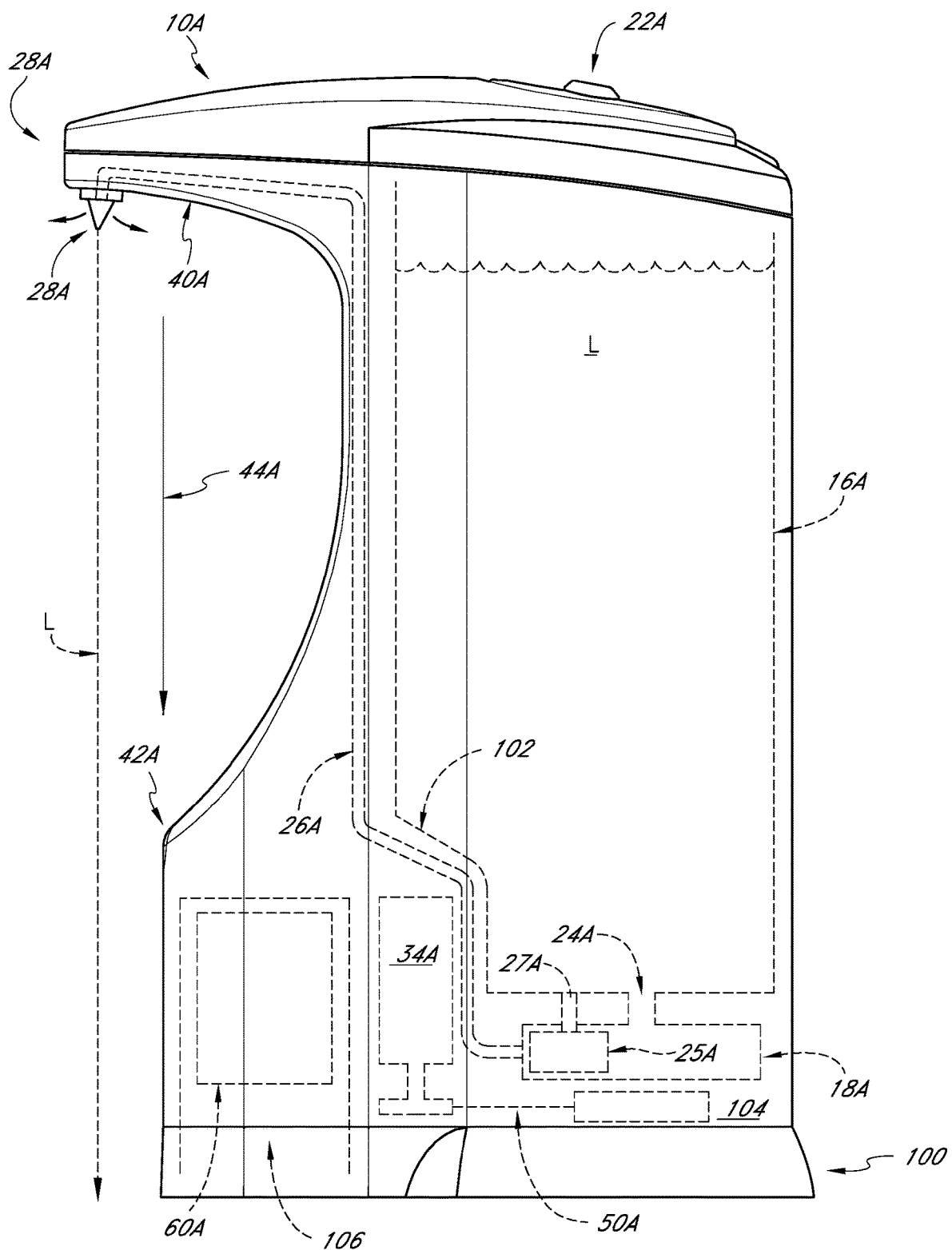
FIG. 3 illustrates a left side elevational view of the liquid soap dispenser of FIG. 2.

FIGS. 2 and 3 illustrate a modification of the dispenser 10, identified generally by the reference numeral 10A. Some of the components of the dispenser 10A can be the same, similar, or identical to the corresponding components of the dispenser 10 illustrated in FIG. 1. These corresponding components are identified with the same reference numeral, except that an "A" has been added thereto.

As shown in FIGS. 2 and 3, the lower portion 100 of the dispenser 10A can be designed to support the housing 12A on a generally flat surface, such as those normally found on a countertop in a bathroom or a kitchen. Further, some embodiments of the dispenser 10A are movable. For example, the dispenser 10A can be readily relocated from one position to another position on a countertop. In some implementations, the dispenser 10A is not attached, embedded, or otherwise joined with a surface that supports the dispenser 10A. For example, certain implementations of the dispenser 10A are not mounted to, or recessed in, a countertop or wall.

In some embodiments, the nozzle 28 can be disposed in a manner such that the nozzle 28A extends outwardly from the periphery defined by the lower portion 100. If a user misses soap dispensed from the nozzle 28A, and the soap L falls, it will not strike on any portion of the housing 12A. This helps prevent the dispenser 10A from becoming soiled from dripping soap L. The configuration and functionality of the nozzle 28A is described in greater detail below with reference to FIGS. 10-16.

In some embodiments, the indicator 56, which can be a visual indicator such as an LED light, can be positioned on the outer housing 12A, above the nozzle 28A. As such, the indicator 56A can be easily seen by an operator standing over the pump. In some embodiments, the visual type indicator 56A can be disposed on a lower portion of the housing (illustrated in phantom line). However, the indicator 56A can be positioned in other locations, such as on an upper portion of the housing, at or near the discharge nozzle 28, or otherwise.

As shown in FIG. 3, the reservoir 16A can be disposed within the housing 12A. The pump 18A can be disposed beneath the reservoir 16A such that the outlet 24A of the reservoir 16A feeds into the pump 18A. As noted above, this can help the pump 18A to achieve a self-priming state due to the force of gravity drawing liquid soap L through the outlet 24A into the pump 18A.

In some embodiments, the reservoir 16A can include a recess 102. The actuator 34A can be disposed somewhat nested with the reservoir 16A. This can provide for a more compact arrangement and allow the reservoir 16A to be larger.

In some embodiments, the housing 12A includes a first chamber 104 and a second chamber 106. The pump 18A and actuator 34A can be disposed within the first chamber 104 and the power supply 60A can be disposed in the second chamber 106. In some embodiments, the chambers 104, 106 can be defined by inner walls of the housing 12A and/or additional walls (not shown).

Figure 4:
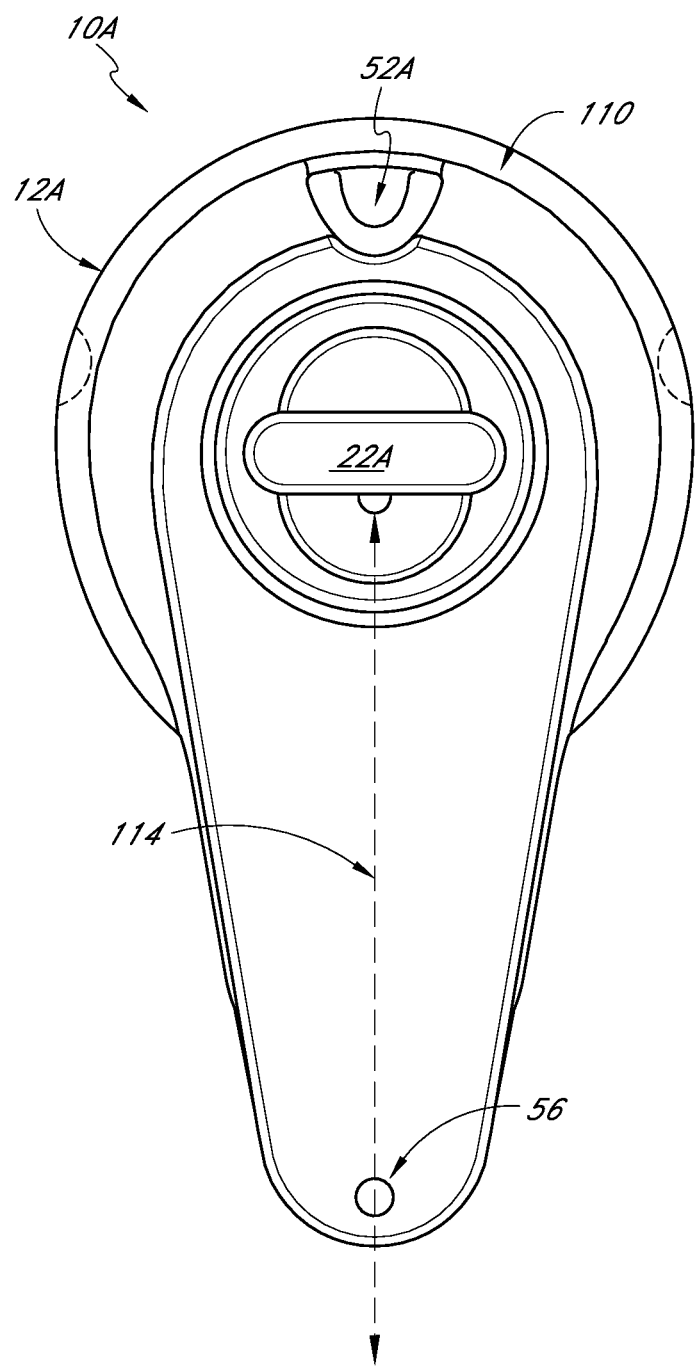
FIG. 4 illustrates a top plan view of the liquid soap dispenser of FIG. 2.
Figure 5:
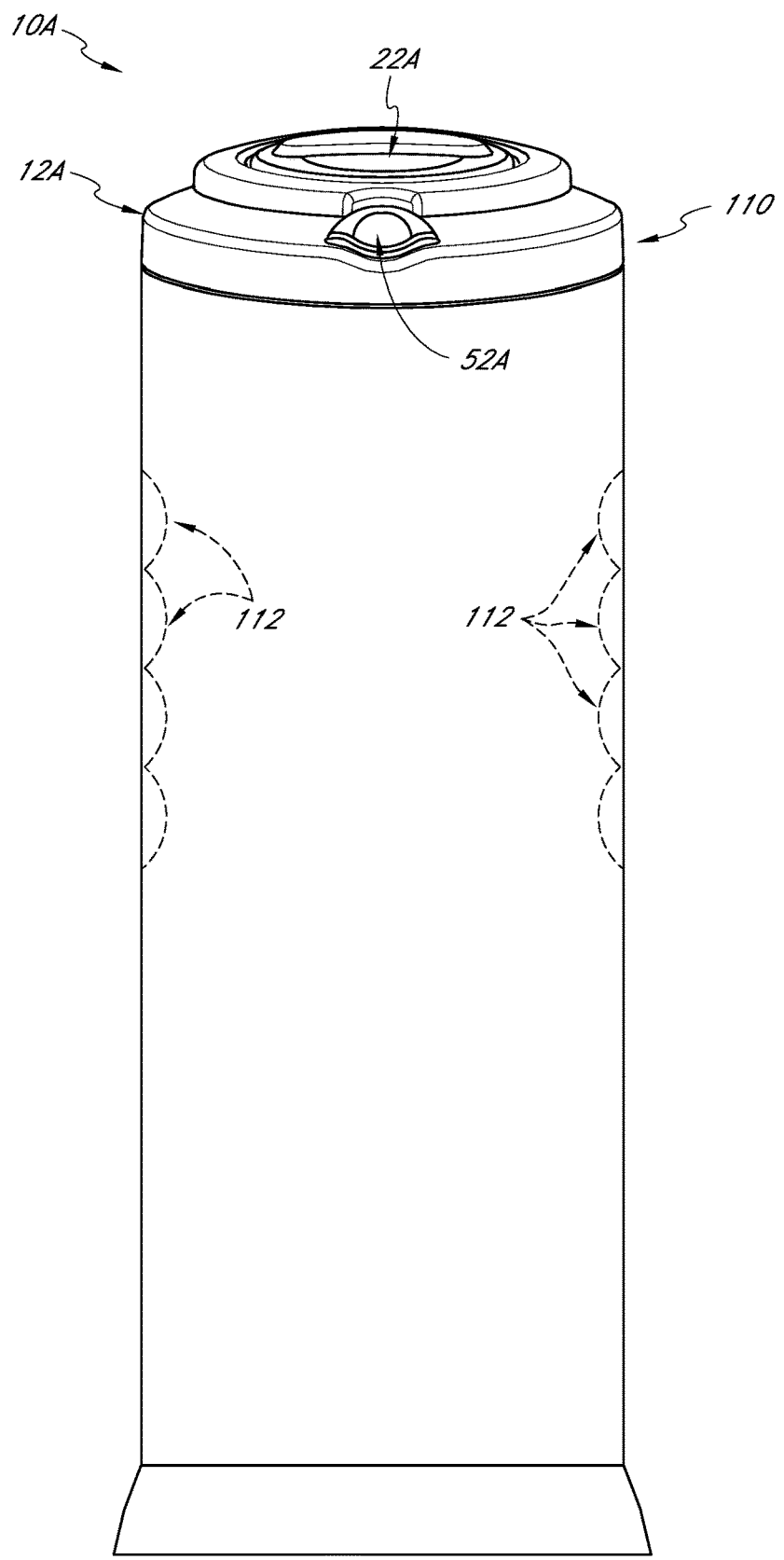
FIG. 5 illustrates a rear elevational view of the liquid soap dispenser of FIG. 2.

With reference to FIGS. 4 and 5, the button 52A can be disposed anywhere on the housing 12A. In some embodiments, as shown in FIGS. 4 and 5, the button 52A can be disposed on an upper portion 110 of the housing 12A. The button 52A can be positioned conveniently for actuation by a user of the dispenser 10A. For example, in some embodiments, the button 52A can be disposed proximate to an outer periphery of the housing 12A, on the upper portion 110, and approximately centered along a rear surface of the housing 12A. This can provide a location in which a user can easily grasp the outer surface of the housing 12A with three fingers and their thumb, and actuate the button 52A with their index finger.

Certain embodiments of the housing 12A include surface textures 112 configured to allow a user to obtain enhanced grip on the housing 12A when attempting to lift the dispenser 10A and depress the button 52A. Such surface textures 112 can have any configuration, such as ridges, bumps, knurls, groves, divots, holes, or otherwise. In some embodiments, the surface textures, the surface textures 112 can be in the form of finger shaped recesses.

Figure 6:
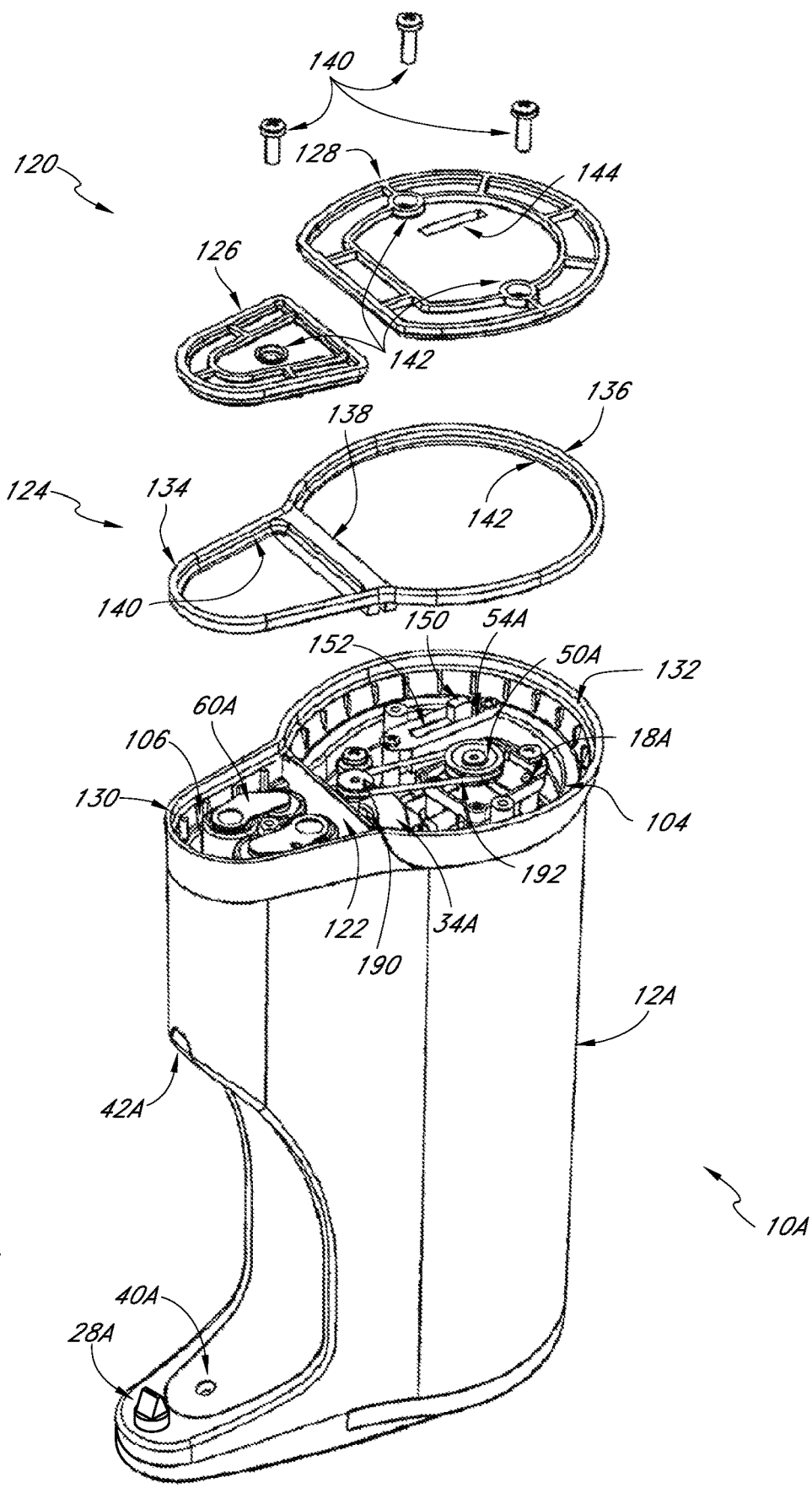
FIG. 6 illustrates a front, bottom, right side exploded perspective view of the liquid soap dispenser in FIG. 2, showing a pump and motor cavity cover member, a battery compartment cover member, and a gasket separated from the main housing thereof.

With reference to FIG. 6, as noted above, the dispensers 10, 10A can include a support member arrangement 120 that can achieve the dual functions of providing a support leg or foot for the associated dispenser and provide a sealing function for internal cavities disposed within the associated dispenser.

As noted above, the dispenser 10A can include first and second chambers 104, 106 for containing the power supply 60A and the pump 18A and actuator 34A, respectively. Certain implementations include an interior compartment. As shown in FIG. 6, an interior wall 122 can be disposed between the chambers 104, 106.

The sealing arrangement 120 can include a gasket member 124 and lid members 126, 128. The gasket 124 can be configured to extend around an opening 130 of the compartment 106 and an opening 132 of the compartment 104. Thus, in some embodiments, the gasket member 124 can include a battery compartment portion 134 and a pump and motor compartment portion 136. The battery compartment portion 134 can be configured to extend around an interior periphery of the opening 130. The portion 134 can be configured to straddle a lower-most edge of the opening 130, or to extend around an outer periphery of the opening 130. Similarly, the portion 136 can be configured to extend along an inner periphery of the opening 132. In some embodiments, the portions 134, 136 can be configured to rest against a shelf defined along the inner peripheries of the openings 130, 132. In some implementations, a center dividing portion 138 of the gasket 124 can be configured to form a seal along the lower-most edge of the wall 122.

The gasket member 124 can be configured to extend around an opening 130 of the chamber 106 and an opening 132 of the chamber 104. The lid members 126, 128 can be configured to rest against inner walls 140, 142 defined by the portions 134, 136, respectively. The lid members 126, 128 can be configured to form seals with the inner peripheral walls 140, 142, respectively. In certain such instances, the seals help protect the components disposed within the chambers 104, 106.

As shown, in some embodiments, the gasket member 124 can include a battery compartment portion 134 and a pump and motor compartment portion 136. The battery compartment portion 134 can be configured to extend around an interior periphery of the opening 130. The portion 134 can be configured to straddle a lower-most edge of the opening 130, or to extend around an outer periphery of the opening 130. Similarly, the motor compartment portion 136 can be configured to extend along an inner periphery of the opening 132. In some embodiments, the portions 134, 136 can be configured to rest against a shelf defined along the inner peripheries of the openings 130, 132.

In some embodiments, fasteners 140 can be used to secure the lid members 126, 128 to the housing 12A. For example, the lid members 126, 128 can include apertures 142 through which the fasteners 140 can extend. The fasteners 140 can engage mounting portions disposed within the housing 12A. As such, the lid members 126, 128 can be secured to the housing 12A and form a seal with the gasket member 124.

In certain implementations, at least one of the lid members 126, 128 includes an additional aperture 144 configured to allow access to a device disposed in one of the chambers 104, 106. In the illustrated embodiment, the aperture 144 is in the form of a slot. However, any type of aperture can be used. The slot 144 can be configured to allow a portion of the selector 54 to extend therethrough. For example, the selector 54A can be in the configuration of a slider member 150 slidably disposed in a housing 152. For example, the selector 54 can be in the configuration of a rheostat or other type of input device that allows for a proportional signal.

For example, as noted above, the housing 152 can be configured to allow the slider member 150 to be slid between at least two positions. For example, the two positions can be a first position corresponding to a first amount of liquid soap L to be discharged by the nozzle 28A and a second position corresponding to a second larger volume of liquid soap L to be discharged by the nozzle 28A. The housing 152 can be configured to allow the slider member 150 to be slid between a plurality of steps or continuously along a defined path to provide continuously proportional signals or a plurality of steps.

In some embodiments, with the gasket member 124 and lid member 128 in place, the slider member 150 can be configured to extend through the slot 144 such that a user can conveniently move the slider member 150 with the lid 128 in place. In some embodiments, the slider member 150 can be smaller such that a thin object such as a pen can be inserted into the slot 144 to move the slider member 150.

With continued reference to FIG. 6, when the lid members 126, 128 and gasket member 124 are in place, the chambers 104, 106 can be substantially sealed and thus protected from the ingress of water and/or other substances. In some embodiments, as noted above, the gasket member 124 can be configured to extend downwardly from the housing 12A such that the gasket member 124 defines the lower-most portion of the device 10A. The gasket member can provide a foot or a leg for supporting the device 10A.

Further, in a configuration in which the lower-most edge of the gasket member 124 can be substantially continuous and smooth, the gasket member 124 can provide a suction cup-like effect when it is placed and pressed onto a smooth surface. For example, where the gasket member 124 is made from a soft or resilient material, by pressing the device 10A downwardly when it is resting on a smooth surface, air can be ejected from the space between the lid members 126, 128 and the surface upon which the device 10A is resting. When the device 10A is released, the slight movement of the device 10A upwardly can result in suction within that space, thereby creating a suction cup-like effect. This effect provides a further advantage in helping to secure or otherwise anchor the device 10A in place on a counter, which can become wet and/or slippery during this period.

Figure 8:
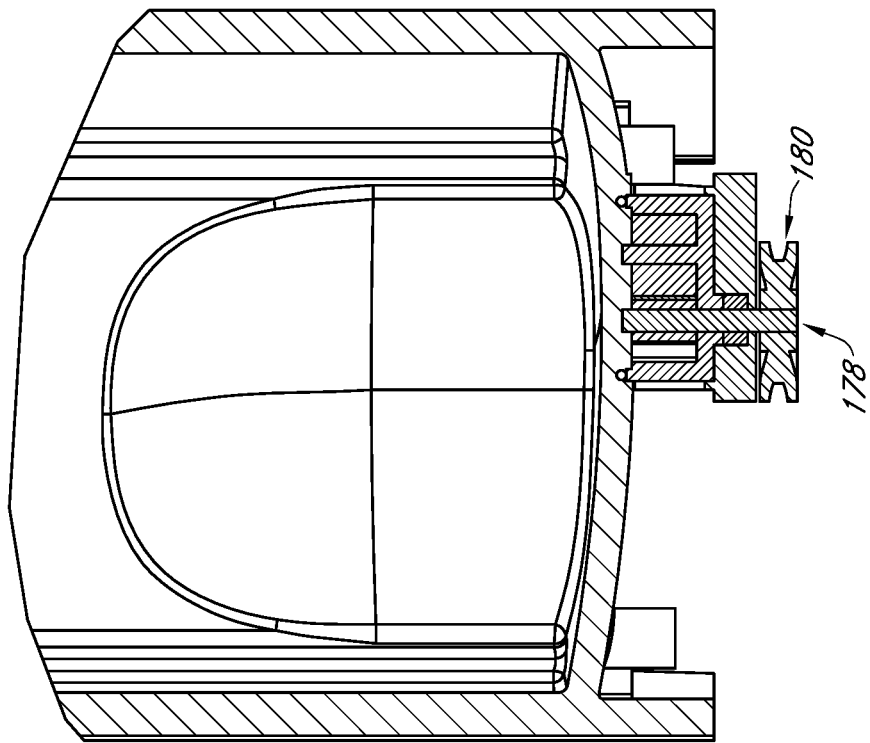
FIG. 8 illustrates another sectional view of the pump, pump cover, and drive sheave illustrated in FIG. 7.
Figure 7:
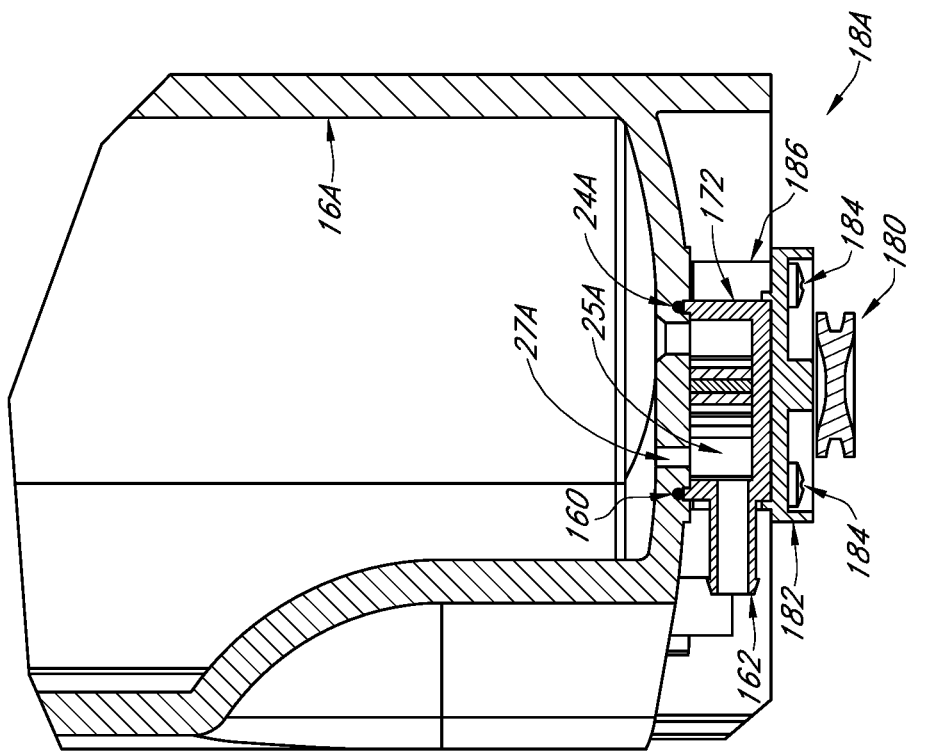
FIG. 7 illustrates a partial sectional view of a liquid soap reservoir of the liquid soap dispenser of FIG. 2, including a portion of the reservoir, pump, pump cover, and drive sheave.
Figure 9:
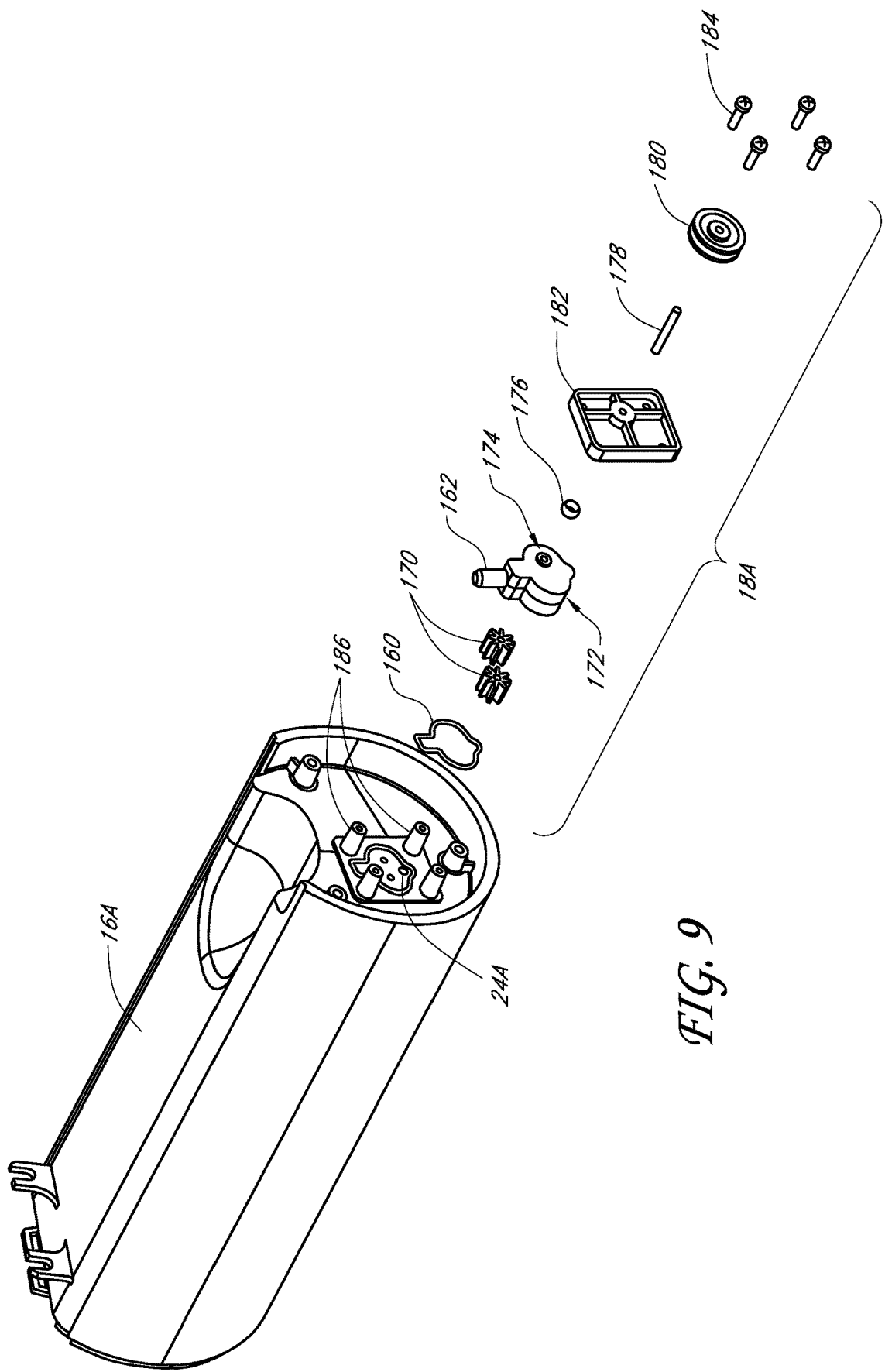
FIG. 9 illustrates a partial front, left, bottom perspective view of the liquid soap dispenser of FIG. 2 with the pump exploded and separated from the bottom of the dispenser.

With reference to FIGS. 7-9, the pump 18A can be configured to be a reversible pump. For example, in the illustrated embodiment, the pump 18A can be a gear-type pump. This type of a pump can be operated in forward or reverse modes. In some embodiments, a pump can provide a compact arrangement and can provide a 90 degree turn which provides a particularly compact arrangement in the device 10A. For example, as shown in FIG. 7, the outlet 24A of the reservoir 16A feeds (e.g., directly) into an inlet of the pump 18A. In the illustrated embodiment, a lower-most surface of the reservoir 16A defines an upper wall of the pump 18A. Thus, in some embodiments, the outlet 24A also forms the inlet to the pump 18A. A gasket 160 can extend around the outlet 24A and be configured to form a seal with a body of the pump 18A. An outlet 162 of the pump 18A can be connected to an outlet chamber of the pump 18A. In certain variants, the outlet 162 can be connected to the conduit 26A so as to connect the outlet 162 to the nozzle 28A.

Returning to FIG. 3, the pump chamber 18A can include an outlet chamber 25A. The outlet chamber 25A can be an area within the pump in which higher pressures of the viscous fluid are generated during pump operation, i.e., pressures that are higher than the pressure at the inlet 24A. Thus, this high pressure area within the pump drives the viscous fluid out of the pump, through the conduit 26A, and through the nozzle 28A.

In some embodiments, the dispenser 10A can include a bypass passage 27A connecting the interior of the reservoir 16A with the outlet chamber 25A. When the pump 18A is not operating, liquid soap L from the reservoir 16A can flow through the bypass passage 27A, into the outlet chamber 25A, then into the conduit 26A. When the dispenser 10A is at rest, liquid soap L flows up into the conduit 26A until it reaches the same height as the level of liquid soap L in the reservoir 16A. Thus, the pump 18A can remain primed and generally full of liquid soap, even when the pump 18A is off, or at least between soap dispensations and/or right before the pump 18A is turned on.

In some embodiments, the bypass passage 27A can be a hole with a diameter of at least about 0.4 mm and/or less than or equal to about 2.1 mm. In some embodiments, the diameter of the hole of the bypass passage 27A can be in the range of about 0.5 mm to about 2.0 mm. Further, in some embodiments, the diameter of the bypass passage 27A can be about 0.7 mm to about 0.8 mm.

In some embodiments, the soap pump 10A can be immediately or rapidly primed without requiring further procedures by simply filling the reservoir 16A with liquid soap L and waiting a short amount of time for liquid soap L to flow through the bypass passage 27A, through the outlet chamber 25A and into the discharge conduit 26A as well as through the inlet 24A down into the pump 18A. In some embodiments, once liquid soap L has flown into these parts of the system, the pump 18A is fully primed and ready to begin pumping liquid soap L at any time, without requiring re-priming before the next use.

During operation of the pump 18A, some pressurized liquid soap L from the discharge chamber 25A can be discharged out of the outlet chamber 25A and back into the reservoir 16A. This discharging from the outlet chamber 25A into the reservoir 16A results in some loss of efficiency of pump operation. However, when this pump design is used in conjunction with an anti-drip valve having a low opening pressure, such as an opening pressure of less than or equal to about 1 psi (liquid soap in the discharge nozzle 28A having a pressure 1 psi higher than atmospheric on the outside of the nozzle 28A), the loss of efficiency caused by the bypass passage 27A is generally equal to or overcome by the lower energy requirements for pumping the liquid soap L to a pressure much lower than that required for opening spring-biased type valves. It has been found that where the valve 28A is configured to open with a pressure of about 0.3 psi or less, and the diameter of the bypass passage 27A is within the range of about 0.5 mm to about 2 mm, a 40% loss of fluid through the bypass passage 27A still requires about the same amount of energy or results in an overall reduction in energy required for pumping liquid soap L through the pump 18A to the lower opening pressure required to open the valve 28A, compared to valves that are formed of a valve seat and a valve body bias towards the closed position with a spring.

FIG. 9 illustrates an exploded view of the pump 18A. As shown, the gear pump 18A can include a pair of gears 170 and a gear pump body 172, from which the outlet 162 extends. The gears 170 can each include a plurality of teeth 169 (FIG. 9A), which in turn can have flanks 171 and a tip 177. Each of the teeth 169 can have a tooth width W1 and a tip width W2, as will be discussed in further detail below.

The pump body 172 can comprise a generally continuous loop (e.g., an oval and/or partially figure-eight-shaped chamber) in which the gears 170 rotate. This configuration is well known in the art, and in particular, with regard to devices known as gear pumps. Thus, a further description of the operation of the gear pump 18A is not included herein.

The body 172 can include a drive shaft aperture 174. A gasket 176 can be configured to form a seal against the aperture 174 and a drive shaft 178. One end of the drive shaft 178 can be connected to a driven sheave 180. The other end of the drive shaft 178 can extend through the gasket 176, the aperture 174, and engage with one of the gears 170. In some embodiments, the other of the gears 170 can engage a boss 179.

In some embodiments, a retaining member 182 can be used to retain the pump body 172 against the lower face of the reservoir 16A. For example, in the illustrated embodiment, four fasteners 184 extend through corresponding apertures in the retaining member 182 and into engaging portions 186 attached to the lower face of the reservoir 16A.

Figure 9A:
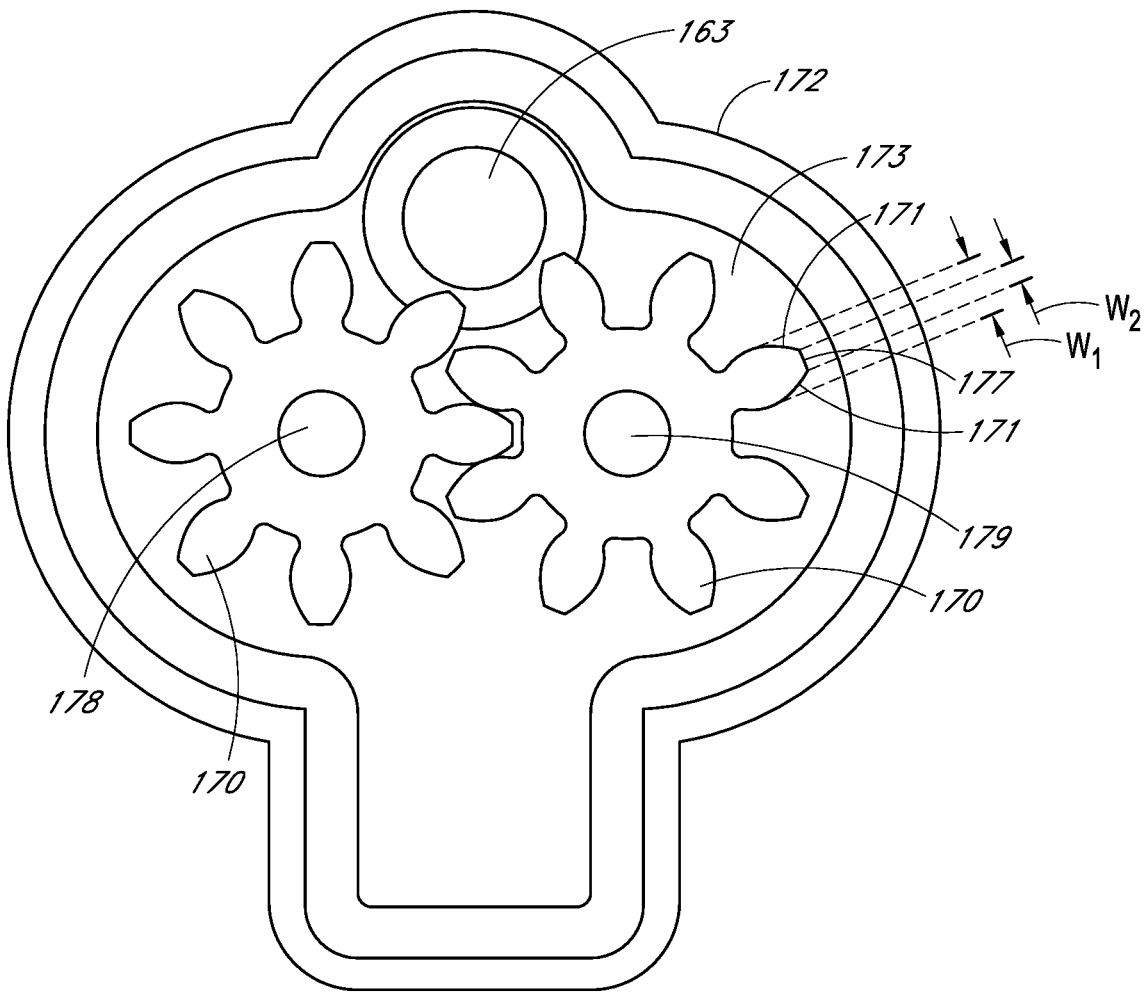
FIG. 9A illustrates a bottom view of the pump of FIG. 9, with a bottom portion of the pump removed to expose the interface of gears in the pump.

As shown in FIG. 9A, in some embodiments, the gears 170 can be meshed within the chamber. Thus, when a shaft 178 is rotated to rotate one of the gears 170, the other gear 170 is also rotated. As such, the pump 18A can displace fluid entering the pump body 172 (e.g., through the outlet 24A of the reservoir) and discharge the fluid through the outlet 162. FIG. 9A also shows that the pump body 172 can include an opening 163. In some embodiments, the opening 163 can be in fluid communication with the outlet 24A of the reservoir 16A, thereby allowing liquid soap L to flow into the pump body 172 via the opening 163. As shown, in certain implementations, the opening 163 can be positioned in the top of the body 172. In some embodiments, a centerline of the opening 163 can be substantially parallel with an axis of rotation of at least one of the gears 170. In some embodiments, the opening 163 can be directly coupled with the outlet 24A of the reservoir 16A.

With reference again to FIG. 6, the sheave 180 defines a part of the transmitter 50A. The actuator 34A can include a drive sheave 190 configured to drive the driven sheave 180 through a flexible transmitter 192. The flexible transmitter 192 can be any type of flexible transmitter, such as those well known in this art. For example, the flexible transmitter 192 can be a toothed belt, rubber belt, chain, etc.

Figure 10:
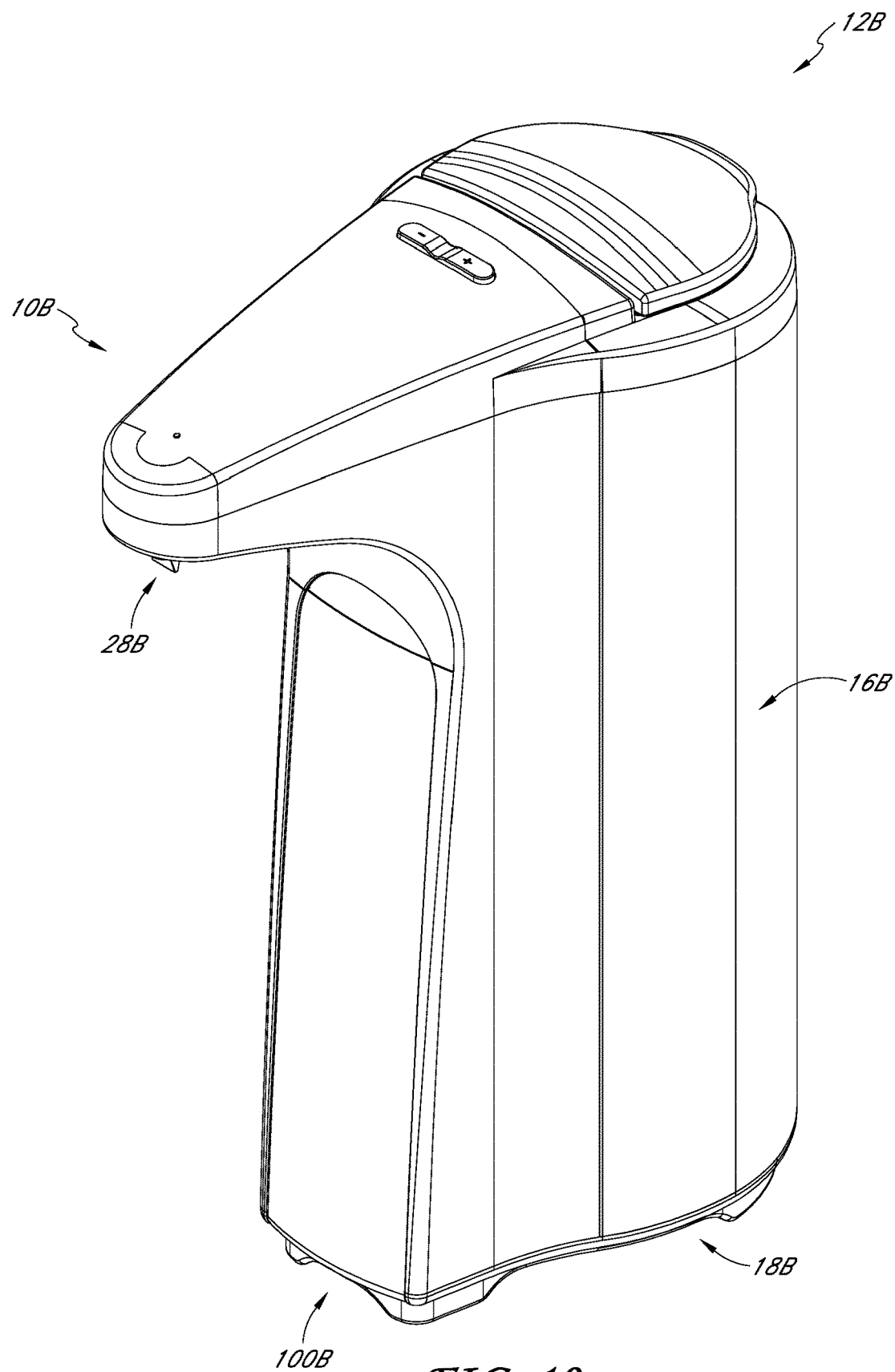
FIG. 10 illustrates a front, top, and left side perspective view of another embodiment of a liquid soap dispenser, including a discharge nozzle.
Figure 11:
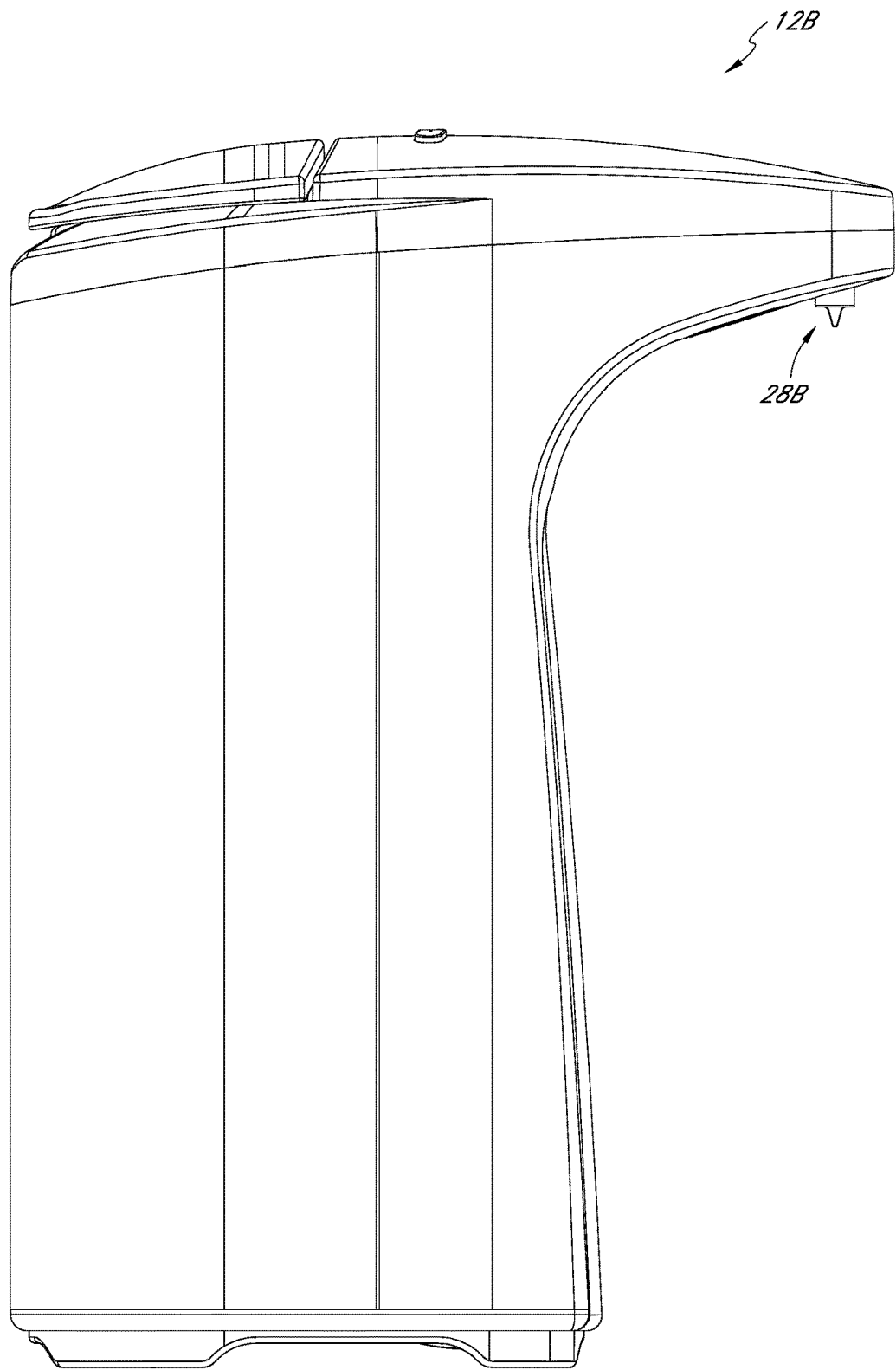
FIG. 11 illustrates a right side elevational view of the dispenser of FIG. 10.

With reference to FIG. 10, another embodiment of a soap dispenser is identified generally by the reference numeral 10B. Some of the components of the dispenser 10B can be the same, similar, or identical to the corresponding components of the dispensers 10 and/or 10A discussed above. Some of these corresponding components are identified with the same reference numeral, except that a "B" has been added thereto and/or has replaced the "A" which was added thereto.

Figure 12:
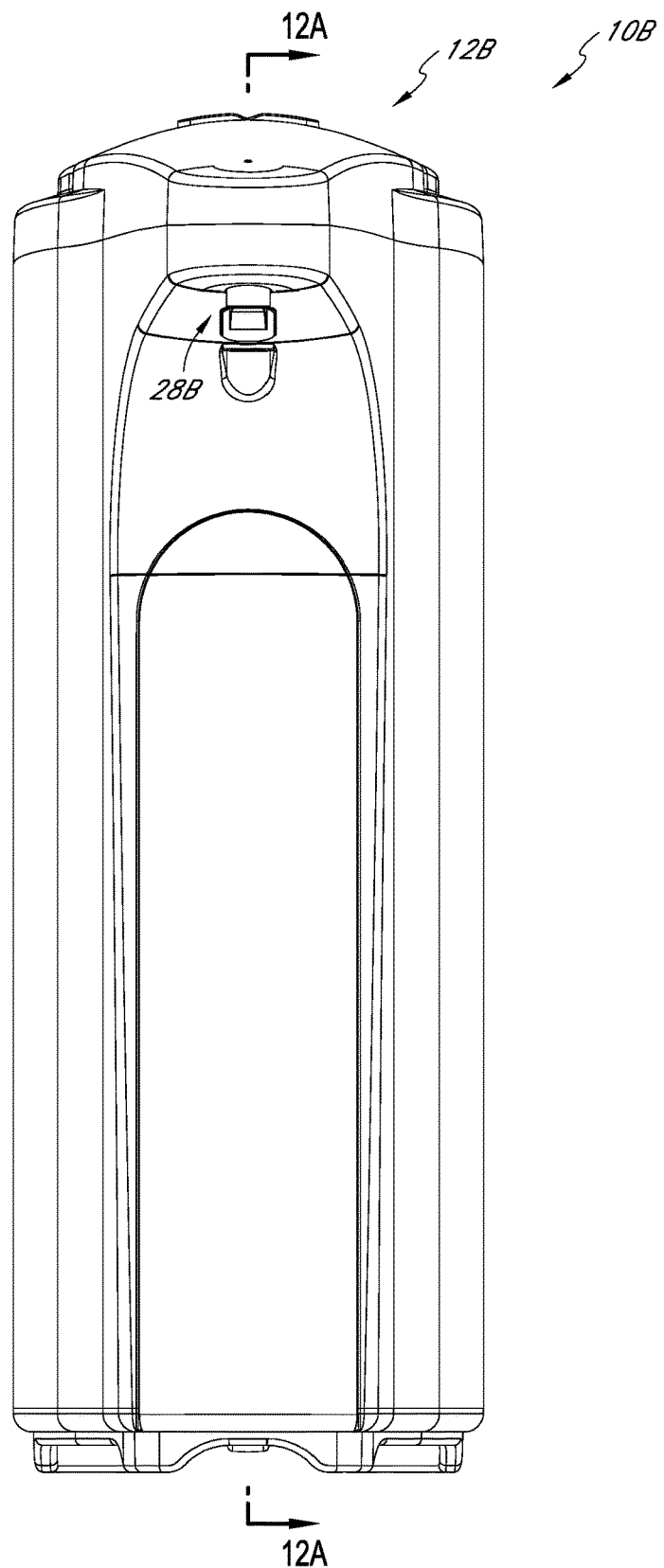
FIG. 12 illustrates a front elevational view of the dispenser of FIG. 10.
Figure 12A:
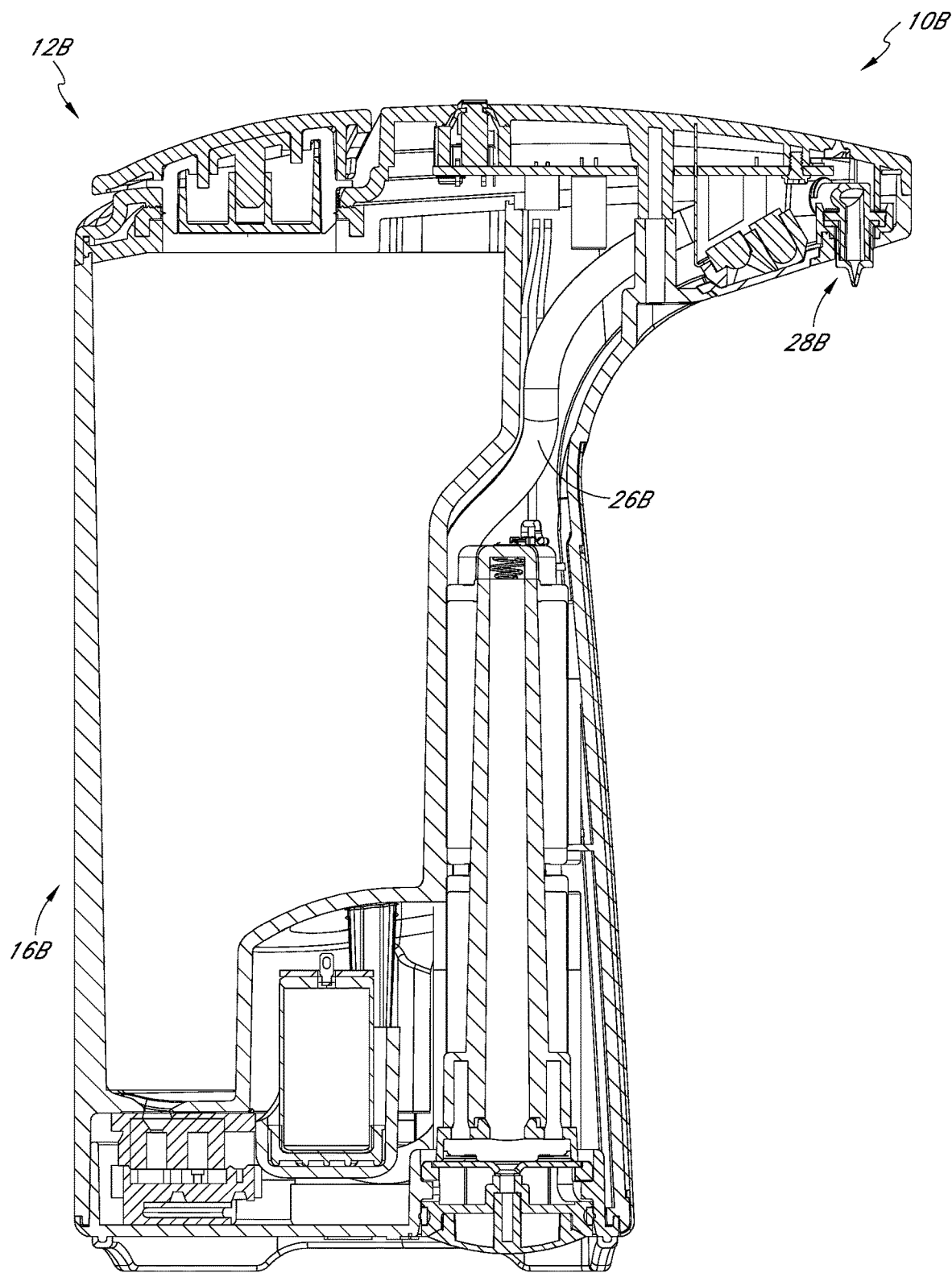
FIG. 12A illustrates a cross-sectional view of the dispenser of FIG. 10 along the line 12A-12A of FIG. 12.
Figure 14:
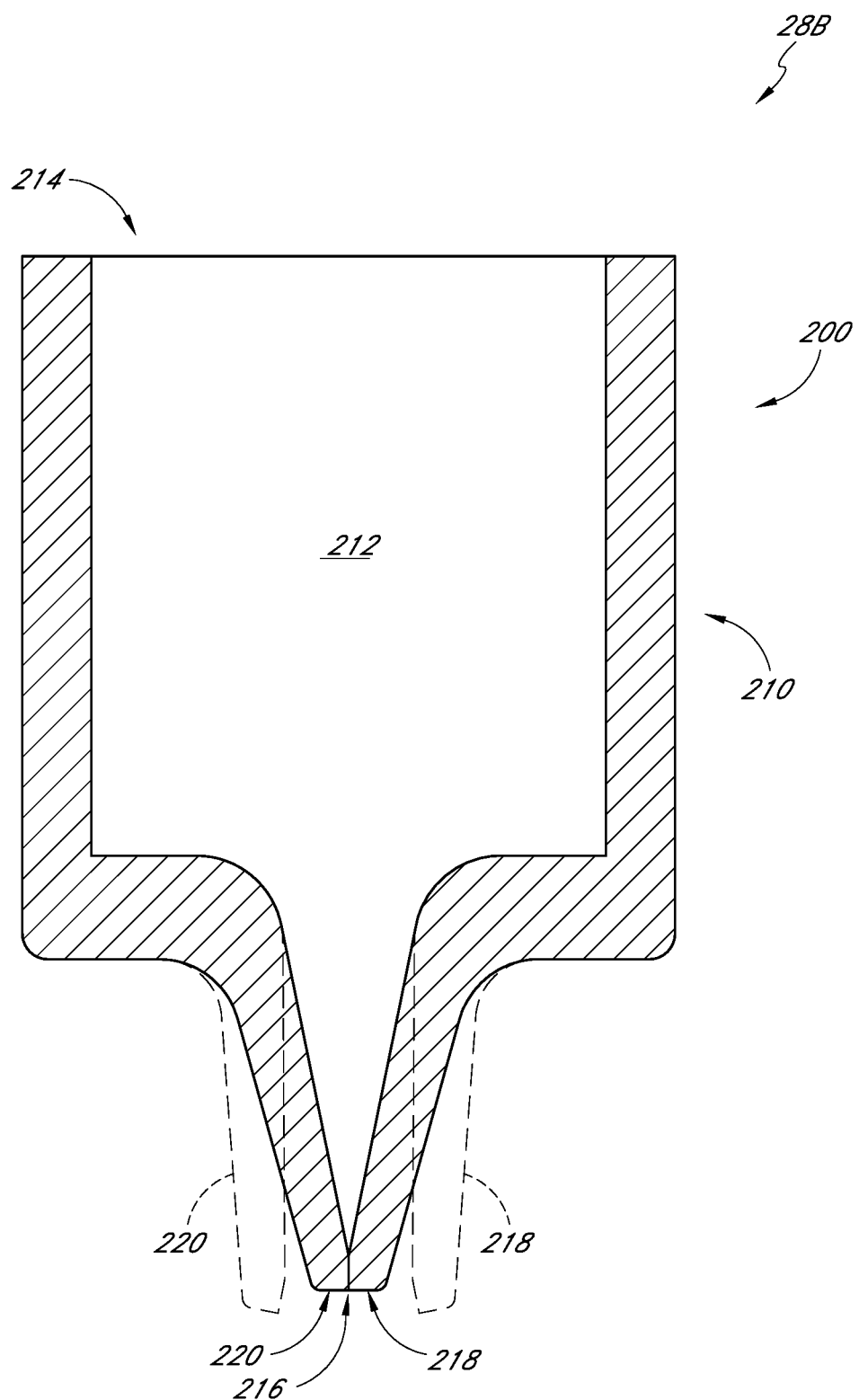
FIG. 14 illustrates a cross-sectional view of the discharge nozzle of FIG. 13.

The dispenser 10B can include a housing 12B, which in turn can include a lower portion 100B, reservoir 16B, pump 18B, and a nozzle 28B. In certain implementations, the pump 18B and the nozzle 28B can be in fluid communication via a conduit 26B (see FIG. 12A). In some embodiments, the nozzle 28B extends outwardly from a periphery comprising the lower portion 100B. For example, as shown, the housing 12B can include a cantilevered portion that includes the nozzle 28B. In certain configurations, the nozzle 28B can be positioned such that any soap that would drip from the nozzle 28B would avoid contacting the housing 12B.

In some embodiments, such as shown in FIGS. 10-12A, the nozzle 28B projects from the housing 12B. For example, the nozzle 28B can be mounted on the exterior of the housing 12B of the soap pump 10B. In some embodiments, the nozzle 28B can be mounted partially within or completely within the housing of the soap pump 10B. Further, in the implementation depicted, the nozzle 28B can be positioned substantially vertically (e.g., a longitudinal axis of the nozzle forms a substantially right angle with a plane on which the dispenser rests). Such a configuration can, for example, facilitate (e.g., by force of gravity) outflow of the soap from the nozzle 28B. In some implementations, the nozzle 28B can be positioned at another angle. For example, the nozzle 28B can be positioned so as to dispense soap horizontally (e.g., substantially parallel to a plane on which the soap pump 10B rests).

With reference to FIGS. 13-16, the nozzle 28B generally includes a one-way valve 200, which can be in the form of a flap-type valve. Such a configuration can, for example, reduce the likelihood that air or contaminants may enter the valve 200, which could lead to improper soap flow from the nozzle 28B and/or drying of soap disposed in the nozzle 28B. Of course, other types and/or configurations of one-way valve are contemplated, such as flap valves, ball valves, diaphragm valve, lift valves, other kinds of check valves, and the like.

In some embodiments, the nozzle 28B can include an inlet collar 210 with an interior passage 212 having inlet end 214 and an outlet end 216. The valve 200 can be formed with at least a deflectable member 218, such as a flap. In some embodiments, the deflectable member 218 can be configured to move toward an open position (illustrated in phantom) when a pressure condition is satisfied. The pressure differential (compared to the ambient pressure acting on an exterior surface of the nozzle 28B) at which the deflectable member 218 begins to move toward the open position, and thus the nozzle 28B begins to open, can be referred to as the "cracking pressure." In some embodiments, the cracking pressure can be at least about 0.2 psi and/or equal to or less than about 0.3 psi. In some embodiments, the cracking pressure is less than or equal to about 0.4 psi.

In the illustrated embodiment, the valve 200 includes two slanted deflectable members 218, 220 that form an acute angle with each other. Such a configuration is sometimes referred to as a "duckbill valve". However, a duckbill valve is merely one type of deflectable member valves that can be used as the nozzle 28B.

The valve 200 can be formed from any flexible material, For example, the valve 200 can be made of nitrile, nitrile rubber, fluorosilicone, fluorosilicone rubber, ethylene propylene, ethylene propylene diene monomer rubber, silicone, silicone rubber, hydrogenated nitrile rubber, hydrogenated nitrile butadiene rubber, butyl rubber, isobutylene isoprene rubber, fluorocarbon rubber, polyisoprene, industrial rubber, natural rubber, epichlorohydrin, chloroprene, polyurethane, polyurethane, polyether urethane, styrene-butadiene, styrene-butadiene rubber, polyacrylate acrylic, polyacrylate rubber, ethylene acrylic rubber, combinations thereof, or other materials. Some such duckbill valves are commercially available from Vernay Laboratories, Inc., of Yellow Springs, Ohio. In some embodiments, one or both of the deflectable members 218, 220 have a thickness of at least 0.4 mm and/or equal to or less than 0.8 mm. In certain instances, one or both of the deflectable members 218, 220 have a thickness of at least about 0.6 mm.

The valve 200 can include a seal formed between the deflectable members 218, 220. For example, in certain embodiments the deflectable members 218, 220 form a substantially airtight seal therebetween. Some embodiments of the deflectable members 218, 220 form a substantially liquid-tight seal therebetween. Some embodiments have deflectable members 218, 220 that form a seal that is sufficient to inhibit the passage of viscous soap therebetween. In certain embodiments, the valve 200 can be configured to inhibit the passage of viscous soap yet permit an amount of ambient air to pass through the valve 200 (e.g., and into the interior of the dispenser 10B). Such a configuration can, for example, reduce the incidence of a pressure differential between the ambient environment and components of the dispenser 10B. For example, certain configurations allow an amount of ambient air to enter the reservoir 16B, thereby avoiding the maintenance of a pressure differential between the ambient environment and the reservoir 16B, which could inhibit opening of the reservoir 16B, e.g., in order to deposit liquid soap into the reservoir.

In some embodiments, the duckbill valve aids in the dispensation of soap, reduces wear, and/or facilitates priming of the dispenser 10B. For example, certain other anti-drip valves have a valve seat and a valve body that is pressed against the valve seat to prevent dripping when the pump is not operating. However, such valves can require a significant pressure (e.g., 2.5 to 3 psi) in the liquid soap before the spring biased valve body will move away from the valve seat to allow liquid soap to flow out. Generating such liquid soap pressure can require a significant amount of electrical energy. In contrast, some duckbill-type embodiments of the valve 200 can be configured to open (e.g., deflect one or both of the deflectable members 218, 220) at much lower pressures, such as less than or equal to 0.2 psi and/or greater than or equal to 0.3 psi. As such, certain embodiments of the valve 200 require less electrical energy usage per dispensation, which in turn can prolong the operational life of batteries (or other electrochemical or other electrical energy storage devices) in embodiments of the dispenser 10B so powered. Further, as the actuating pressure is reduced, some embodiments of the valve 200 reduce the wear on the motor 34, pump 18B, and/or other components of the dispenser 10B.

In some embodiments, the reduced actuating pressure of the valve 200 can facilitate priming of the dispenser 10B. In certain other types of valves, during priming of the pump, air present in a pipe connecting the pump and the valve is trapped between the valve and the leading edge of the flow of soap being urged through the pipe. In some such instances, the air is compressed to the actuating pressure of the valve (which, as indicated above, can be relatively high) and expelled out of the valve in a rush, which can cause the air or soap located in the valve to be ejected in an uncontrolled or otherwise undesirable manner (e.g., in a sputter). In contrast, the reduced actuating pressure of the valve 200 can reduce the amount that air in the conduit 26B is compressed prior to the valve 200 opening, and thus can reduce or avoid such an uncontrolled or undesirable dispensation during priming.

Certain implementations of the valve 200 can reduce or avoid sticking problems found in certain other valve configurations. For example, in valves including a valve body that is pressed against a valve seat, a thin film of soap between the body and seat can encourage the body and seat to stick to each other (e.g., the thin film of soap can act as an adhesive), which can inhibit or prevent the valve from opening. Such an issue can be especially prevalent in designs in which the valve body must move generally against the flow of soap in order for the valve to open. In contrast, certain embodiments of the valve 200 are opened by deflecting the deflectable members 218, 220 an acute angle with respect to the direction of the flow of soap through the valve 200. Further, as certain embodiments of the valve 200 do not include a spring pressing a valve body against a valve seat with a thin film of soap therebetween, the occurrence, or at least the degree, of sticking can be reduced or avoided.

FIG. 13 illustrates the valve 200 in a closed position, e.g., the deflectable members 218, 220 are in contact with each other thereby substantially closing the outlet end 216 so as to resist the outflow of soap in most circumstances of normal use until the valve 200 is opened. In contrast, FIG. 13A illustrates the valve 200 in an open position, e.g., the deflectable members 218, 220 have moved apart from each other, thereby opening a channel between the deflectable members 218, 220 through which fluid can flow. For example, in the open state, soap can pass from the inlet 214 and through the outlet 216, such as to be dispensed to a user's hands. As shown, the valve 200 can be opened by applying force on the valve 200 along an axis generally parallel with a line formed by the interface of the deflectable members 218, 220. Although FIG. 13A illustrates the valve 200 being squeezed, and thereby opened, by the fingers of a human hand, in the dispenser 10B, the valve 200 is typically opened in other ways, such as by pressurized liquid soap acting against the deflectable members 218, 220.

Figure 15:
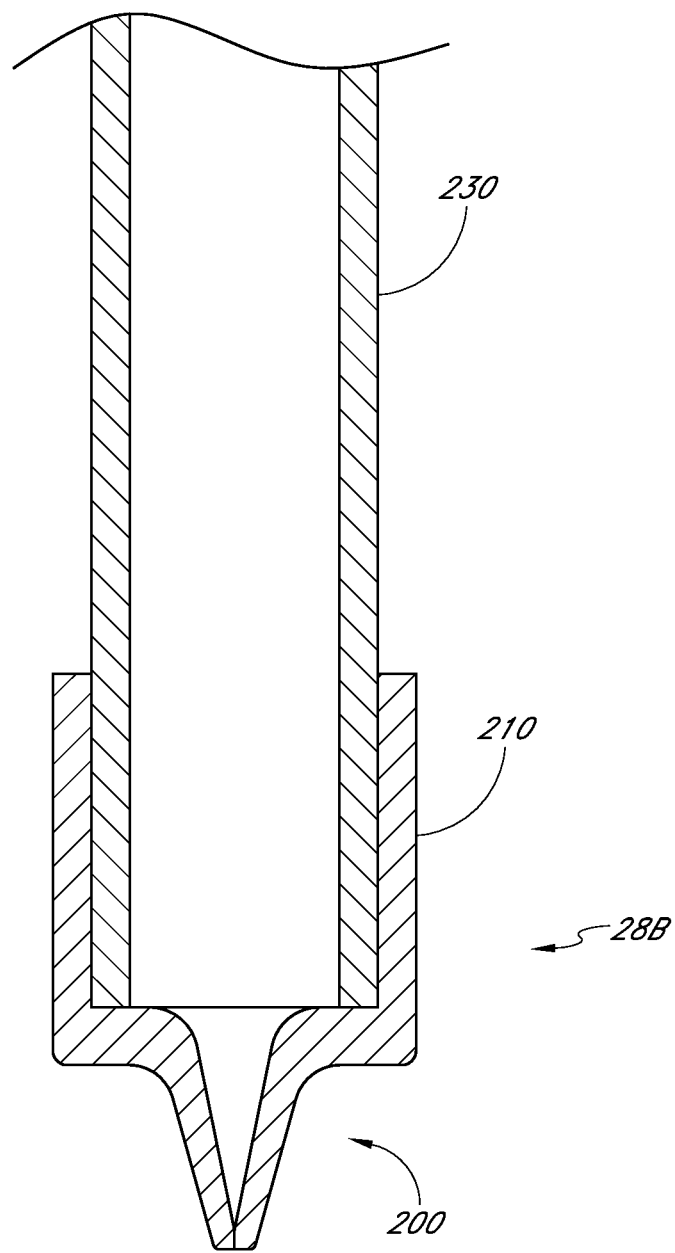
FIG. 15 illustrates a cross-sectional view of the discharge nozzle attached to a pipe.
Figure 16:
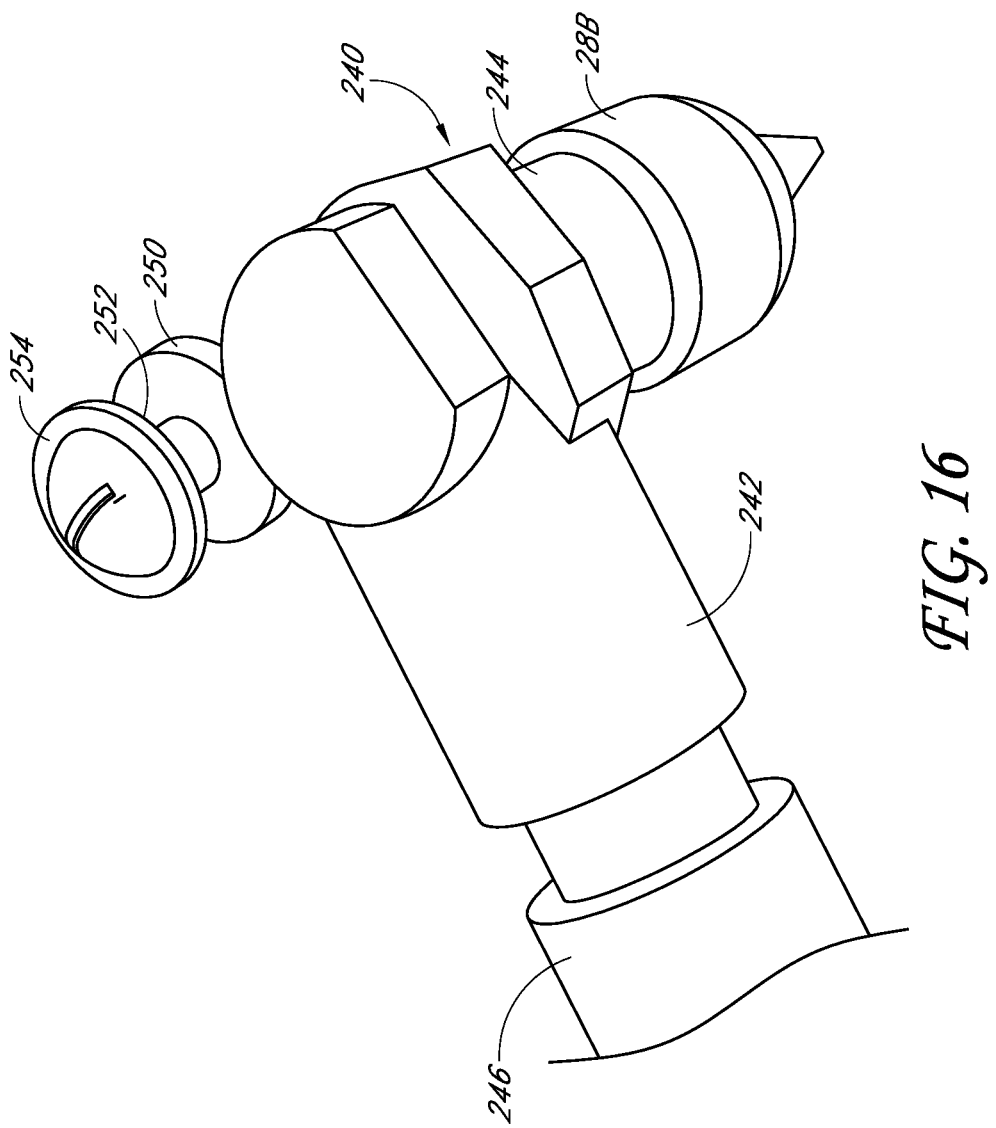
FIG. 16 illustrates a perspective view of the discharge nozzle coupled with a mounting flange and an angled member.

In a first state, such as when the pump 18B is not operating, ambient pressure acts against the outer surfaces of the deflectable members 218, 220, thereby pressing them toward each other and closing the outlet 216 of the valve 200. Such closure of the outlet can, for example, inhibit or prevent liquid soap L within the nozzle 28B from leaking past the deflectable members 218, 220, for example, under the influence of gravity. In a second state, such as when the pump 18B operates, liquid soap L is encouraged toward the inlet 214, which in turn generates pressure within the liquid soap L in the nozzle 28B. When the pressure of the soap in the nozzle 28B is greater than or equal to the cracking pressure of the valve 200, the liquid soap L can deflect the deflectable member 218, 220 and thereby be discharged out of the nozzle 28B. In some embodiments, the cracking pressure of the valve 200 can be at least about 0.2 psi and/or less than or equal about 0.3 psi greater than atmospheric pressure of the environment in which the dispenser 10B is located. In some embodiments, the cracking pressure can be at least about 0.3 and/or equal to or less than about 0.5 psi. FIGS. 15 and 16 illustrate some configurations in which the valve 200 can be applied to the dispenser 10B. FIG. 15 illustrates a straight connection configuration. In some such embodiments, the collar 210 of the valve 200 can fit over the outer surface of a liquid soap pipe 230, which can be in fluid communication with the reservoir 16B and/or the pump 18B. In some configurations, the collar 210 and the pipe 230 mate in substantially liquid-tight engagement to resist soap leakage. Thus, in certain embodiments, liquid soap L can pass from the reservoir 16B and/or the pump 18B, through the pipe 230, and be discharged out of the valve 200 in a direction generally parallel with the longitudinal axis of the conduit 230.

FIG. 16 illustrates a curved or angled connection between the valve 200 and the liquid soap dispensing system (e.g., a substantially 90° configuration). In some embodiments, an angled member 240 (e.g., an elbow, curve, angle, or otherwise) includes an inlet end 242 and an outlet end 244. The inlet end 242 of the angled member 240 can be connected to a fluid supply source 246, which can be in fluid communication with the reservoir 16B and/or the pump 18B. In some embodiments, the longitudinal axis of the inlet end 242 can be angled (e.g., at least: about 15°, about 30°, about 60°, about 90°, values therebetween, and otherwise) relative to the outlet end 244 of the angled member 240. Thus, when the nozzle 28B is attached to the outlet 244 of the angled member 240, soap can be discharged through the valve 200 at an angle (e.g., about 90°) relative to the inlet 242.

In some embodiments, the angled member 240 can include a mounting member, such as a flange 250. In the illustrated embodiment, the flange 250 includes an aperture 252. In some implementations, a fastener 254 (such as a threaded fastener, rivet, boss, hook, or otherwise) can be used to attach the angled member 240 and the housing 12B of the soap dispenser 10B.

Figure 17:
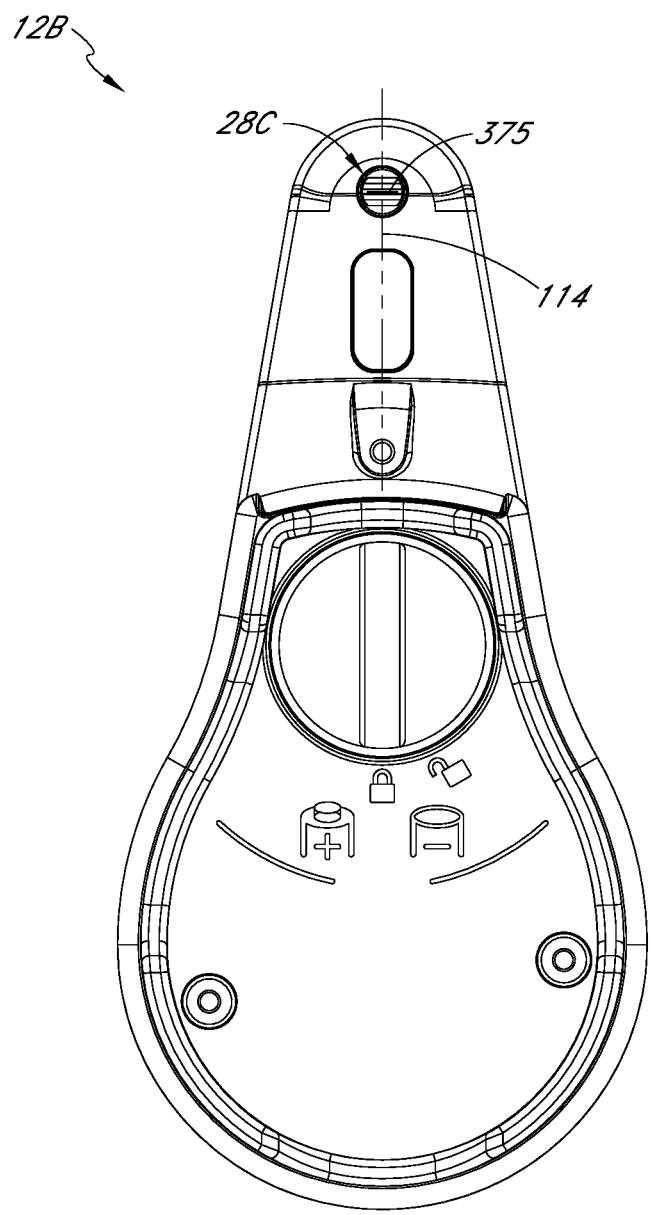
FIG. 17 illustrates a bottom plan view of the soap pump of FIG. 10 with another embodiment of a discharge nozzle.

FIG. 17 illustrates another embodiment of a nozzle 28C, which can be installed in the housing 12B. In some embodiments, the nozzle 28C protrudes from the housing 12B. For example, in certain embodiments, the nozzle 28C can be at least partly visible to an observer outside the dispenser. In some embodiments, the nozzle 28C can be oriented such that the nozzle outlet 375 is generally perpendicular to a front-to-back axis 114 (also illustrated in FIG. 4) of the housing 12B. In certain embodiments, the nozzle outlet 375 may be oriented such that it is not perpendicular to the axis 114.

Figure 18:
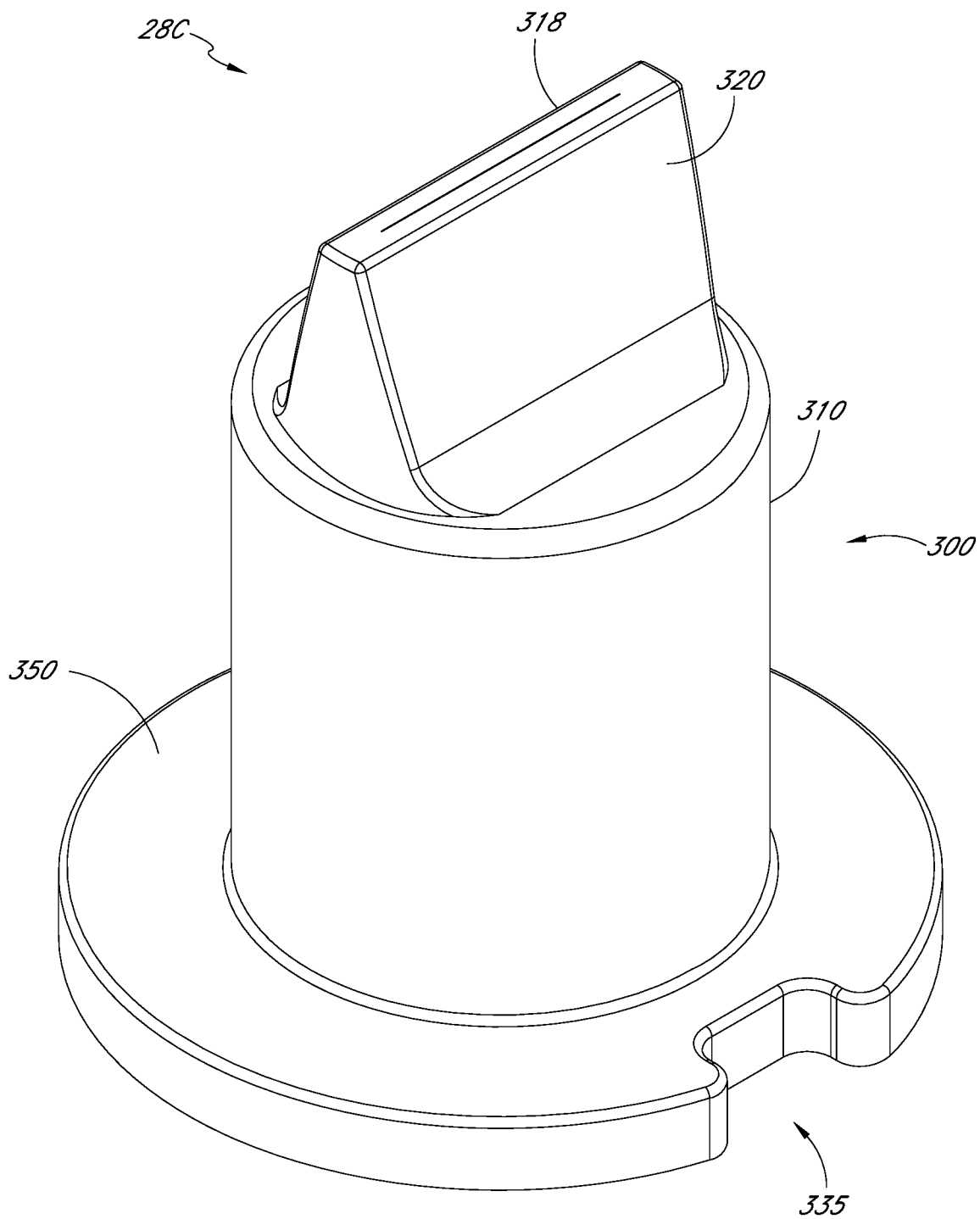
FIG. 18 illustrates a perspective view of the discharge nozzle of FIG. 17.
Figure 19:
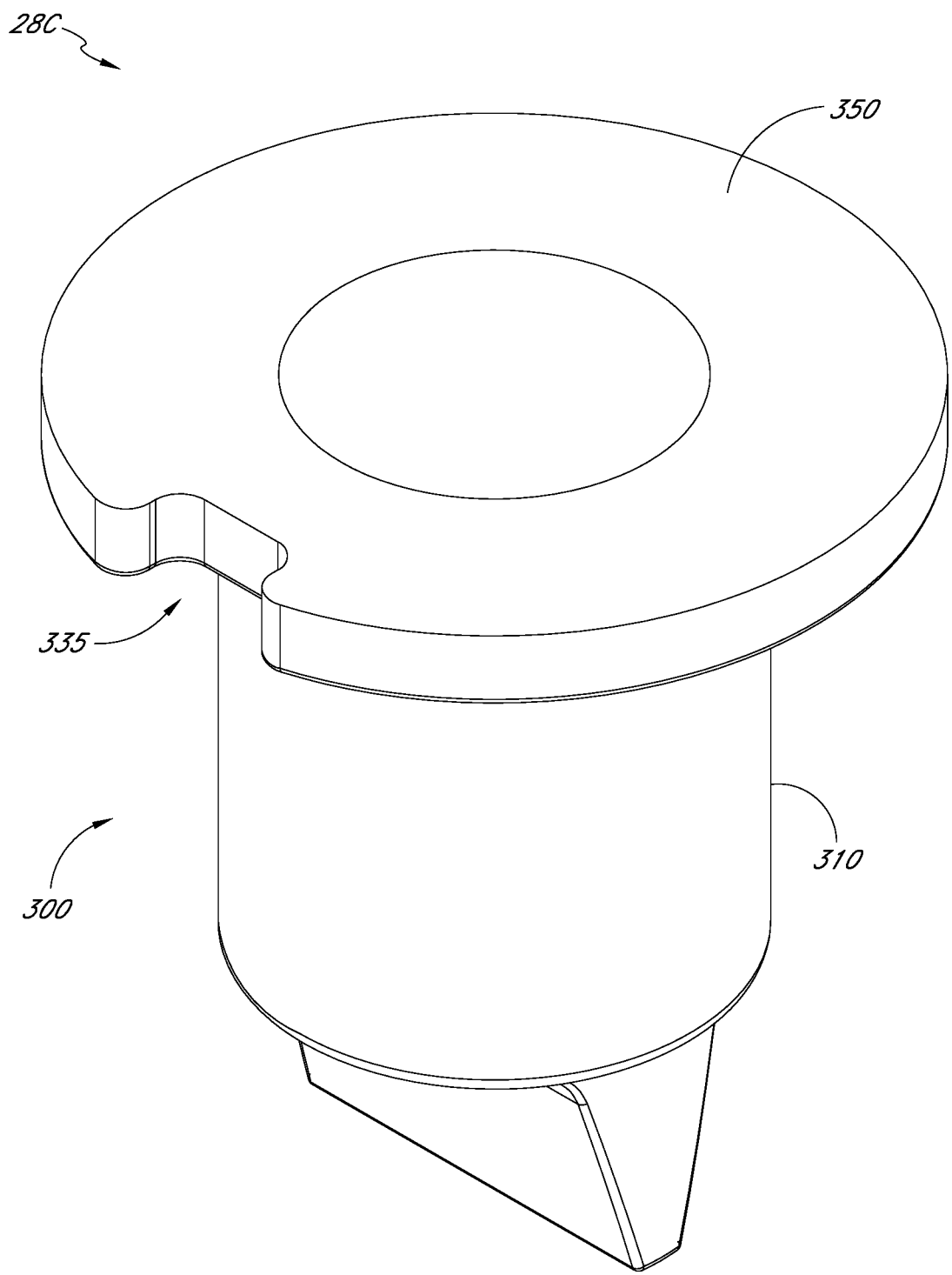
FIG. 19 illustrates another perspective view of the discharge nozzle of FIG. 18.

With reference to FIGS. 18 and 19, the nozzle 28C can be in the form of a valve 300. As noted above, such a configuration is sometimes referred to as a "duckbill valve." In some embodiments, the valve 300 can include an inlet collar 310, deflectable members 318, 320, and a valve flange 350. In some embodiments, the valve flange 350 can have one or more first positioners, such as an indentation 335. For example, as illustrated in FIGS. 18 and 19, the indentation 335 can be a single indentation. In some embodiments, the indentation 335 comprises a plurality of indentations. As shown, some embodiments of the inlet collar 310 can be cylindrically shaped. Some embodiments of inlet collar 310 have various other shapes, such as rectangular or triangular prismatic.

FIGS. 17-19 illustrate the deflectable members 318, 320 in a generally closed position. In some variants, when the pump 18 is not operating, the deflectable members 318, 320 can be pressed together, thereby closing the valve 300 and inhibiting or preventing liquid soap L in the nozzle 28C from leaking past the deflectable members 318, 320 (e.g., by the influence of gravity). In certain implementations, one or both of the deflectable members 318, 320 can be biased toward the other, thereby pressing the deflectable members 318, 320 together when the pump 18 is not operating. In some embodiments, the deflectable members 318, 320 atmospheric pressure acts against the outer surfaces of the deflectable members 318, 320 to press the deflectable members 318, 320 together.

When the pump 18 operates and generates sufficient pressure within the liquid soap L in the nozzle 28C, the liquid soap L can open the nozzle 28C by deflecting the deflectable members 318, 320, thereby discharging the liquid soap from the nozzle 28C. As previously noted, the pressure differential (compared to ambient atmospheric pressure) at which the nozzle 28C begins to open can be referred to as the "cracking pressure." In some embodiments, the cracking pressure required to discharge the liquid soap L from the nozzle 28C can be at least about 0.2 psi and/or equal to or less than about 0.3 psi above atmospheric pressure. In some embodiments, the cracking pressure required to discharge the liquid soap L from the nozzle 28C can be at least about 0.3 and/or equal to or less than about 0.5 psi.

Figure 20:
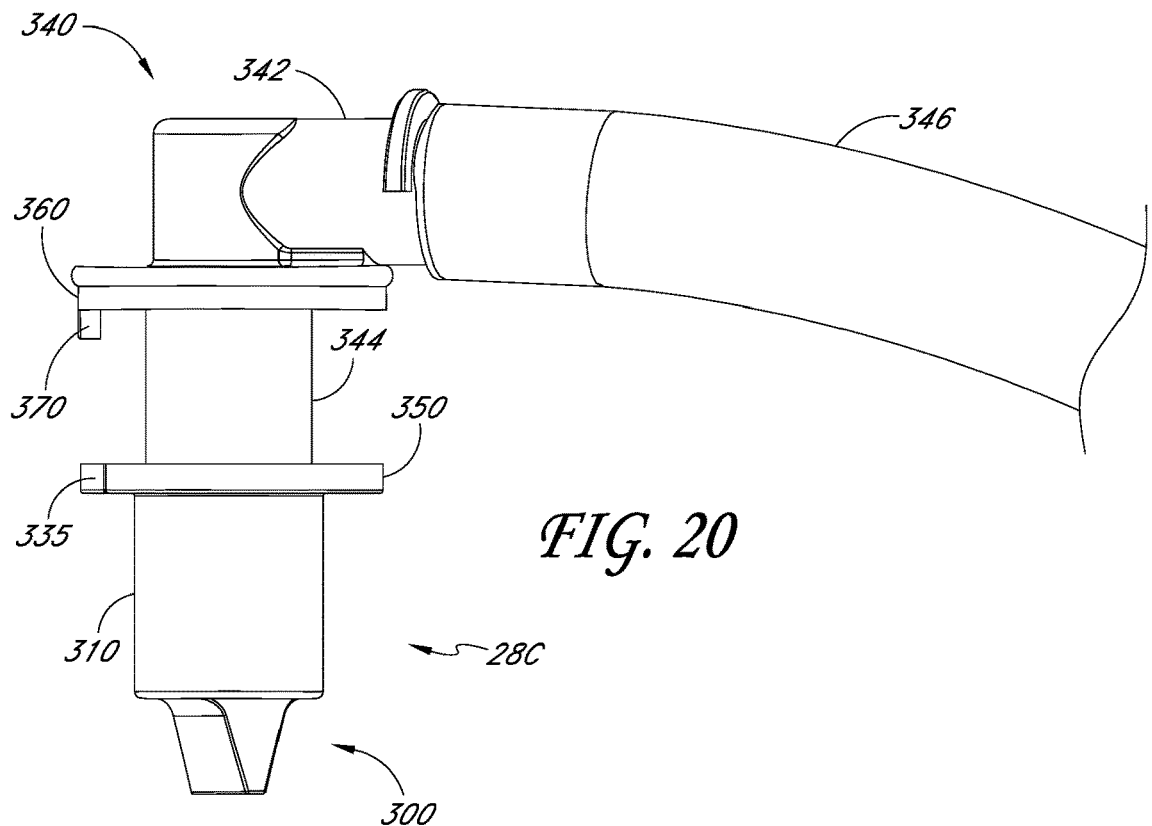
FIG. 20 illustrates a left side exploded view of the discharge nozzle of FIGS. 17-19 coupled with an angled member and a fluid supply source.
Figure 21:
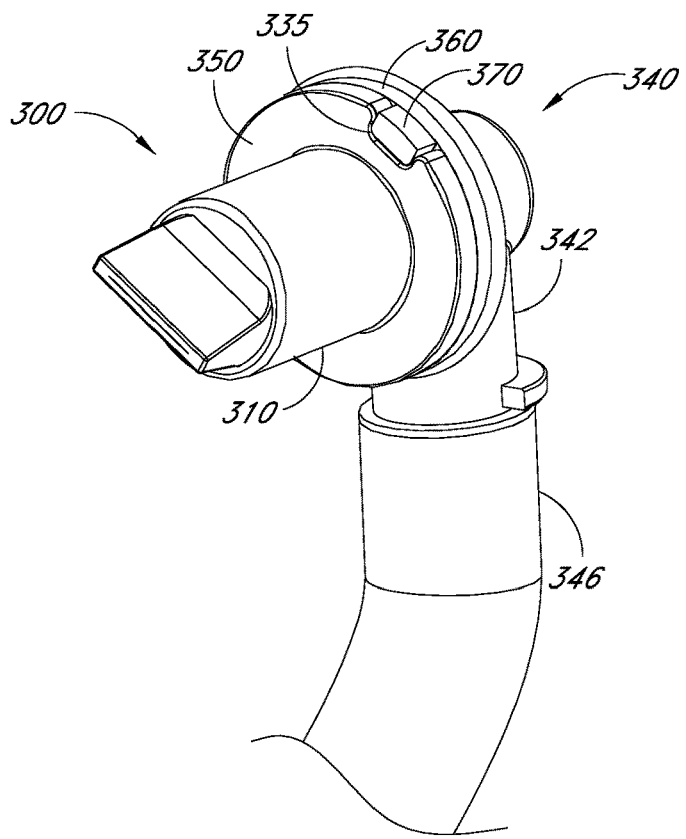
FIG. 21 illustrates a bottom left perspective view of the discharge nozzle, angled member, and fluid supply source of FIG. 20 in an assembled state.

FIGS. 20 and 21 illustrate a configuration in which the valve 300 can be applied to a liquid soap dispensing system. FIG. 20 illustrates the valve 300 and an angled member 340, such as an elbow of about 90°, in an unconnected state. As shown, the angled member 340 can include an inlet end 342 and an outlet end 344. The inlet end 342 can be connected to a fluid supply source 346, which can be in fluid communication with the reservoir 16B and/or pump 18B. The outlet end 344 of the angled member 340 can engage with the valve 300. In some embodiments, the angled member 340 can include a flange 360. The flange 360 can include one or more second positioners, such as protrusions 370.

As illustrated in the embodiment shown in FIG. 21, the valve 300 can be oriented such that the indentation 335 in the nozzle flange 350 generally aligns with the protrusion 370 on the flange 360. In this embodiment, the protrusion 370 can engage with and/or be received by the indentation 335. Such a configuration can, for example, inhibit or prevent rotation of the valve 300 with respect to the outlet end 344 of the angled member 340. Further, in some embodiments, the indentation 335 can ease manufacturing of the dispenser 10B, as the indentation 335 can facilitate orientation of the nozzle 28B with regard to the remainder of the dispenser 10B, thereby facilitating assembly. For example, some configurations of the indentation 335 orient the nozzle 28C such that the line of contact between the deflectable members 318, 320 can be substantially transverse to the axis 114, which can facilitate dispensing soap into a user's hands in a desired pattern.

In some implementations, the pump 18 and/or actuator 34 can be configured to temporarily (e.g., for less than or equal to about a second) reverse the flow of soap. For example, in embodiments having a gear pump, the rotation of the gears can be temporarily reversed, thereby drawing soap from the nozzle back toward the reservoir. Such a configuration can, for example, facilitate closing of the nozzle 28C. For instance, in embodiments having the valve 300 with first and second deflectable members 318, 320, such reversal of flow can encourage closing of the valve 300. Indeed, in implementations, reversal of flow can reduce the delay that between the intended cessation of dispensation of soap and the actual cessation of dispensation of soap from the nozzle 28C. In some embodiments, reversing the flow of soap encourages a tight seal between the first and second deflectable members 318, 320.

Figure 22:
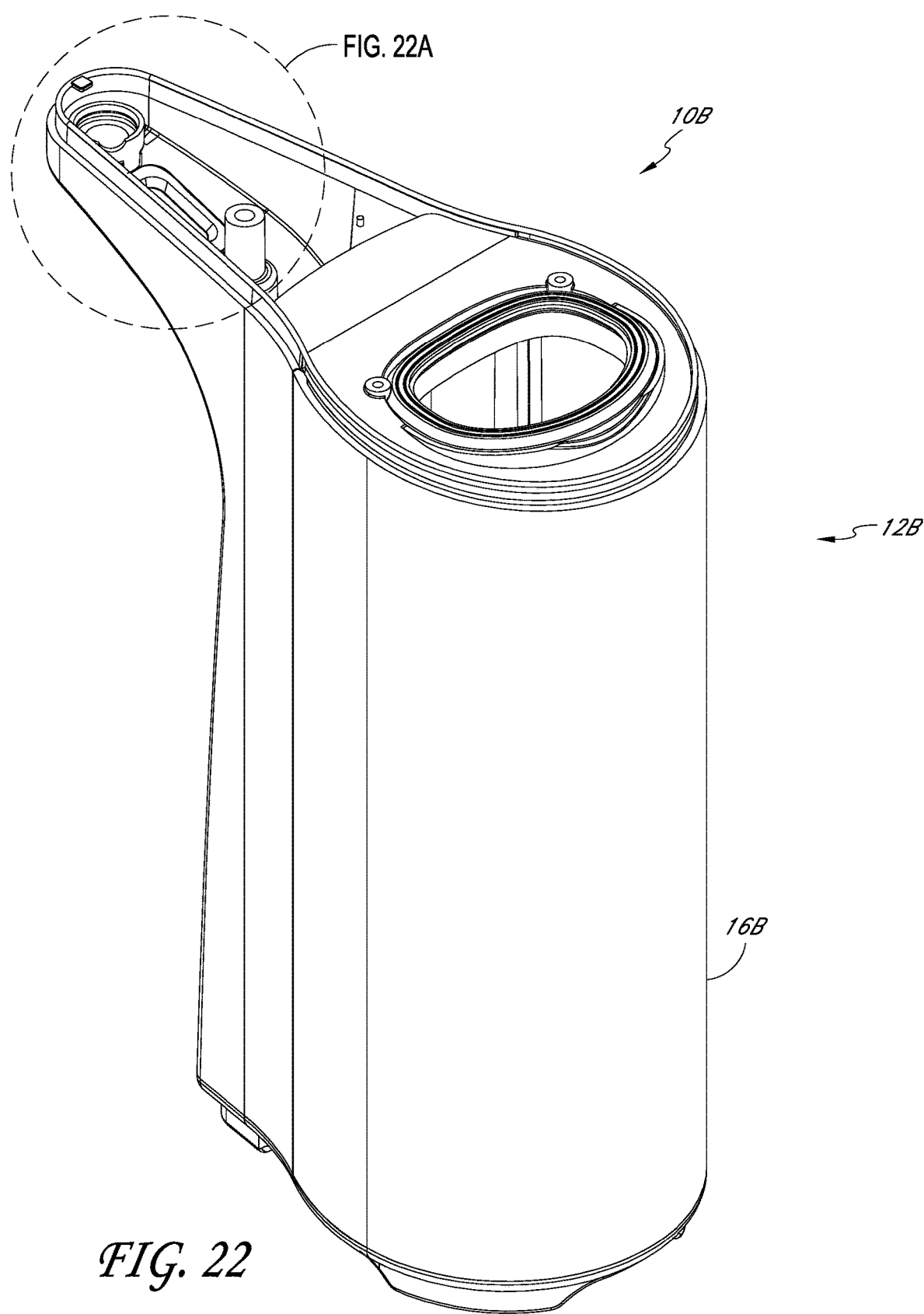
FIG. 22 illustrates top, left, rear perspective view of the soap pump of FIG. 10, with a top portion of a housing removed to expose certain components.
Figure 22A:
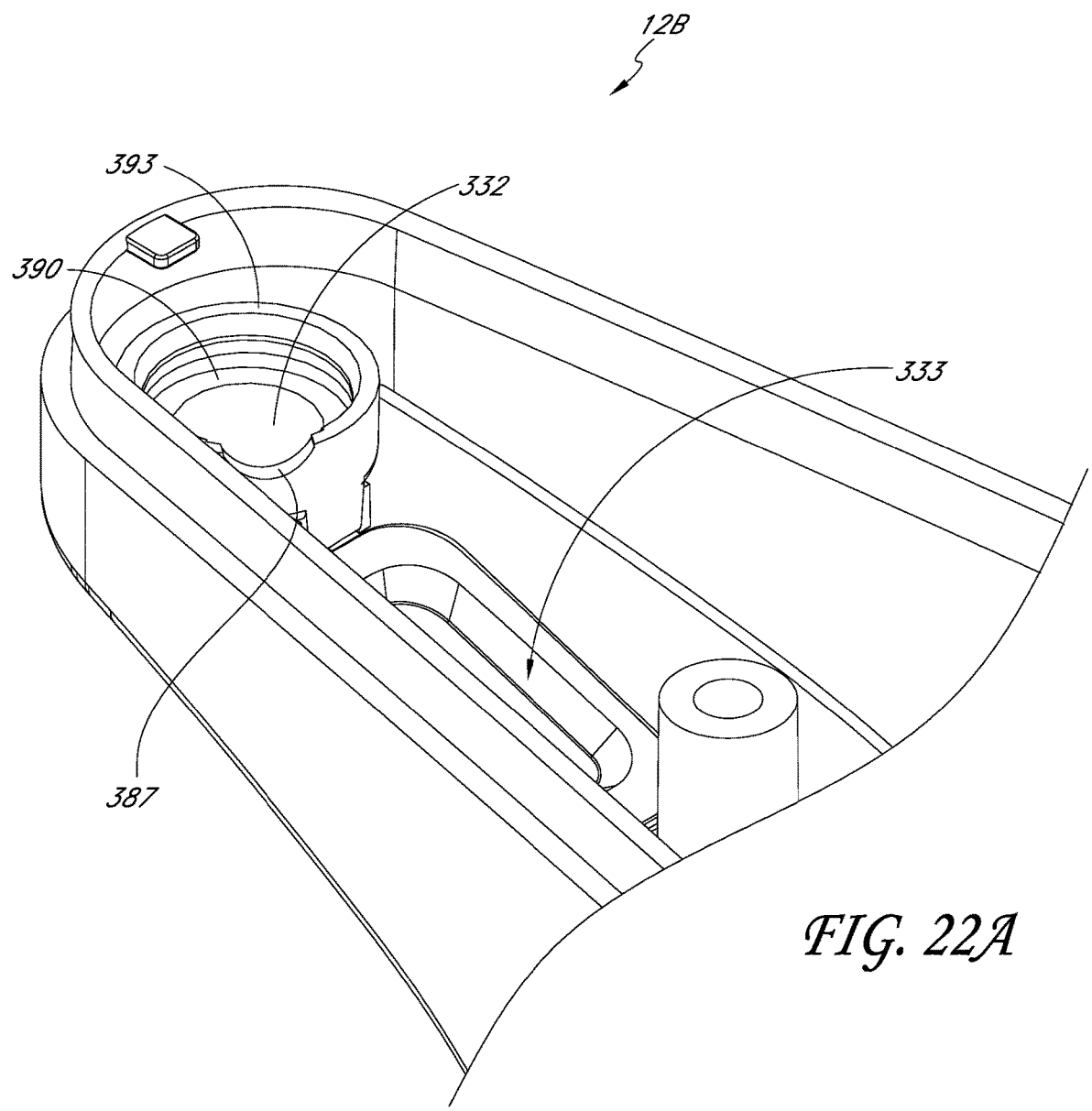
FIG. 22A illustrates a focused top, left, rear perspective view of a portion of the housing of FIG. 22.

As shown in FIG. 22, in some embodiments, the housing 12B can have an opening 332 in which the nozzle 28C can be at least partly received. In some embodiments, the opening 332 of the housing 12B can include a leak inhibiting structure, such as an annular protrusion 390. In some embodiments, the nozzle flange 350 of the nozzle 28C can be pressed against the annular protrusion 390, thereby creating a substantially liquid-tight seal. The opening 332 of the housing 12B can comprise a positioning structure, such as a ridge 393. In the embodiment shown in FIG. 22, the ridge 393 can include an orienting structure, such as a recess 387. In certain arrangements, the housing 12B includes one or more other apertures 333, such as a sensor device, as was discussed in further detail above.

Figure 23:
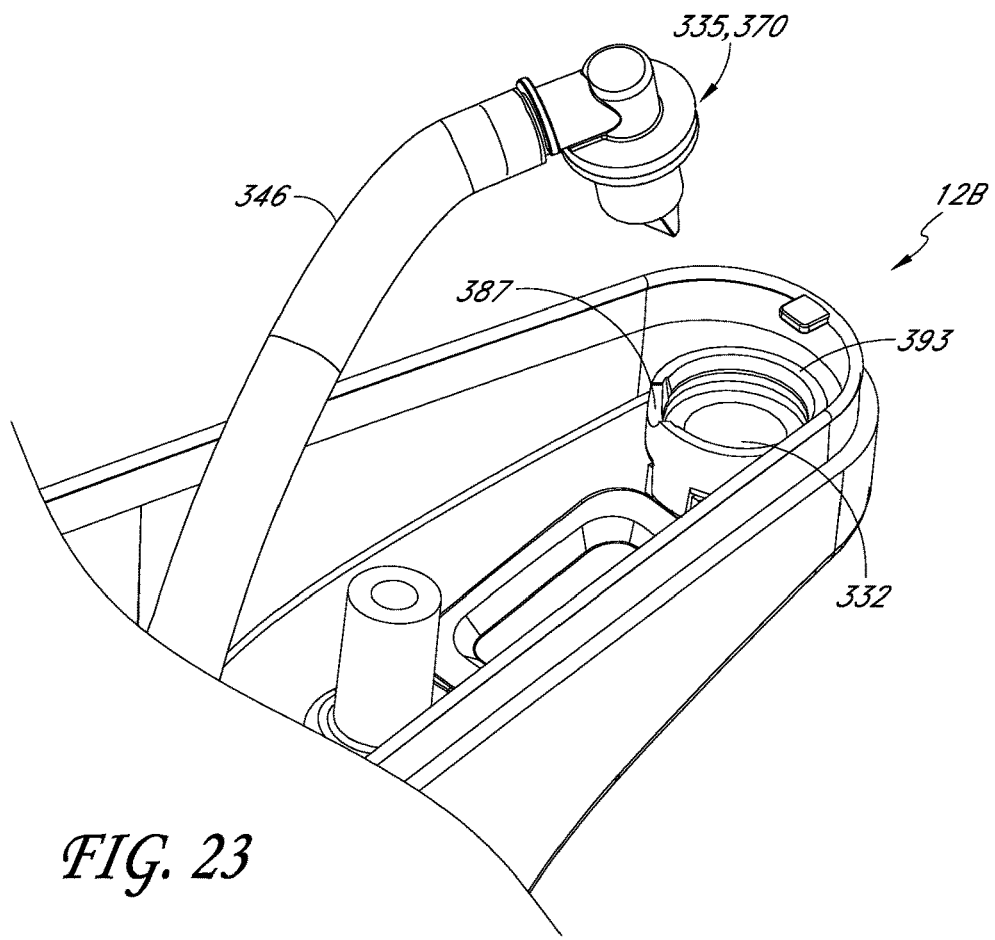
FIG. 23 illustrates a focused top, right, rear perspective exploded view of the housing of FIG. 22 and the discharge nozzle, angled member, and a fluid supply source of FIGS. 20 and 21.

FIG. 23 shows the housing 12B from FIG. 22 as well as the assembled nozzle 28C and angled member 340 of FIG.

Figure 23A:
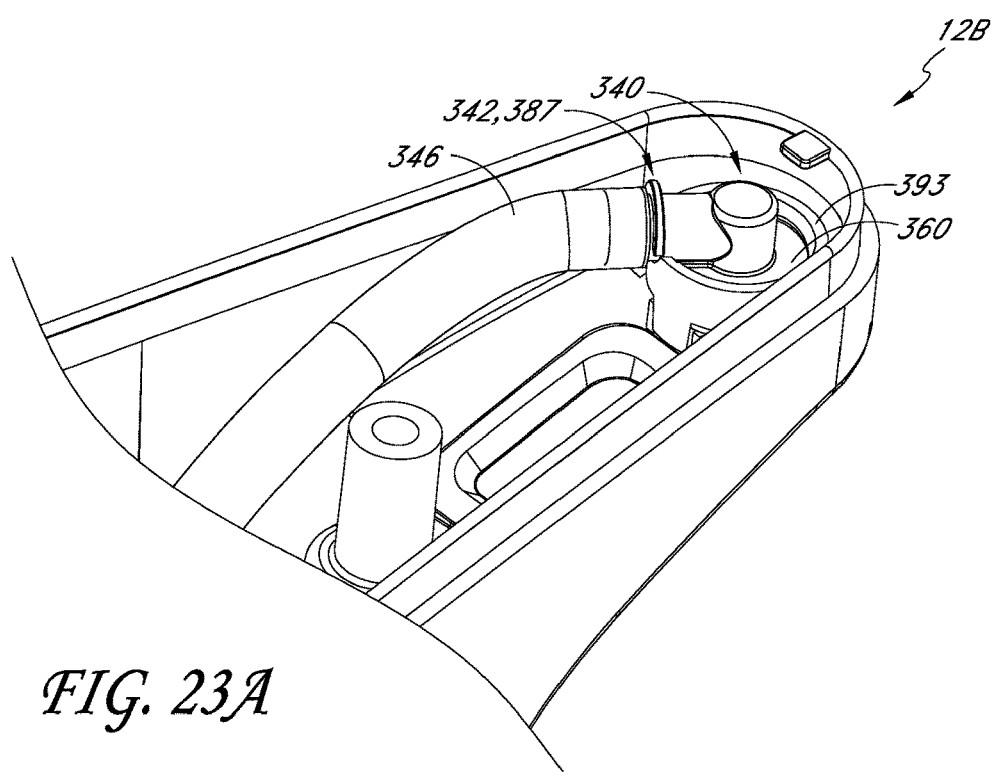
FIG. 23A illustrates a focused top, right, rear assembled perspective view of the housing of FIG. 22 and the discharge nozzle, angled member, and a fluid supply source of FIGS. 20 and 21.

21. The recess 387 in the ridge 393 can be sized to accept the inlet end 342 of the angled member 340 when at least a portion of the angled member 340 and the nozzle 28C can be inserted into the opening 332 of the housing 12B. The recess 387 can, for example, inhibit or prevent the angled member 340 from rotating with respect to the housing 12B. In some embodiments, a combination of the recess 387 of the ridge 393 and the indentation 335 and protrusion 370 of the assembled nozzle 28C and angled member 340 can inhibit or prevent the nozzle 28C from rotating with respect to the housing 12B. FIG. 23A shows the assembled nozzle 28C and angled member 340 in an installed position in the housing 12B.

In some embodiments of the nozzle 28C, the geometry of the deflectable flap members 318, 320 can be designed to increase the cracking pressure necessary to open the nozzle outlet 375 of the nozzle 28C. Configurations like these can, for example, allow the valve 300 to withstand higher internal pressures before permitting a flow of fluid therethrough. Such an increased cracking pressure is desirable in certain applications (e.g., when some or all of the reservoir 16 is positioned higher than the nozzle 28C). In some instances, an increased cracking pressure facilitates faster and/or increased disbursement of soap.

Figure 24:
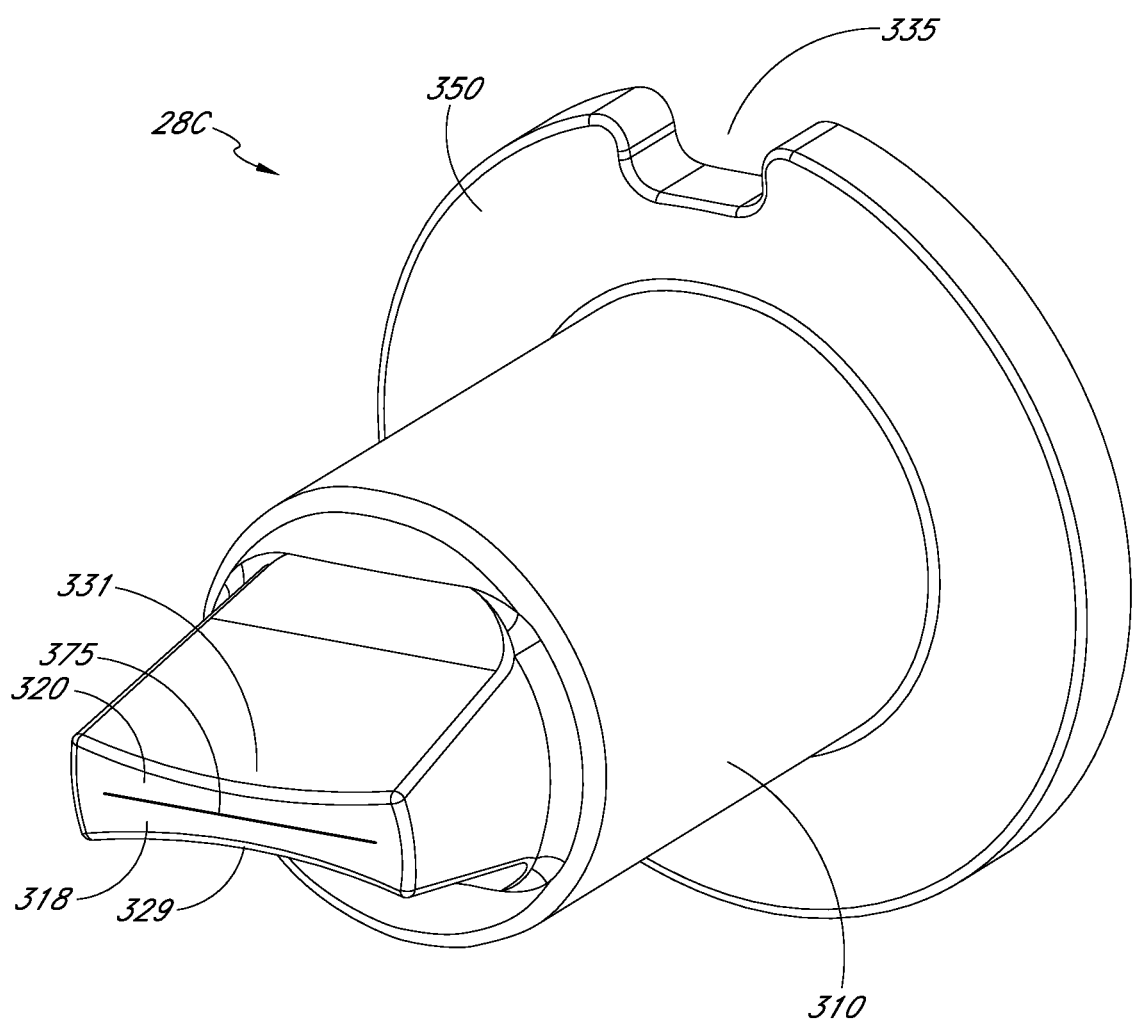
FIG. 24 illustrates a front, top, left perspective view of another embodiment of a discharge nozzle, including concave cutouts.
Figure 25A:
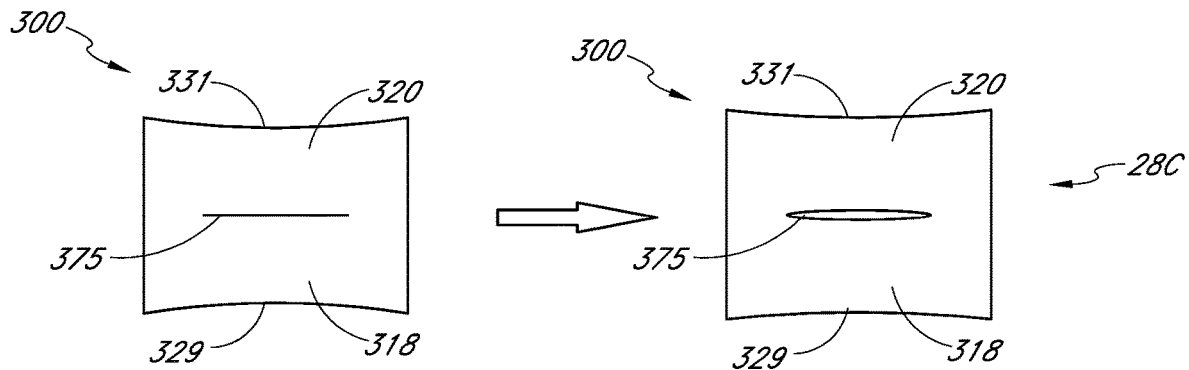
FIGS. 25A-25C illustrate front views of outlets of three embodiments of discharge nozzles for a soap pump.

With reference to FIGS. 24 and 25A, in some embodiments, the deflectable members 318, 320 have biasing features, such as recesses 329, 331. Thus, in certain embodiments, the deflectable members 318, 320 have a generally hourglass shape in an end view. In some embodiments, the deflectable members 318, 320 with the recesses 329, 331 exhibit an increase in the bias between the deflectable members 318, 320 compared to deflectable members without such recesses. In some embodiments, the deflectable members 318, 320 can be configured such that the concavity the recesses 329, 331 produces or increases the bias of the deflectable members 318, 320 against each other.

In some embodiments of the nozzle 28C, the geometry of the deflectable members 318, 320 can be configured to decrease the cracking pressure needed to open the nozzle outlet 375 of the nozzle 28C. For example, the recesses 329, 331 can be configured such that they reduce the thickness of the deflectable members 318, 320 at about the midpoint of the outlet 375 as compared to other regions of the outlet 375 without greatly increasing the radius of concavity. As a result, in certain such implementations, the cracking pressure necessary to open the nozzle outlet 375 of the nozzle 28C may be reduced.

Figure 25B:
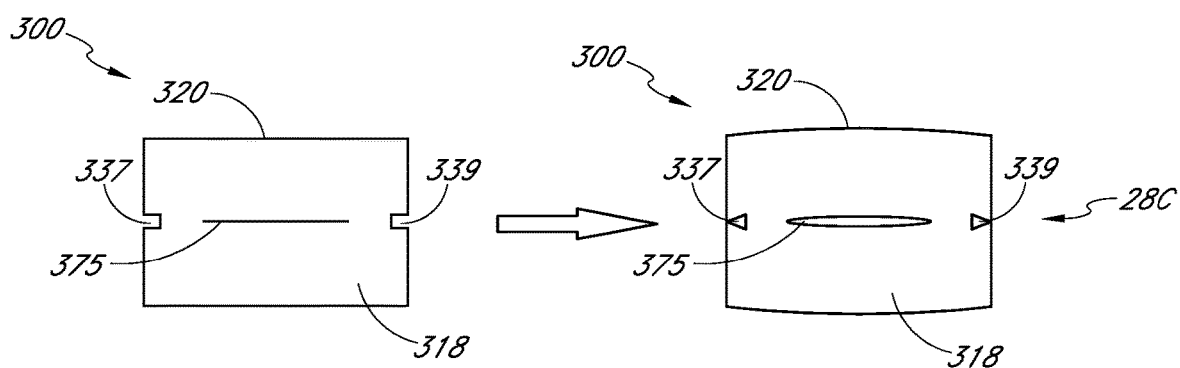

As shown in FIG. 25B, some embodiments of the nozzle 28C include one or more deformation-facilitating members, such as notches 337, 339, in the sides of the nozzle outlet 375. Notches 337, 339 can reduce the compressive force in the material in the vicinity of the notches 337, 339. Thus, the notches 337, 339 can allow the sides of the nozzle outlet 375 to deform more easily, thereby facilitating opening of the outlet 375. In some arrangements, the notches 337, 339 resiliently deform during the period that the outlet 375 is open, e.g., opposite sides of the notches can move toward each other. In certain such cases, the resiliently deformed notches 337, 339 can provide or increase a biasing effect, which can facilitate the nozzle outlet 375 returning to its original shape when the pressure on the soap (e.g., from the pump) eases. Such a configuration can, for example, allow the nozzle outlet 375 to close more quickly when the pump 18B ceases operation. FIG. 25B illustrates an example of this concept in which the opening of the nozzle outlet 375 causes the notches 337, 339 to reduce in size as the material surrounding the notches 337, 339 compresses.

Figure 25C:
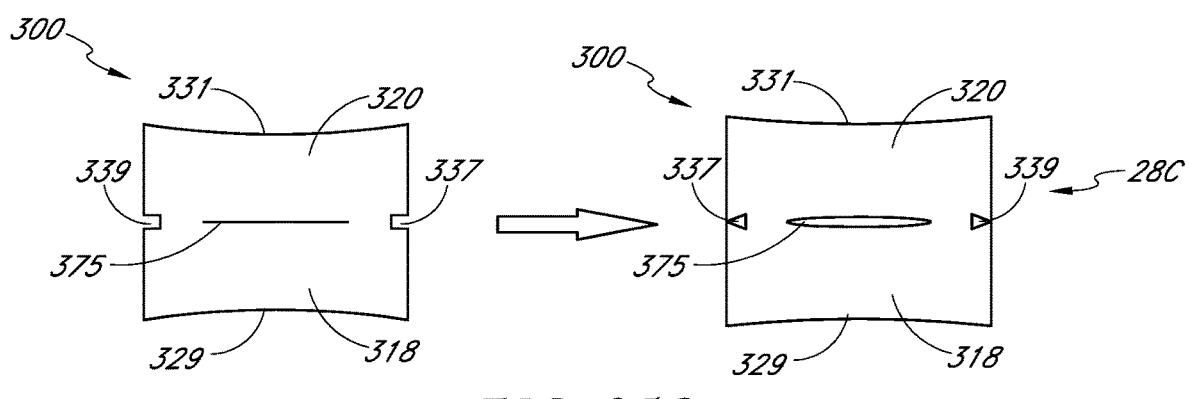

FIG. 25C illustrates a configuration wherein both notches 337, 339 and concave recesses 329, 331 can be utilized for the nozzle outlet 375. In some embodiments, the concave recesses 329, 331 in the deflectable members 318, 320 produce or increase the bias of the deflectable members 318, 320 to a closed position. Indeed, in certain such instances, the concave recesses 329, 331 increase the cracking pressure of the nozzle 28C. However, when the cracking pressure is reached and the outlet 375 begins to open, the notches 337, 339 can facilitate such opening by reducing compressive forces and/or interference of material on the side of the nozzle 28C. Moreover, the resilient deflection of the notches 337, 339 can be biased to return to their original, undeflected position, thereby promoting closing of the opening. In certain such embodiments, closing of the nozzle opening 375 is further promoted by the previously described bias of the deflectable members 318, 320.

Figure 26:
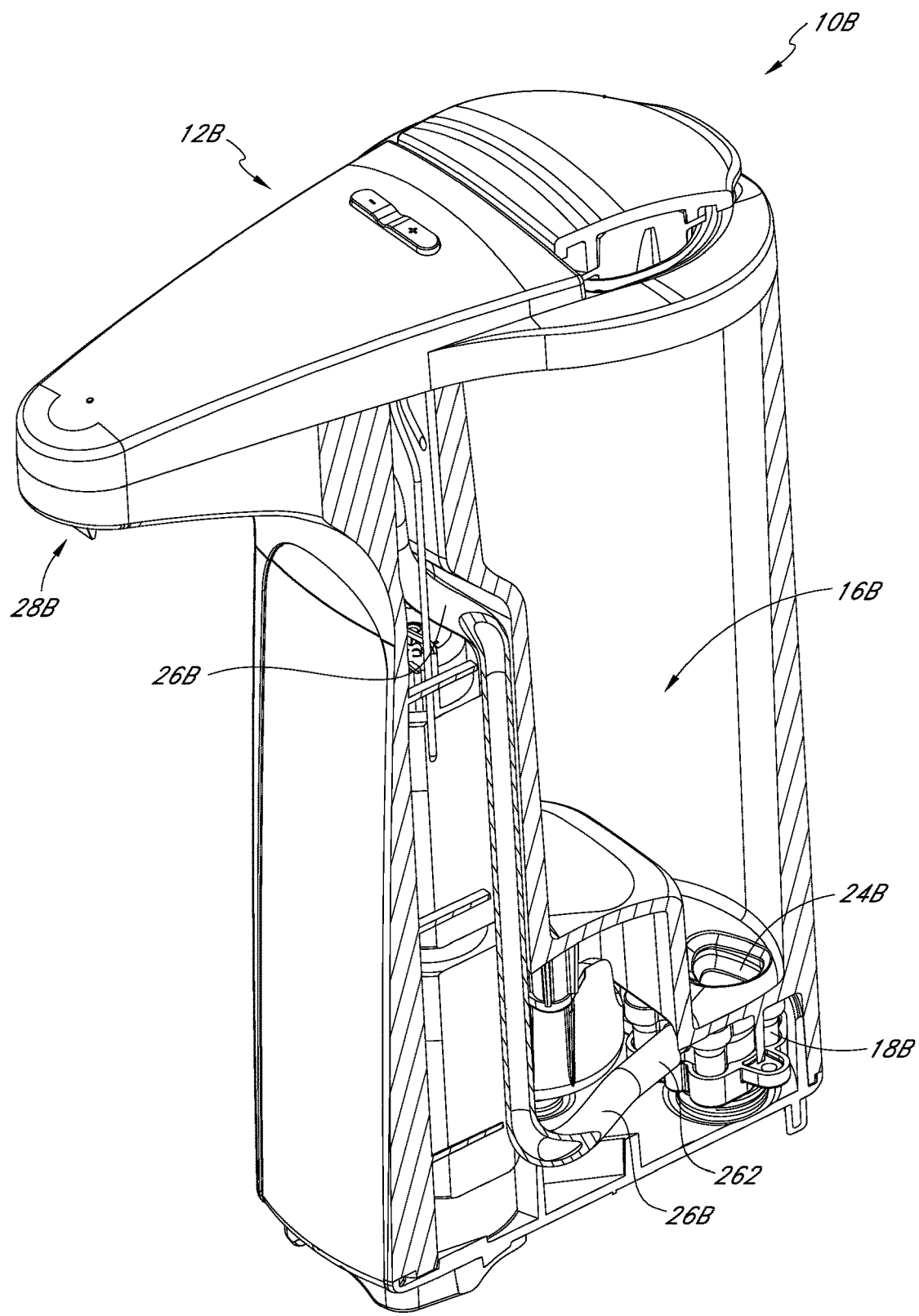
FIG. 26 illustrates a top, left, front perspective and partial cross-sectional view of the dispenser of FIG. 10, including a pump and a reservoir with an outlet.
Figure 27:
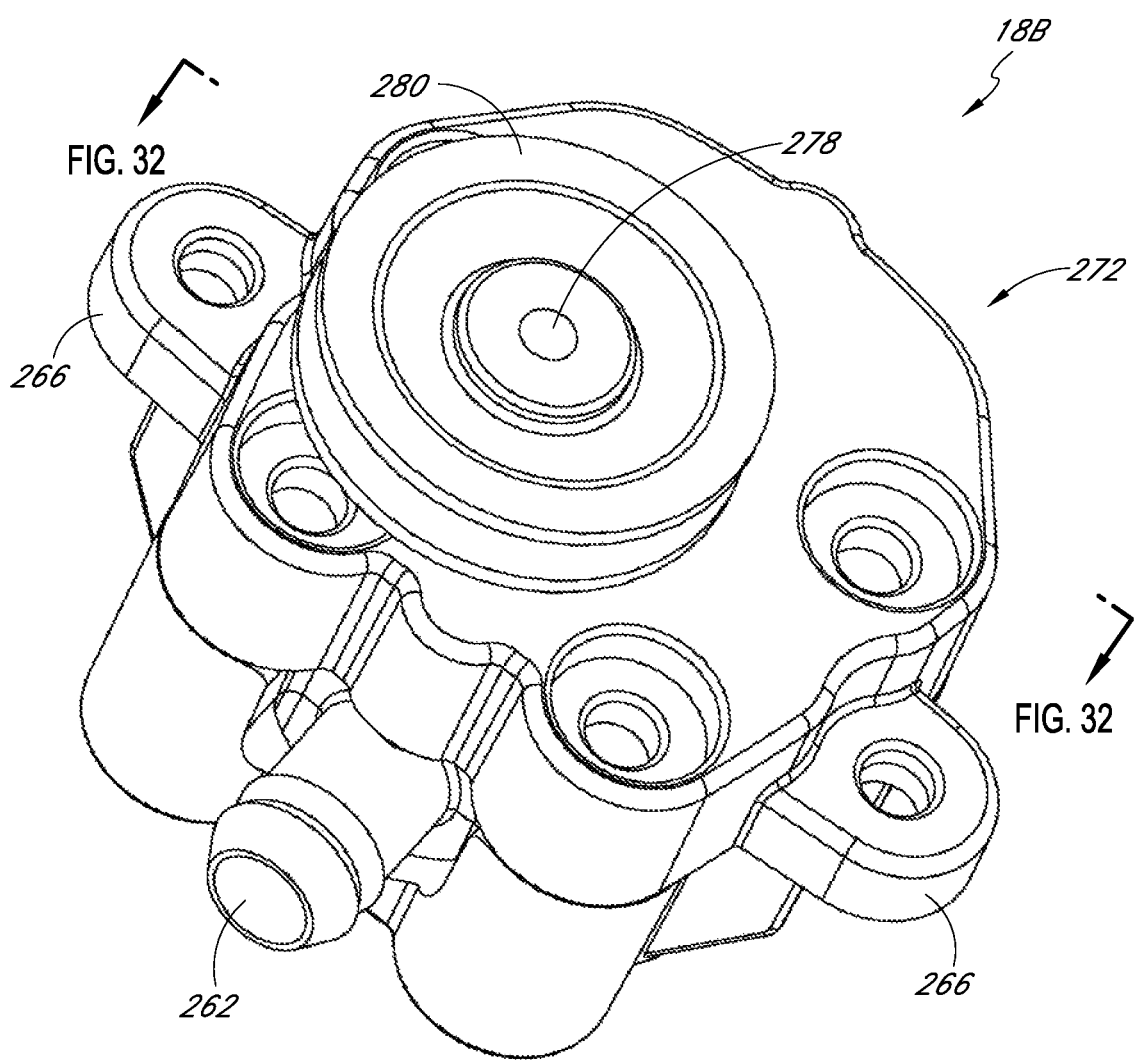
FIG. 27 illustrates a bottom front perspective view of an embodiment of the pump of FIG. 26.

With regard to FIG. 26, a top front perspective and partial cross-sectional view of the dispenser 10B is illustrated. As previously discussed, the dispenser 10B includes the reservoir 16B and pump 18B. As shown, the reservoir 16B can include an outlet 24B, which can be in fluid communication with the pump 18B. Thus, soap can flow between the reservoir 16B and the outlet 24B (e.g., by force of gravity). As discussed in further detail above, the pump 18B can drive the soap to the nozzle 28B via the conduit 26B, in order to be dispensed as desired.

As shown in FIGS. 27-29A, the pump 18B can include a pump body 272 having an outlet 262 and an inlet 263. In certain embodiments, the pump body 272 includes an upper member 264 and a lower member 265. Typically, the members 264, 265 can be configured to mate together (e.g., with adhesive, fasteners, a snap fit connection, or otherwise). The pump body 272 can have one or more arms 266 or the like that can be configured to, for example, facilitate mounting the pump body 272 in the housing 12B. Various materials can be used to form the pump body 272, such as metal, plastic, or otherwise. In some embodiments, the pump body 272 comprises a polymer, such as a polypropelene, polyoxymethylene, Delrin®, or otherwise.

In some embodiments, the pump body 272 houses a driven gear 270 and a slave gear 270'. In certain variants, the gears 270, 270' can be substantially identical. In some embodiments, the gears 270, 270' are not identical. In certain implementations, the gears 270, 270' can be configured to rotate in an oval and/or partially figure-eight-shaped space. As shown, certain embodiments of the pump body 272 include a chamber 273 in communication with the inlet 263. The chamber 273 can, for example, provide a staging location for liquid soap L between the reservoir 16B and the gears 270, 270'.

In certain implementations, a seal (e.g., made of rubber, silicone, or otherwise) can be positioned between the upper and lower members 264, 265. Such a configuration can, for example, inhibit soap leaking from the pump body 272 and/or reduce the likelihood of air infiltrating the pump body 272 (which in turn could lead to drying of the soap and impede the operation of the pump 18B). In some embodiments, the seal can be generally positioned along the periphery of the pump body 272.

Similar to the discussion above in connection with FIG. 9, in some embodiments, the pump body 272 includes a drive shaft aperture 274 (not shown). A gasket 276 (not shown) can be configured to form a seal against the aperture 274 and a drive shaft 278. One end of the drive shaft 278 can be connected to a driven sheave 280. The other end of the drive shaft 278 can extend through the gasket 276, the aperture 274, and engage with one of the driven gear 270. In some embodiments, the slave gear 270' can engage a boss 279.

In certain implementations, the pump body aperture or opening 263 of the pump body 272 can be in fluid communication with the reservoir 16, thereby allowing liquid soap L to flow into the pump body 272 via the opening 263. However, in certain arrangements, air can be present in the pump body 272. For example, air is generally present in the pump body 272 during or at least before priming of the pump. In some cases, air can form a bubble that is retained in the pump body 272 and may interfere with the ability of liquid soap L to flow into the pump body 272. Such interference can be exacerbated if the opening 263 is too small to allow the bubble to escape (e.g., due to surface tension and frictional forces). Thus, in some embodiments, the opening 263 can be configured to allow air in the pump body 272 to escape. For example, the opening 263 can be configured (e.g., can have a sufficient size and shape) to allow a bubble formed by air present in the pump body 272 to readily pass through the opening 263, such as during priming of the pump. For example, in some embodiments, the cross-sectional area of the opening 263 (e.g., taken generally in the plane of dimensions 293, 294 (see FIG. 29A)) can be generally about the same size as, or can be larger than, or can be substantially larger than, the cross-sectional area of the upper region of the gear 270, or of a tooth 269 of the gear 270, and/or of a hole 267 of the gear 270 for receiving the drive shaft 278. In some implementations, the pump body 272 is configured so as to facilitate the flow of the liquid soap L through the opening 263. In certain embodiments, the opening 263 is configured so as to not retain an air bubble in the pump body 272.

In some embodiments, the opening 263 can be configured to facilitate the liquid soap L flowing into the staging chamber, such as by force of gravity. As the liquid soap L generally can be rather viscous (e.g., between about 100 and about 2,500 centipoise), the surface tension of the liquid soap L may allow the soap to resist the force of gravity in certain arrangements. For example, when certain kinds of liquid soap are disposed directly over a hole, the surface tension of the soap may be sufficient to counteract the effect of gravity acting to urge the soap through the hole. In a soap dispenser, such a configuration can result in the soap being inhibited from reaching the pump, which can result in, for example, difficulty in priming the pump, reduced soap dispensation volume, and/or increased pump wear.

Certain embodiments of the pump dispenser 10B can be configured to reduce the likelihood of, or avoid, such surface tension issues. For example, in some implementations, the opening 263 can be sufficiently sized and shaped so as to facilitate gravity overcoming the surface tension of the soap. In certain variants, a first dimension 293 (e.g., a distance generally parallel with a centerline of the outlet 262) of the opening 263 can be greater than or equal to about: 5 mm, 6 mm, 7 mm, 8 mm, 9 mm, 10 mm, 11 mm, 12 mm, 13 mm, 14 mm, 15 mm, 16 mm, 17 mm, 18 mm, 19 mm, 20 mm, values in between, or otherwise. In some implementations, a second dimension 294 (e.g., a distance generally perpendicular to the centerline of the outlet 262) of the opening 263 can be greater than or equal to about: 5 mm, 6 mm, 7 mm, 8 mm, 9 mm, 10 mm, 11 mm, 12 mm, 13 mm, 14 mm, 15 mm, 16 mm, 17 mm, 18 mm, 19 mm, 20 mm, values in between, or otherwise. In certain embodiments, the first dimension 293 of the opening 263 can be greater than the second dimension 294 of the opening 263. For example, the ratio of the first dimension 293 to the second dimension 294 can be at least about three to about two. In some embodiments, the ratio of the first dimension 293 to the second dimension 294 can be about two to about one. In certain variants of the opening 263, the ratio of the first dimension 293 to the second dimension 294 can be at least about five to about four. In some variants, the sum of the first and second dimensions 293 and 294 can be greater than or equal to about: 10 mm, 12 mm, 14 mm, 16 mm, 18 mm, 20 mm, 25 mm, 30 mm, 35 mm, 40 mm, 45 mm, 50 mm, 55 mm, 60 mm, values in between, or otherwise. In some implementations, the opening 263 can be configured to receive a cylinder with a diameter that can be greater than or equal to about: 4 mm, 6 mm, 8 mm, 10 mm, 12 mm, 14 mm, 16 mm, 18 mm, 20 mm, values in between, or otherwise.

In certain embodiments, the opening 263 opens directly into the chamber 273. In some embodiments, the opening 263 opens directly into a second chamber 273' (see FIG. 32) that houses the gears 270, 270'. Such a configuration can, for example, facilitate the liquid soap L flowing into contact with the gears 270, 270', which in turn can facilitate priming of the dispenser 10B. In some variants, when the pump body 272 is viewed from a top plan view, a portion of at least one of the gears 270, 270' is visible though the opening 263.

Some methods of priming the dispenser 10B include providing the liquid soap L in fluid communication with the pump body 272 and allowing air (e.g., some or all) in the pump body 272 to escape the pump body 272. For example, some embodiments are configured to allow the air to escape from the pump body 272 via the opening 263. As previously noted, the opening 263 can be configured to inhibit or avoid the formation and/or trapping of an air bubble that would obstruct (e.g., partially or totally) the opening 263. Certain implementations can be configured so as to allow some or all of the air to escape from the pump body 272 via other apertures (e.g., apertures in the sides of the top, bottom, and/or sides of the pump body 272. Some embodiments are configured such that some or all of the air can escape from the pump body 272 via the outlet 262. Some embodiments of the method of priming include allowing the liquid soap L to enter the pump body 272. In certain embodiments, the liquid soap L can be at a higher elevation than some or all of the pump body 272, which can facilitate the liquid soap L being drawn into the pump body 272 by force of gravity.

Certain configurations of the opening 263 can, for example, facilitate the passage of air (e.g., a bubble) through the opening 263, thereby facilitating equilibrium between the pump 18 and the reservoir 16B and/or assisting in priming the pump 18. In some embodiments, the opening 263 can have a generally triangular shape. In some embodiments, the opening 263 can have a generally square, elliptical, circular, rectangular, or other regular or irregular polygonal shape. As illustrated in FIG. 29A, in certain embodiments, the opening 263 can include a sloped or angled surface (e.g., about 45°) that is wider in cross-section near the exterior than near the interior of the pump body 272. For example, in some variants, an inner periphery of the opening 263 is not coplanar with an outer periphery of the opening 263.

Figure 28:
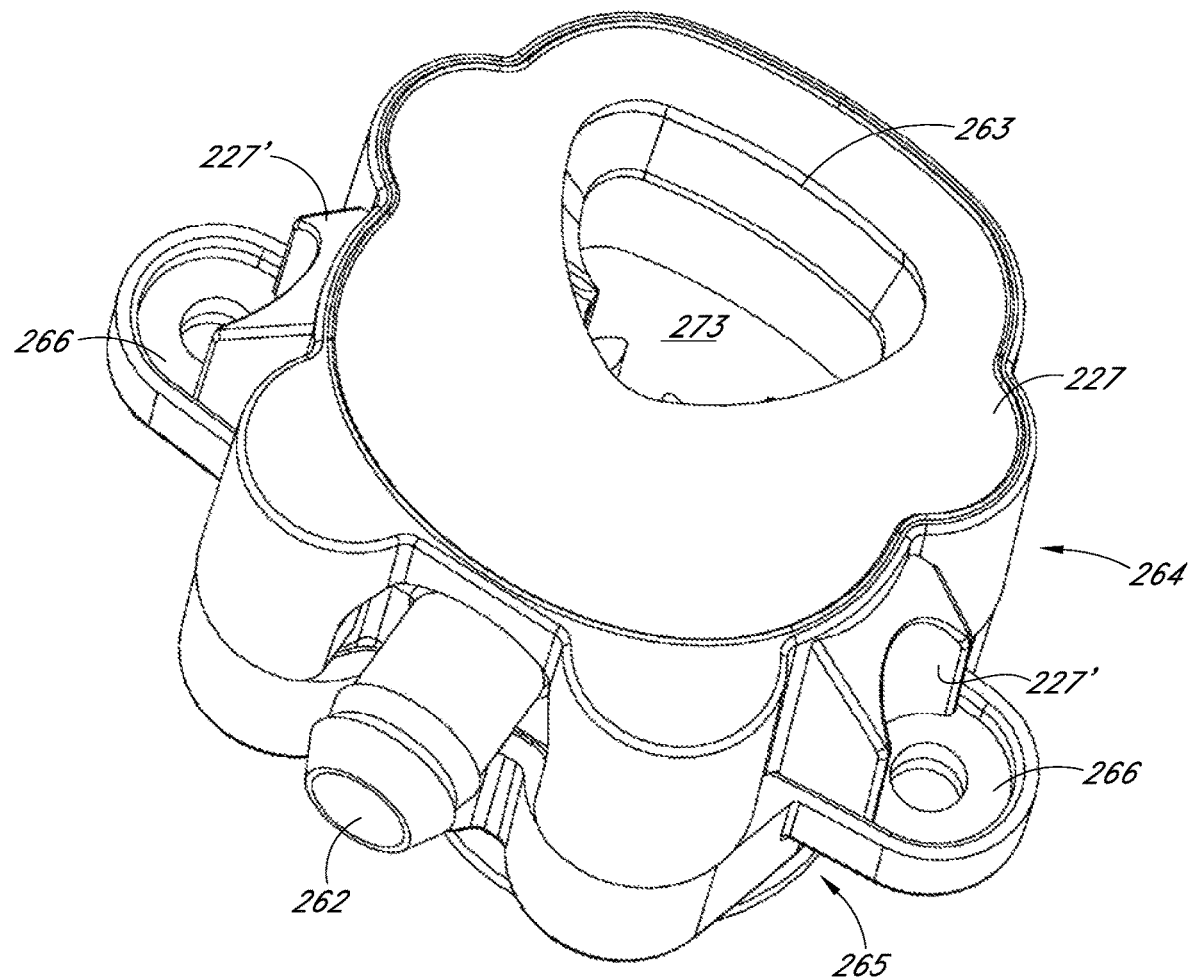
FIG. 28 illustrates a top front perspective of the pump of FIG. 26.
Figure 29:
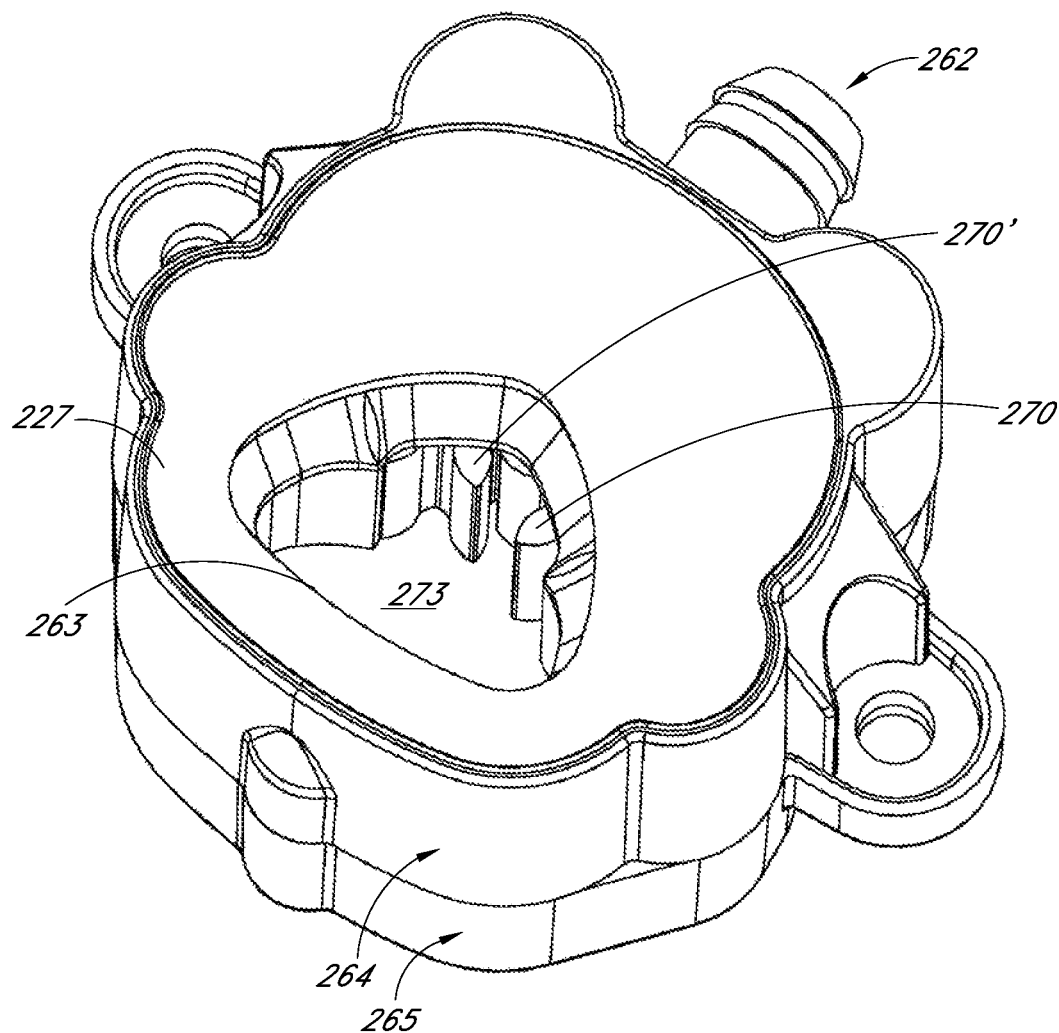
FIG. 29 illustrates top rear perspective of the pump of FIG. 26, the pump having an upper member, a lower member, and gears.
Figure 29A:
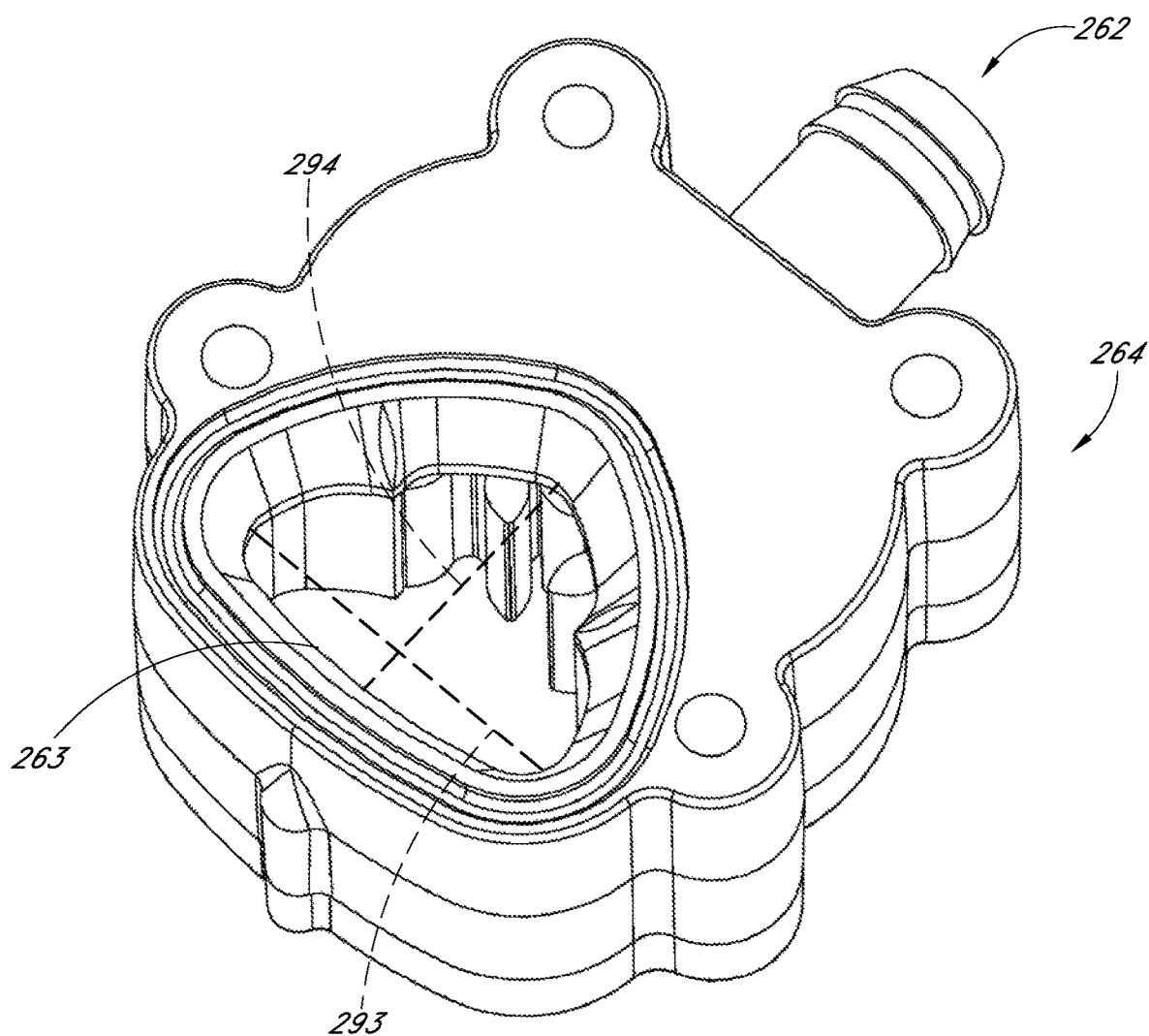
FIG. 29A illustrates a top rear perspective of the upper member of FIG. 29.

As illustrated in FIGS. 28 and 29, some embodiments include a flexible cushion 227 (e.g., made of rubber, silicone, foam, or otherwise), that can be positioned on, over, or along some or all of the upper member 264 of the pump body 272. Such a configuration can, for example, reduce the amount of noise from the pump 18B that is emitted into the ambient environment. In some embodiments, the cushion 227 can be configured to reduce, inhibit, or prevent the transmission of vibration from the pump body 272 to other portions of the dispenser (e.g., the reservoir 16B or otherwise) or the surface on which the dispenser rests (e.g., a countertop). In certain embodiments, the cushion 227 can be configured to substantially conform to the shape of the pump body 272. As shown, the cushion can include a void configured to correspond with the opening 163. In certain embodiments, the cushion 227 can include notched projections 227' configured to correspond with the arms 266, which can, e.g., provide clearance for a fastener.

As previously discussed, the pump body 272 can include gears 270, 270', which can be configured to matingly engage. As will be discussed in further detail below, certain embodiments can be configured to enhance the mating engagement of the gears 270, 270', which in turn can provide increased pumping power (e.g., the pressure generated by the mating of the gears 270, 270') and/or increase efficiency (e.g., by reducing the amount of soap that passes between the gears and back into the chamber 273).

Figure 30:
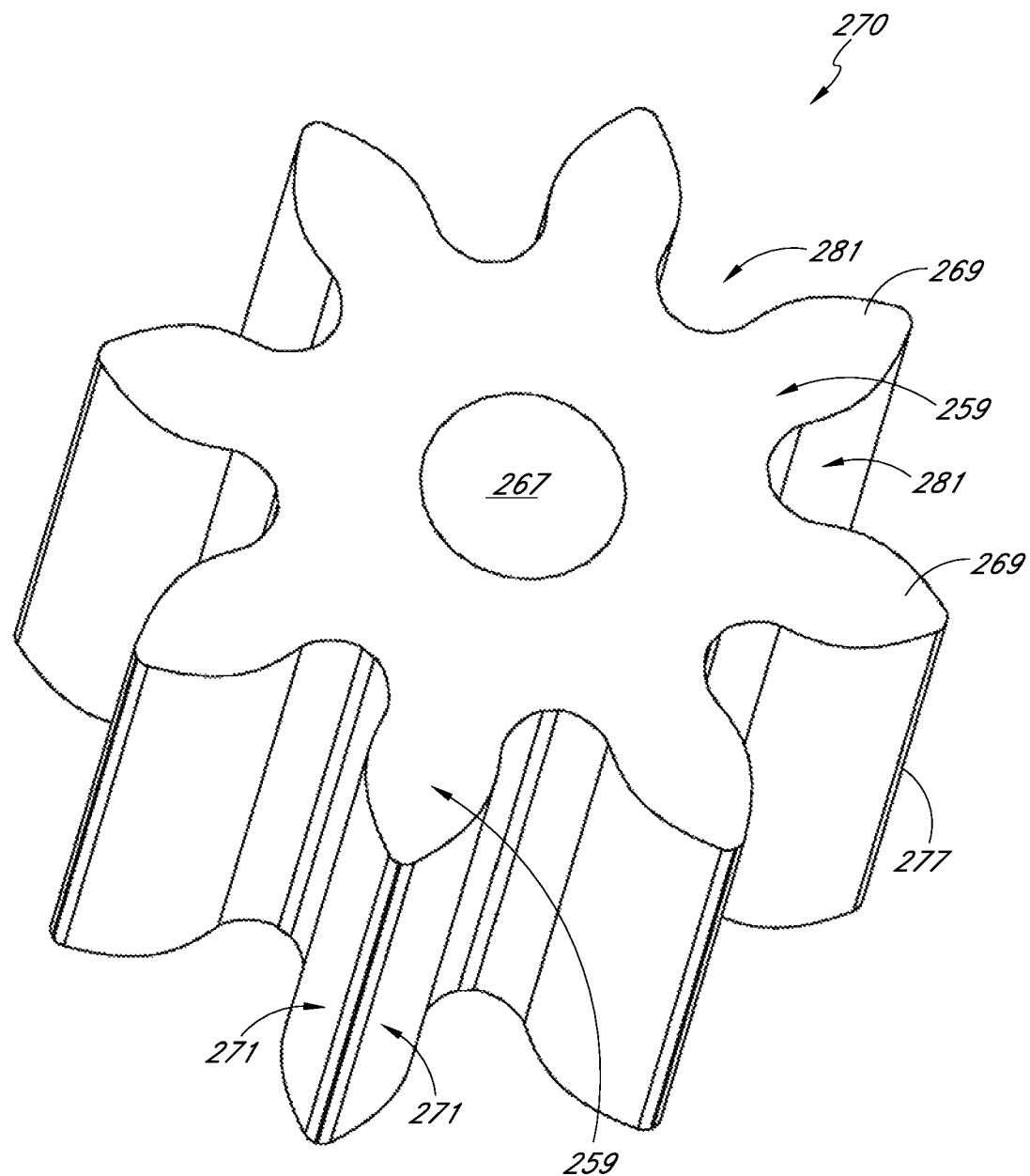
FIG. 30 illustrates a perspective view of one of the gears of FIG. 29.
Figure 31:
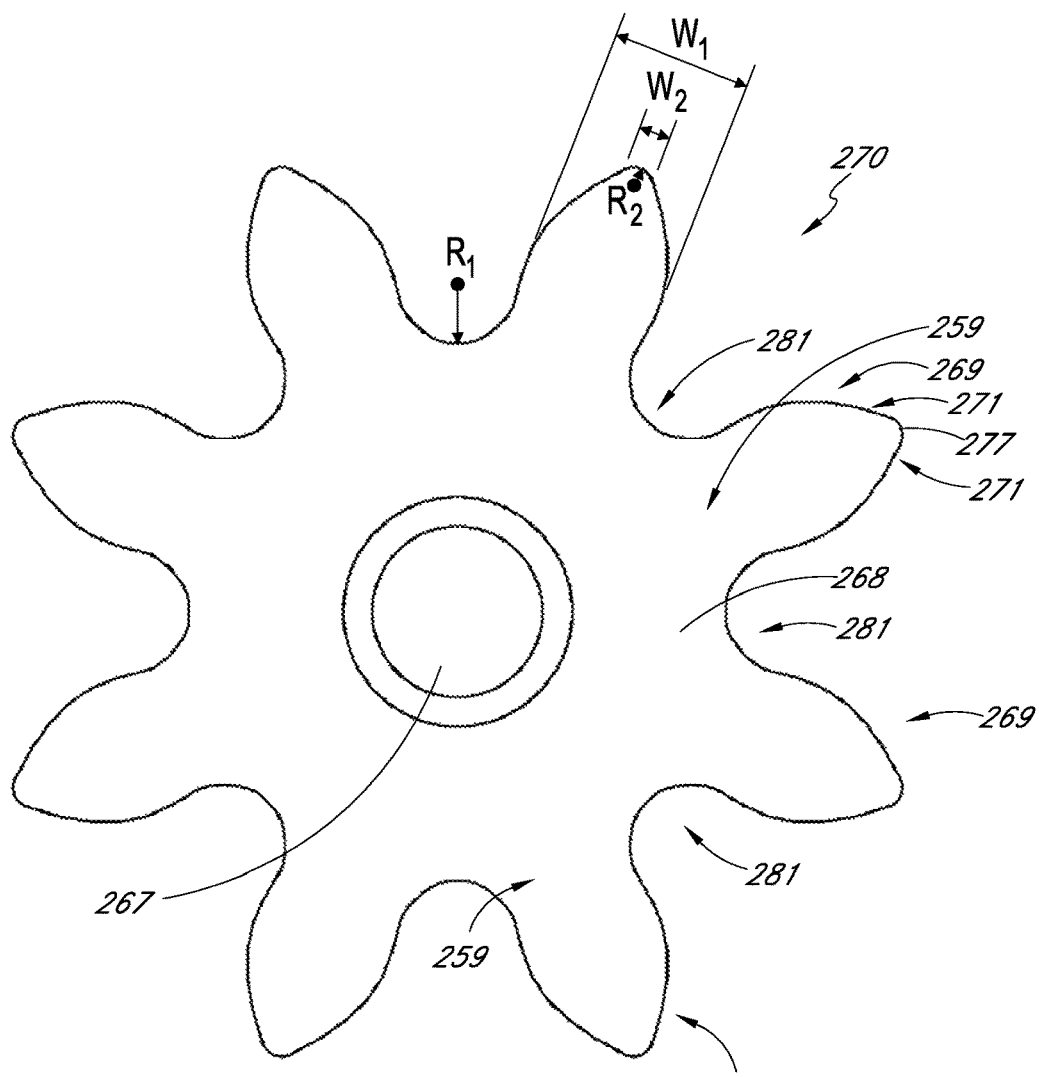
FIG. 31 illustrates a top plan view of the gear of FIG. 30, the gear including teeth.

With regard to FIGS. 30 and 31, an embodiment of the driven gear 270 is illustrated. Typically, the slave gear 270' is substantially similar or identical to the driven gear 270. As shown, the driven gear 270 can include a hole 267 (e.g., to receive the drive shaft 278) and a central portion 268 with a plurality of teeth 269 around the periphery. In certain implementations, adjacent teeth 269 can be separated by a root 281. In some embodiments, the root 281 can have a root radius R1, which can reduce stress concentrations, facilitate mating of the gears 270, or otherwise. In some embodiments, each of the teeth 269 can include a base 259, flanks 271, and a tip 277.

Figure 31A:
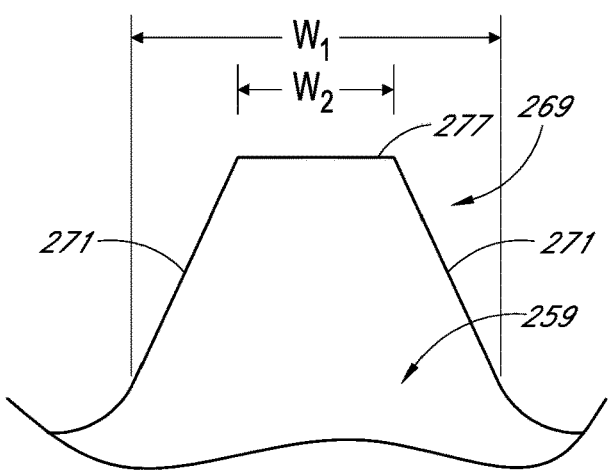
FIG. 31A illustrates a focused view of an alternate configuration of the teeth of the gear of FIG. 31.

In certain embodiments, one or more of the teeth 269 can include a tooth width W1. The tooth width W1 is generally determined at the widest part of the tooth. In some embodiments, such as illustrated in FIG. 31, the tooth width W1 is determined at a location intermediate the base 259 and the tip 277. In some embodiments, such as in the frustoconically shaped tooth shown in FIG. 31A, the first width W1 is determined at or near the base 259.

Each of the teeth 269 can further include a tip width W2. The tip width W2 is generally the distance between the radially-outward end of the flanks 271. In some embodiments, the tip 277 comprises a relatively flat section (see FIGS. 9 and 31A) and the tip width W2 can be about the distance of this flat section. Typically, W2 is less than or equal to about W1. For example, in some embodiments, W2 can be less than or equal to: about ¼ of W1. In some embodiments, the ratio of W2 to W1 can be about 1:5, about 1:7.5, about 1:10, about 1:12.5, about 1:15, about 1:20, about 1:25, about 1:30, about 1:35, about 1:40, values in between, or otherwise.

In some embodiments, such as is shown in FIG. 31, the tip 277 is a section that is pointed (e.g., rounded, chamfered, or the like). In some such embodiments, the tip width W2 can be the distance between the respective locations in which the radially-outward end of the flank 271 terminates and the radius, chamfer, or the like begins. For example, in embodiments that have a tip 277 with a tip radius R2, the tip width W2 is typically about twice the tip radius R2.

In some embodiments, the tip radius R2 of the tip 277 can be less than the root radius R1. Such a configuration can, for example, provide a pointed tip 277 and facilitate engagement of the teeth 269 during operation of the pump 18B. In some embodiments, the tip radius R2 can be less than or equal to: about ½ of the root radius R1, about ⅓ of the root radius R1, about ¼ of the root radius R1, about ⅛ of the root radius R1, about 1/10 of the root radius R1, about 1/16 of the root radius R1, about 1/20 of the root radius R1, about 1/30 of the root radius R1, about 1/40 of the root radius R1, about 1/50 of the root radius R1, values in between, or otherwise.

In certain embodiments, the tip 277 forms a substantially sharp or pointed peak. For example, in some embodiments, a slanted left side of a tooth and a generally oppositely slanted right side of the tooth can each converge at approximately the same point on the end of the tooth. In some embodiments, the tip radius R2 can be less than or equal to: about 0.5 mm, about 0.4 mm, about 0.3 mm, about 0.2 mm, about 0.1 mm, about 0.05 mm, about zero, values in between, or otherwise. Certain conventional wisdom discouraged the use of gears having substantially sharp and/or pointed tips because, for example, such tips could be prone to breaking. Further, substantially sharp and/or pointed tips could be thought to wear more quickly than tips that are flattened.

Figure 32:
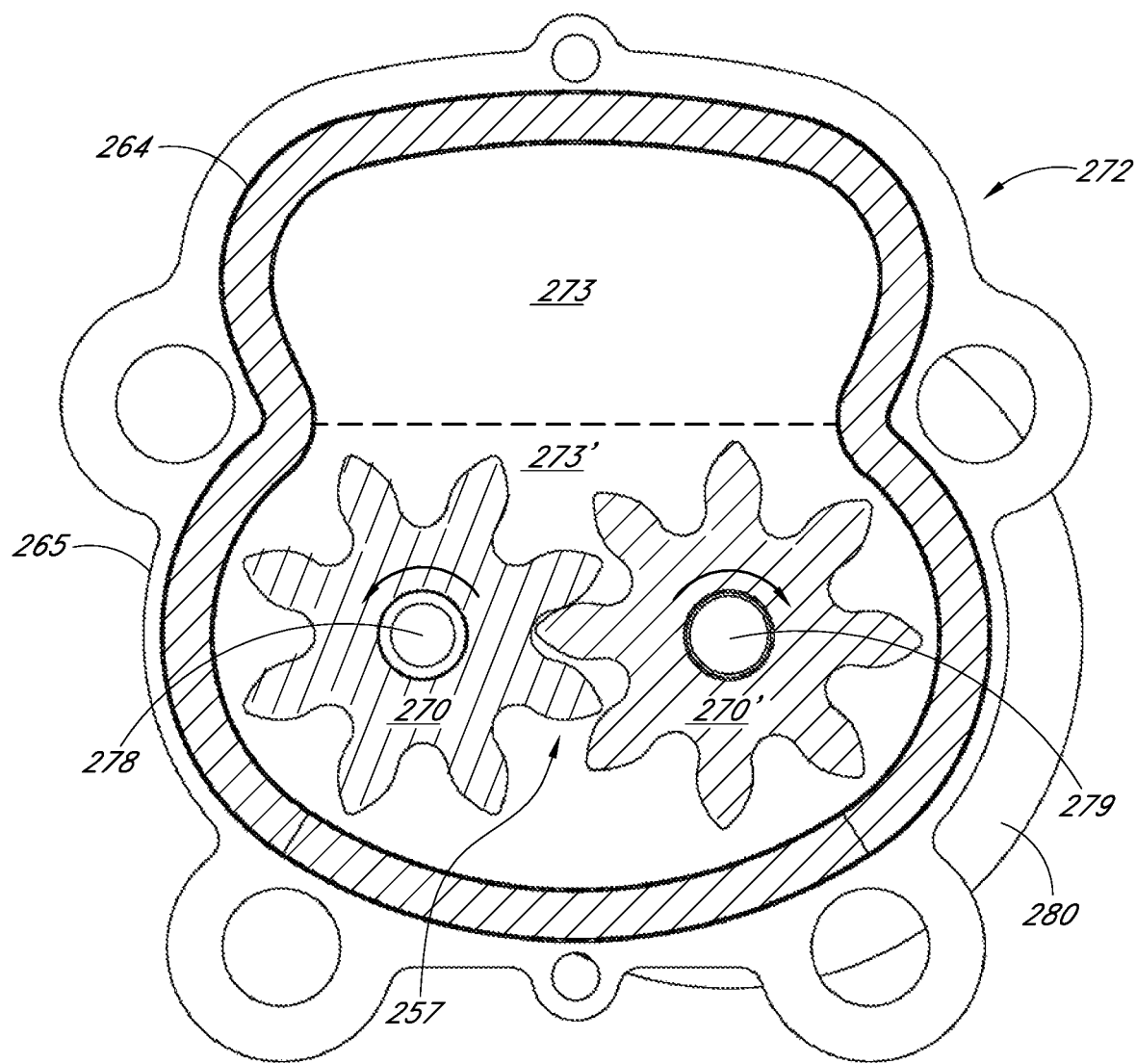
FIG. 32 illustrates a top cross-sectional view of the pump of FIG. 27, along the line 32-32.

However, employing gears with substantially sharp and/or pointed tips in a soap dispenser can provide substantial benefits. For example, the tip 277 being pointed can, for example, increase the pumping ability (e.g., the pressure generated by the mating of the gears 270, 270') of the pump 18B. As shown in FIG. 32, the gears 270, 270' of the pump 18B can be configured to rotate into contact with, or very close to, one another. Typically, as the gears engage, the volume between the tip 277 of one gear and the root 281 of the other gear decreases. Such a decrease in volume can result in an increased pressure area 257, which in turn can encourage fluid (e.g., soap) to flow toward the outlet 262. In general, the more fully the teeth 269 of the gears 270, 270' engage each other, the greater the increase in pressure in the area 257. In certain embodiments, gears with teeth 269 having pointed tips 277 more fully engage (e.g., have a greater percent of contact with) the mating teeth compared to, for example, gears with teeth 269 having flat tips 277. For example, certain embodiments of the pointed tips 277 project further toward the root 281 than the flat tips 277. At least due to such increased engagement, certain embodiments of the gears 270, 270' having teeth 269 with pointed tip 277 can facilitate increasing the pressure in the increased pressure area 257.

In some instances, a pointed tip 277 can increase the efficiency of the pump 18B. In embodiments having a flat tip 277, soap can be trapped or otherwise disposed between the flat tip 277 of one gear and the root 281 of the mating gear, which can result in soap being carried through the mating portion of the gears 270, 270' and back into the chamber 273, rather than the soap being expelled out the pump outlet 262. In contrast, a pointed tip 277 can allow the gears 270, 270' to more fully engage. For example, the pointed tip 277 can reduce the volume available for soap to be present between the tip 277 of one gear and the root 281 of the mating gear tip 277. Thus, the likelihood and/or the volume of soap carried through the mating portion of the gears 270, 270' and back into the chamber 273 can be reduced, thereby increasing the efficiency of the pump 18B.

As previously noted, the pump body 272 can include the chamber 273, which can be in communication with inlet 263. Further, in some embodiments, the pump body 272 can include the second chamber 273'. The second chamber 273' can house the gears 270, 270' and can be in communication with the inlet 262, outlet 262, and/or chamber 273. As shown in FIG. 32, in certain embodiments, together the chambers 273, 273' form an overall figure-eight shape. Such a configuration can, for example, provide space for staging soap in the pump body 272 and space for housing and operation of the gears. In some embodiments, the chamber 273 can be smaller than the second chamber 273'. In certain implementations, the chamber 273 can hold less soap than the second chamber 273'. In some embodiments, the chamber 273 can hold about as much soap as the second chamber 273'.

In some embodiments, the passage between the chamber 273 and the second chamber 273' can be configured such that the liquid soap L can readily pass therethrough. For example, in some variants, the passage between the chamber 273 and the second chamber 273' can be configured such that the weight of liquid soap L in the chamber 273 overcomes the surface tension of the liquid soap L and thus moves the soap into a portion of the second chamber 273'. Accordingly, the passage can be configured so as to reduce or avoid the chance of surface tension of the soap inhibiting the soap from reaching the gears 270, 270'. In certain embodiments, the width of the passage (indicated by the dashed line in FIG. 32) can be greater than or equal to the first dimension 293 and/or the second dimension 294 of the opening 263.

With reference to FIGS. 33-36, another embodiment of a dispenser is identified generally by the reference numeral 10D. The dispenser 10D can include a housing 12D, which in turn can include a lower portion 100D, an upper portion 110D, reservoir 16D, and a nozzle 28D. Some of the components of the dispenser 10D can be the same, similar, or identical to the corresponding components of the dispensers discussed above. Some of these corresponding components are identified with the same reference numeral, except that a "D" has been added thereto and/or has replaced the "A," "B," or "C."

In certain embodiments, the dispenser 10D has a sensor device 32D. The sensor 32D can be configured to emit a trigger signal used to control operation of a motor or an actuator. In some embodiments, the sensor 32D can be an interrupt-type sensor. The sensor 32D can be triggered when a body part is disposed in the path of a beam of light 44D or some other mechanism interrupts the light beam 44D. In some embodiments, the sensor 32D can be a proximity sensor or a reflective type sensor that is configured to send a different signal to the ECU based on the distance between an object and the sensor. For the purposes of simplifying the examples described below, a hand H is used to trigger the sensor 32D, but any number of other objects or mechanisms could be used to trigger the sensor 32D.

The sensor 32D can be positioned along any portion of the housing surface or the sensor can be a separate component. As shown in FIGS. 33-36, the sensor 32D can be on the upper portion 110D of the soap dispenser. The sensor 32D can be positioned along a surface that is generally transverse to the longitudinal axis of the soap dispenser. The sensor 32D can be positioned near the nozzle 28D. The sensor 32D can be positioned such that the sensor detects the hand H when the hand is positioned under the nozzle 28D.

In some embodiments, the dispenser 10D can include one or more sensing regions 41D to trigger one or more sensor devices 32D. If a signal is detected in a sensing region, the sensor can trigger the dispenser to perform a specific operation based on the particular signal. For example, the specific operation may vary based on the distance between a hand H and the sensor 32D, and/or other parameters such as angle, duration, repetition, path of motion, and/or speed of motion. All descriptions of changing dispensing performance based on sensing regions included herein can be applied for use with these or other parameters besides or in addition to sensing regions.

The one or more sensing regions 41D may take on any shape, width, height, or length. The one or more sensing regions 41D can be positioned in any number of configurations in relation to each other and the dispenser 10D and are not limited to the regions depicted in FIGS. 33-36. In some embodiments, a first sensing region 41Da can be positioned adjacent to or near a second sensing region 41Db; while in some embodiments, the first sensing region 41Da is not positioned adjacent to or near the second sensing region 41Db. The first and second sensing regions 41Da, 41Db can be disposed in proximity to any portion of the housing 12D. In some embodiments, one or more sensing regions 41D are positioned in an area that is between the nozzle 28D and the lower portion 100D, while in some embodiments, one or more sensing regions 41D are positioned in an area that is above the upper portion 110D of the dispenser 10D.

The one or more sensing regions 41D can be used in any type of configuration that allows the user to control an aspect of the operation of the dispenser 10D. For example, the one or more sensing regions 41D can be used to trigger the dispenser 10D to dispense different volumes of liquid L, activate different duty cycle characteristics, dispense at different speeds, operate for varying durations of time, or other appropriate parameters. The examples below will be explained in the context of a dispenser 10D configured to dispense different volumes of liquid, but the dispenser can be configured to dispense liquid with one or more of any of the outputs described above.

These features allow the same touch-free dispenser to be used by different users who may desire different outputs or by the same user for different purposes without requiring direct physical contact between the hands and a physical pump switch or other adjustment. For example, an adult and a child can use the same dispenser to obtain a volume of liquid soap that is proportional to their hand size or the same person can adjust the volume of soap dispensed depending on how dirty his/her hands are. A user can also use the same touch-free soap dispenser to wash his/her hands or wash a kitchen sink full of dishes.

Figure 33:
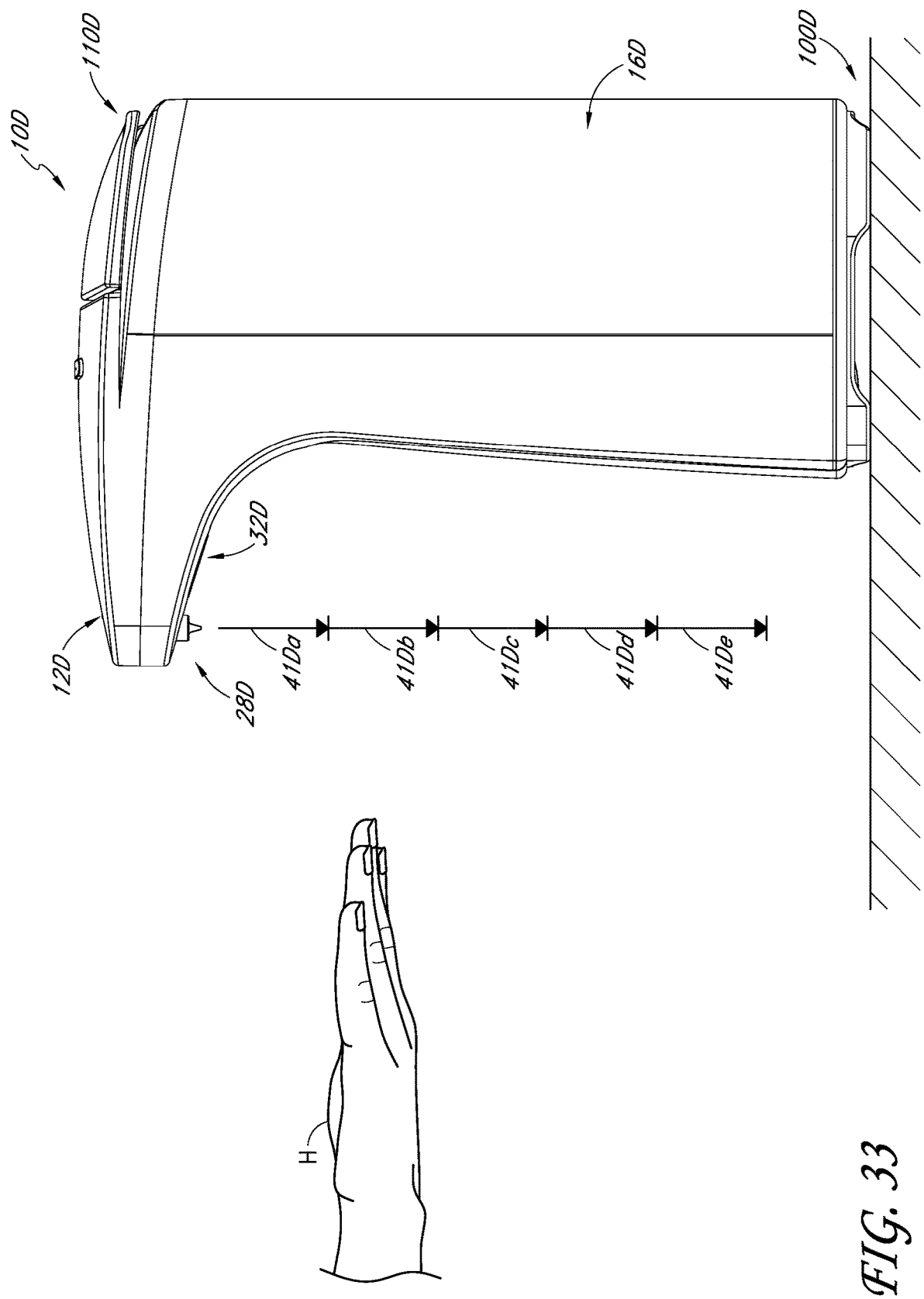
FIGS. 33-36 illustrate another embodiment of a soap dispenser, the dispenser including sensing regions.
Figure 34:
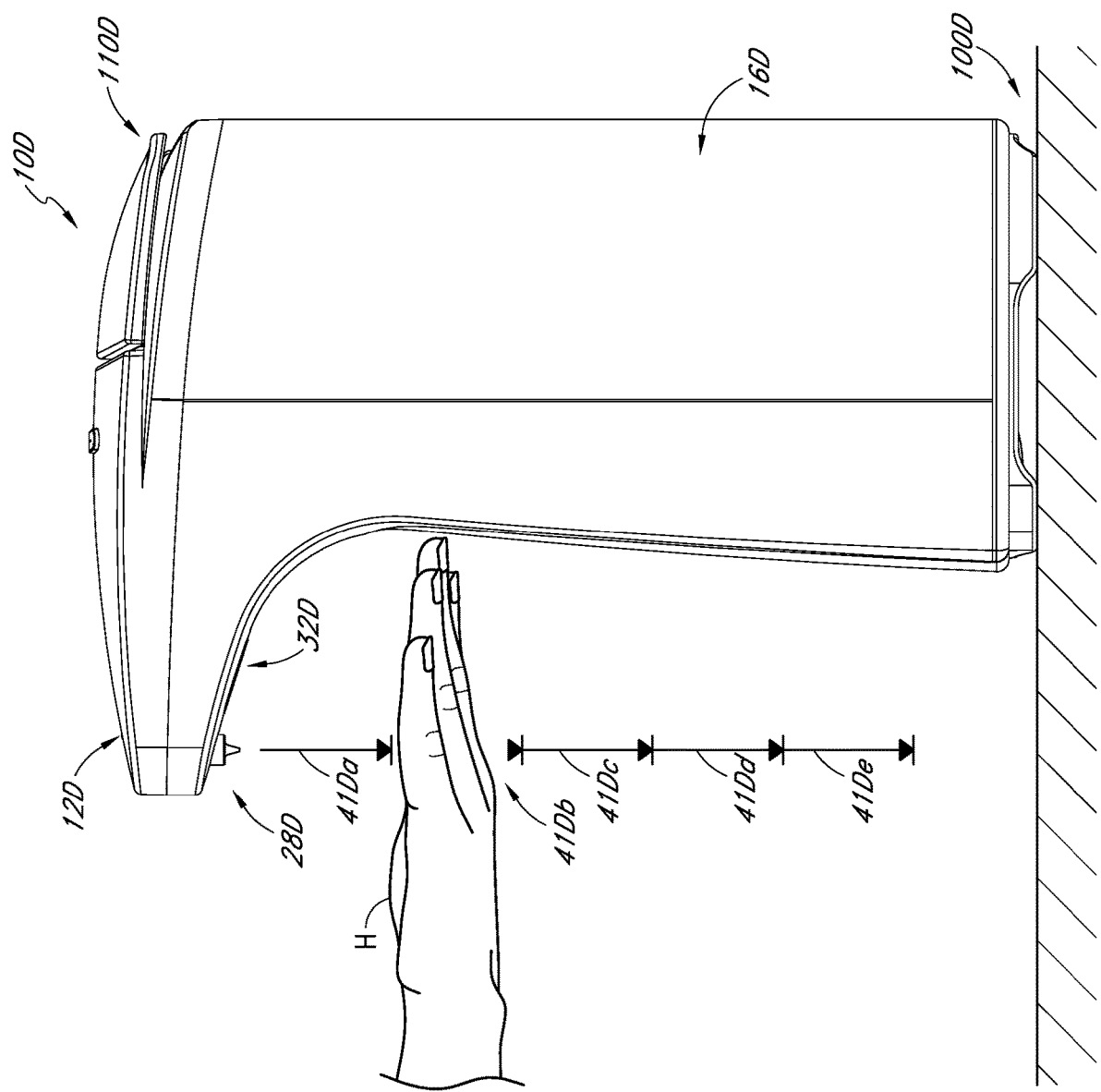
Figure 35:
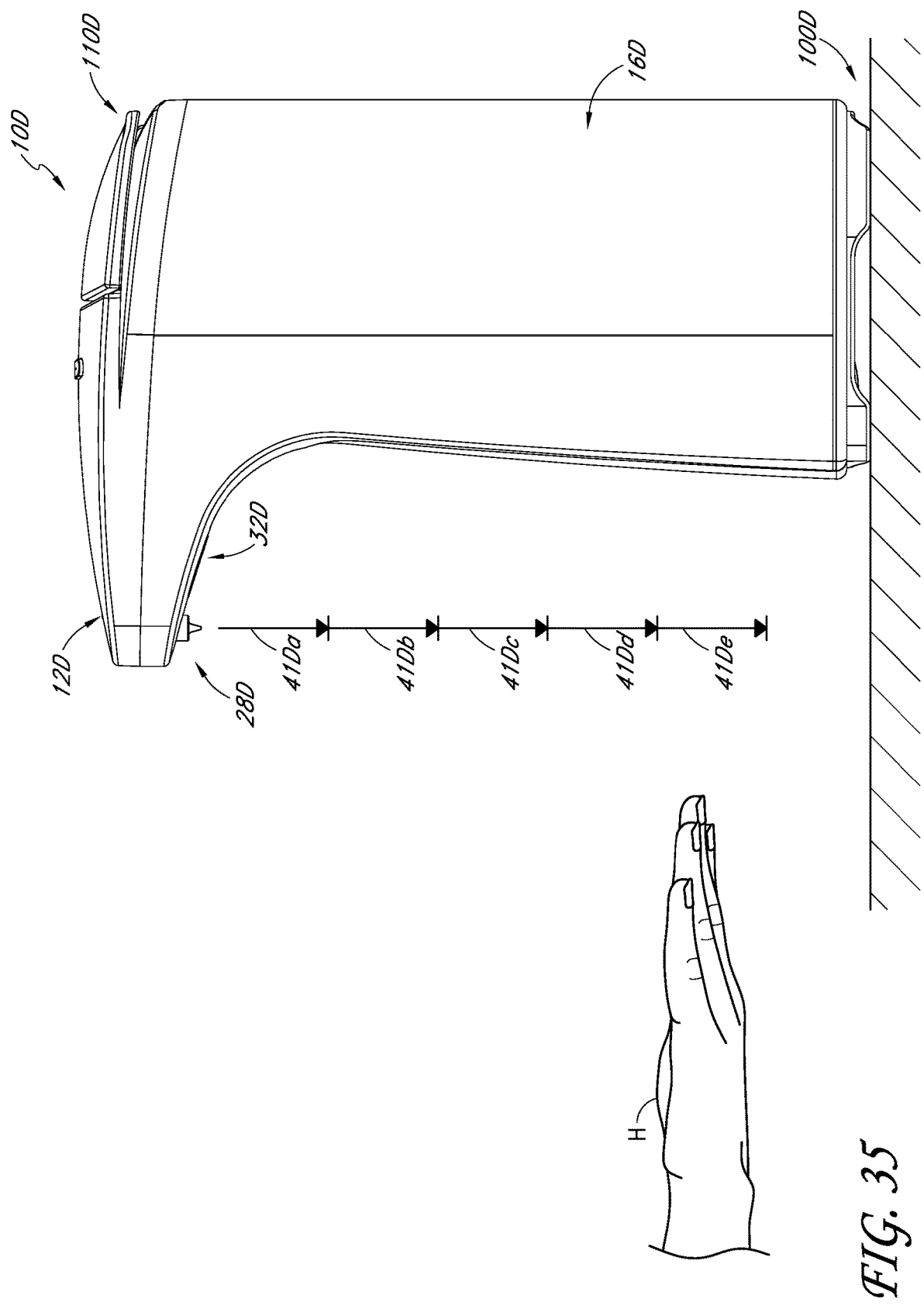
Figure 36:
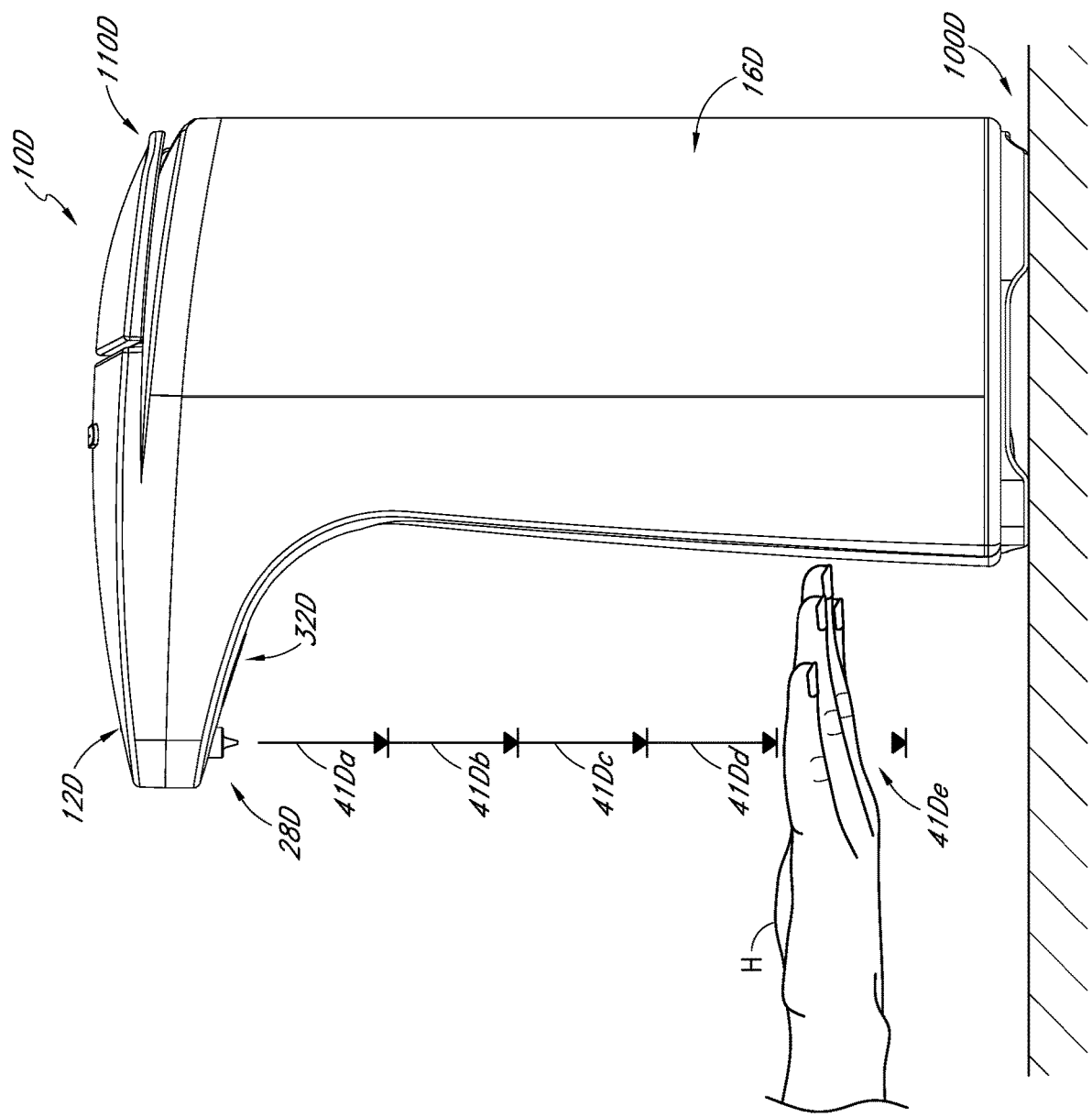

In several embodiments, the one or more sensing regions 41D can be configured to allow a user to select different volumes of liquid L to be dispensed from the nozzle 28D during each dispensation cycle. As shown in FIGS. 33 and 35, no liquid is dispensed when no signal is detected within any of the sensing regions 41D. On the other hand, in FIGS. 34 and 36, a predetermined volume of liquid L is dispensed when a signal is detected within one of the sensing regions 41D. As illustrated in FIG. 34, when a signal is detected in a sensing region 41Db, the sensor 32D triggers the dispenser 10D to dispense a first predetermined volume of liquid L1 from the nozzle 28D. In FIG. 36, when a signal is detected in a different sensing region 41De, the sensor triggers the dispenser to dispense a second predetermined volume of liquid L2 from the nozzle 28D that is different from the first volume of liquid L1.

In some embodiments, when a signal indicating that an object is disposed in a first region (e.g., relative to the sensor) is received, a first volume of liquid dispensed. In some embodiments, when a signal indicating that an object is disposed in a second region (e.g., further from the sensor than the first region) is received, a second volume of liquid is dispensed. In certain embodiments, the second volume is larger than the first volume. One or more additional sensing regions and liquid volumes can be used. In certain implementations, the volume of liquid dispensed is related (e.g., linearly, exponentially, or otherwise) to the distance from the sensor to the object. For example, in certain embodiments, the volume of liquid dispensed increases as the distance from the sensor to the object increases. In some embodiments, the volume of liquid dispensed decreases as the distance from the sensor to the object increases.

In some embodiments, the one or more sensing regions are positioned in a manner that corresponds with natural human conduct or instinct. For example, a child may be more inclined to hold his/her hands closer to the nozzle, so, in some embodiments, a sensing region positioned closer to the nozzle would dispense a smaller volume of liquid than a sensing region positioned further away from the nozzle.

In some embodiments, the volume of dispensed liquid does not depend solely or at all on the length of time that the object remains in the sensing region. The dispensed volumes can differ depending on the location of the object (e.g., hand) in a different sensing region, even if certain other parameters are the same (such as the length of time that the object is sensed in a region).

In some embodiments, the dispenser 10D includes an algorithm configured to send a command to trigger the dispenser to dispense different volumes of liquid based on the detected signal. For example, the algorithm can send a command to trigger the dispenser to dispense a first pre-determined volume of liquid L1 if a signal is detected in a first sensing region 41Da, or the algorithm can send a command to trigger the dispenser to dispense a second pre-determined volume of liquid L2 if a signal is detected in the second sensing region 41Db.

In some embodiments, the algorithm can incorporate a delay that deactivates the sensor or otherwise prevents the dispenser from dispensing liquid immediately after the dispenser dispenses liquid. The delay may be may be for 1 second, 5 seconds, or any other amount of time. The delay helps prevent the user from unintentionally triggering the dispenser. For example, after the user triggers the dispenser to dispense liquid, the algorithm commands the sensor to deactivate for the delay period. During the delay period, the dispenser will not dispense liquid even if an object is in a sensing region during the delay period. If the user places his/her hand in a sensing region after the delay period, the dispenser will dispense liquid again.

In some embodiments, the one or more sensing regions 41D can be used for allowing a user to select different modes of dispensing liquid L. When a signal is detected in the first sensing region 41Da, the sensor 32D triggers the dispenser 10D to dispense a first predetermined volume of liquid L1 in normal mode. In normal mode, the dispenser 10D is configured to dispense a pre-determined volume of liquid L1 suitable for washing a user's hands. When a signal is detected in the second sensing region 41Db, the sensor 32D triggers the dispenser 10D to dispense liquid L in extended chore mode. In extended chore mode, the dispenser 10D is configured to continuously dispense and/or an increased amount (e.g., a maximum predetermined amount of liquid). This may be helpful if, for example, the user wishes to fill a sink full of soapy water for washing dishes. In some embodiments, the volume of dispensed liquid does not depend solely or at all on the length of time that the object remains in the sensing region. In some embodiments, the dispenser 10D may continue to dispense liquid as long as a hand is detected in second sensing region 41Db.

In some embodiments, the dispenser 10D may have a first and second sensing regions configured to operate in normal mode, and a third sensor region configured to operate in extended chore mode.

In some embodiments, the one or more sensing regions can be positioned in a manner that corresponds with natural human conduct or instinct. For example, a user may not want to place his/her hand underneath the nozzle to activate the extended chore mode if the user does not want soap on his/her hands. Thus, the sensing region associated with extended chore mode may be positioned above the upper portion of the dispenser 10D or in proximity to the housing in an area that is not in the path of dispensed liquid.

In some embodiments, the dispenser 10D includes an algorithm configured to send a command to trigger the dispenser to dispense liquid in normal mode, extended chore mode, or any other mode. For example, the algorithm can send a command to trigger the dispenser to dispense a liquid in normal mode if a signal is detected in a first sensing region 41Da, or the algorithm can send a command to trigger the dispenser to dispense a liquid in extended chore mode if a signal is detected in the second sensing region 41Db.

In some embodiments, the one or more sensing regions 41D correspond with different types of dispensing liquid. For example, when a signal is detecting in the first sensing region 41Da, the sensor 32D triggers the dispenser 10D to dispense a first type of liquid, such as soap. When a signal is detected in the second sensing region 41Db, the sensor 32D triggers the dispenser 10D to dispense a second type of liquid, such as lotion.

In some embodiments, the dispenser 10D includes an algorithm configured to send a command to trigger the dispenser to dispense different types of liquid based on the detected signal. For example, the algorithm can send a command to trigger the dispenser to dispense a first type of liquid, such as soap, if a signal is detected in a first sensing region 41Da, or the algorithm can send a command to trigger the dispenser to dispense a second type of liquid, such as lotion, if a signal is detected in the second sensing region 41Db.

In some embodiments, the dispenser 10D only comprises one sensing region. The dispenser can be configured to dispense varying volumes of liquid, based on the signal detected in the sensing region. For example, the dispenser can dispense a first amount of liquid if the hand is positioned at a first angle in the sensing region, and the dispenser can dispense a second amount of liquid if the hand is positioned at a second angle in the sensing region. In another example, the dispenser can dispense a first amount of liquid if the hand performs a first motion in the sensing region, and the dispenser can dispense a second amount of liquid if the hand performs a second motion in the sensing region.

In some embodiments, the dispenser 10D comprises a first sensing region and a second sensing region, and the dispenser is configured to dispense a predetermined volume of liquid, depending on the angle of the hand or the hand motion in a first sensing region or a second sensing region.

In some embodiments, the dispenser 10D may comprise a mechanism to calibrate the different sensing regions with different output characteristics as desired by the user. For example, a user could configure a first sensing region to correspond with a first user-selected volume of liquid L1 and configure a second sensing region to correspond with a second user-selected volume of liquid L2. In another example, the user could adjust the size (e.g., width or height) of the sensing region. The user could designate a first user-selected sensing region to correspond with a first pre-determined volume of liquid L1 and designate a second user-selected sensing region to correspond with a second pre-determined volume of liquid L2. This calibration mode can be triggered by pressing a button, activating a sensor, or any other appropriate mechanisms.

Figure 37:
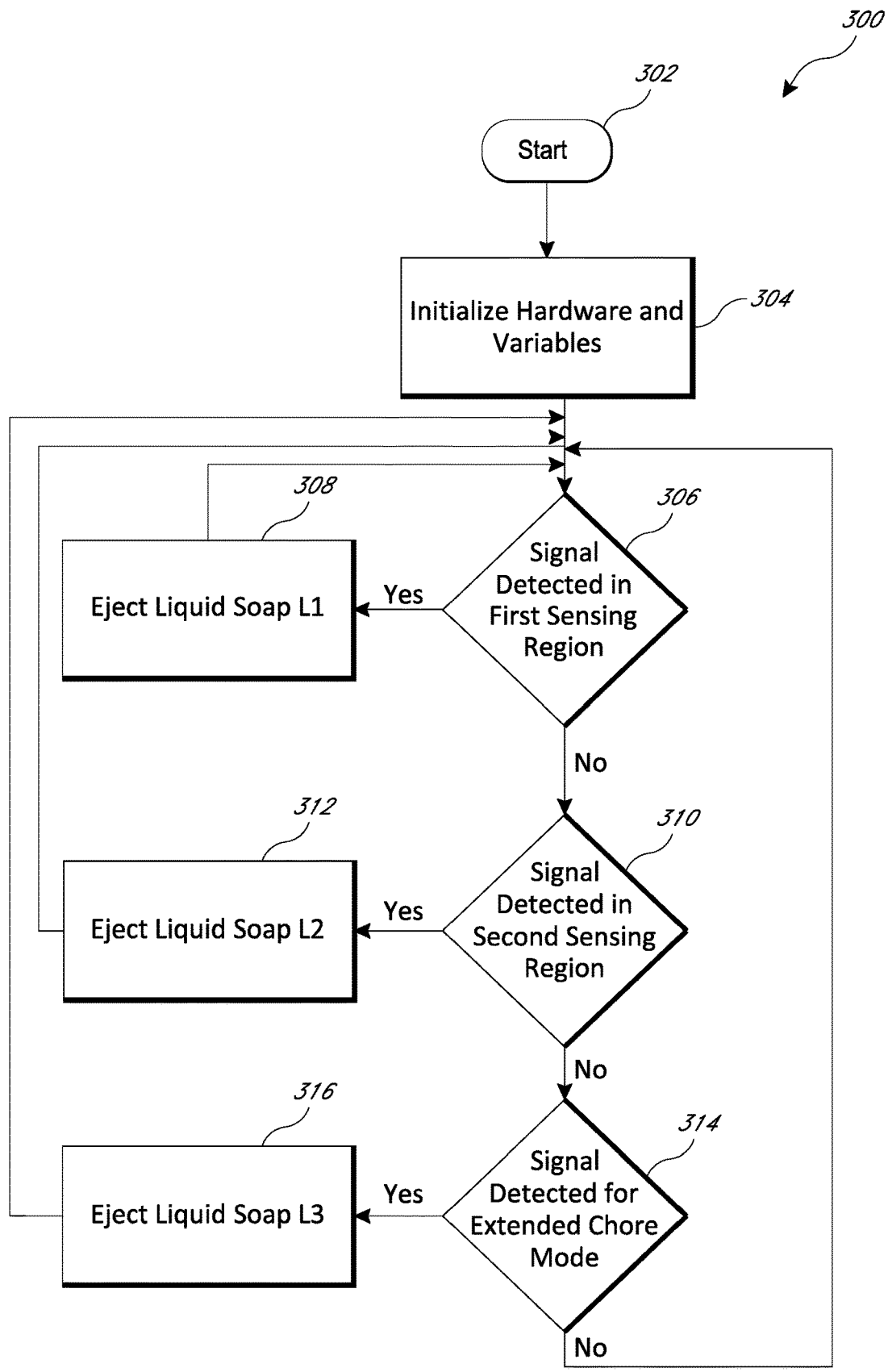
FIG. 37 is a schematic block diagram of an example of a soap dispenser control algorithm.

In several embodiments, the dispenser 10D includes an algorithm configured to send commands to the ECU when a signal indicates that an object is disposed in a sensing region. An example of such an algorithm is illustrated FIG. 37. The command may vary based on the signal received.

The signal may be dependent on the distance between an object and the sensor, and/or other parameters such as angle, duration, repetition, path of motion, and/or speed of motion. In some embodiments, the algorithm can include a module 300 configured to dispense different volumes of liquid L. The module 300 may be configured to dispense different types of liquid, vary the duty cycle, or operate for varying durations.

Module 300 begins at start block 302, and in operation block 304, the module 300 initializes hardware and variables. In decision block 306, the module 300 determines whether a signal has been received from a first sensing region. If a signal is detected in the first sensing region, the module 300 commands the dispenser to dispense a first amount of liquid L1 as shown in operation block 308.

If a signal is not detected in a first sensing region, the module 300 determines whether a signal has been received from a second sensing region in decision block 310. If a signal is detected in a second sensing region, the module 300 commands the dispenser to dispense a second amount of liquid L2 as shown in operation block 312.

If a signal is not detected in a second sensing region, the module 300 determines whether a signal has been detected for extended chore mode in decision block 314. In extended chore mode, the dispenser configured to dispense a predetermined maximum or at least an increased amount of liquid L3. In some implementations, the amount dispensed during a dispensation cycle is bounded by an upper dispensation limit, such as greater than or equal to about 20 ml. The module 300 does not need to include all of the blocks described above, or it may include more or different decision blocks, such as to account for more sensing regions or other parameters to detect.

Figure 38:
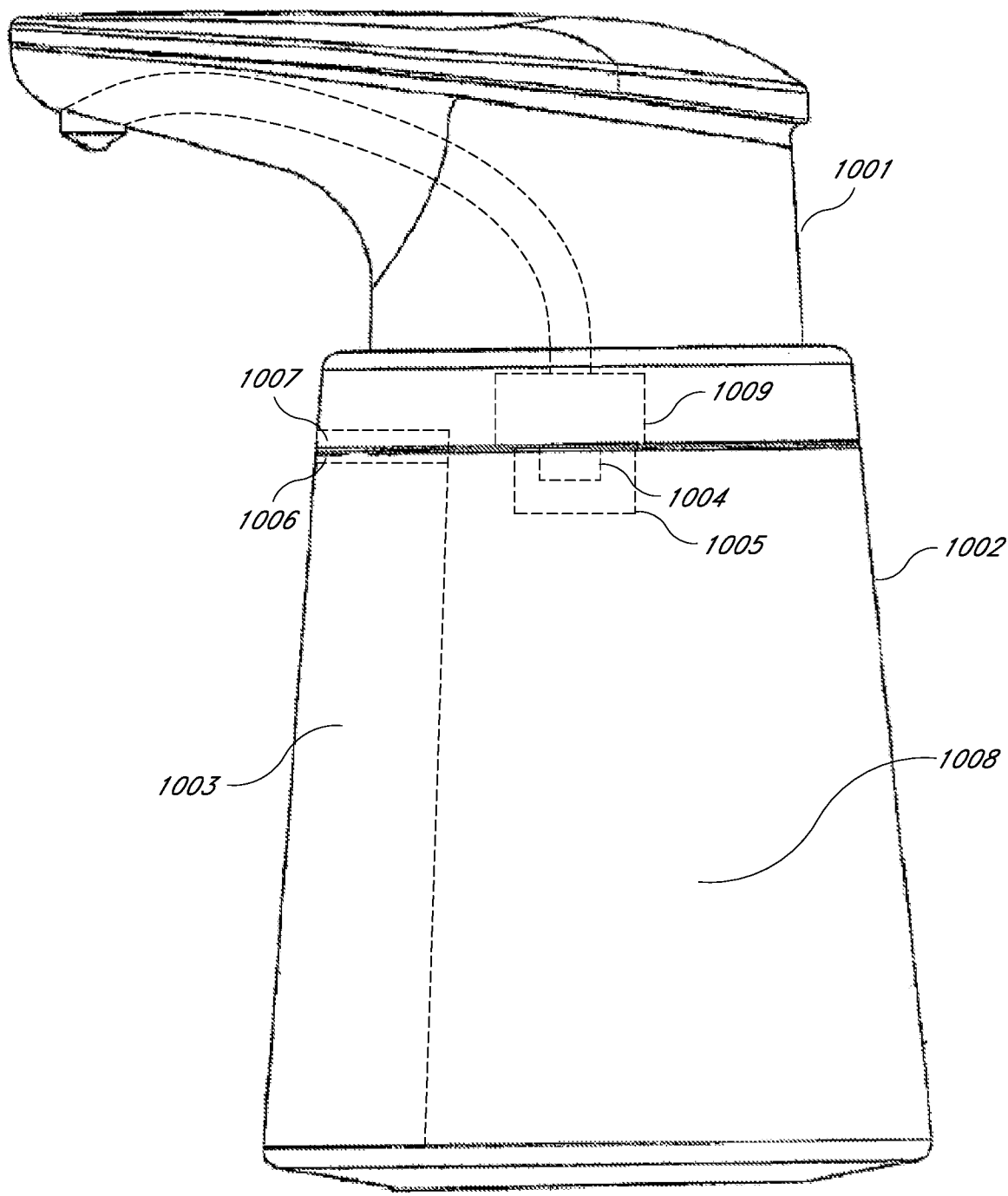
FIG. 38 illustrates another embodiment of a soap dispenser, the dispenser including a disposable soap cartridge.

FIG. 38 illustrates yet another embodiment of the previously discussed electrically operated soap dispenser 10. In the illustrated embodiment, the electronically operated soap dispenser 10E includes a pump unit 1001 and a cartridge 1002. Some of the components of the dispenser 10E can be the same, similar, or identical to the corresponding components of any of the other dispensers discussed above. As discussed previously with regard to the dispenser 10 the pump unit 1001 can include a pump, fluid dispensing valve, proximity sensor, and electronic components. The cartridge 1002 can be configured to be removable from the pump unit 1001. In some embodiments, the cartridge 1002 can include a reservoir 1008 that contains soap to be dispensed by the pump unit 1001. In some embodiments, the cartridge 1002 can include a reservoir 1008 and a power source 1003, wherein the power source 1003 is configured to power the pump unit 1001.

In the illustrated embodiment of FIG. 38, the cartridge 1002 can be configured to engage with a bottom portion of the pump unit 1001. However, other configurations can be used, such as the cartridge 1002 configured to engage with a top or a side portion of the pump unit 1001. The pump unit 1001 and the cartridge 1002 can include removably locking features (not illustrated) so that the cartridge 1002 removably engages with the pump unit 1001.

In some embodiments, the pump unit 1001 can include a pump 1009 and a soap inlet 1004, wherein the soap inlet 1004 can be configured to flow soap to the pump 1009. In certain embodiments, the soap inlet 1004 can protrude out to engage with a valve 1005 of the cartridge 1002 so that the soap inlet 1004 and the valve 1005 are configured to be in fluid communications. The valve 1005 can be a one-way valve so that the soap is designed to flow to the pump unit 1001 and not leak in other directions. Of course, other engagement configurations can be used where the soap inlet 1004 is a recess and the valve 1005 protrudes.

In some embodiments, the valve 1005 can include a seal that initially seals the valve 1005 of the cartridge 1002. In some embodiments, the seal is punctured by the soap inlet 1004 when the cartridge 1002 engages the pump unit 1001 so that the soap inlet 1004 and the valve 1005 can be in fluid communication. The seal can be incorporated with the valve 1005. The engagement of the cartridge 1002 and the pump unit 1001 can be guided so that the soap inlet 1004 and the valve 1005 are generally aligned and the seal is easily broken.

In some embodiments, the cartridge 1002 can include the reservoir 1008 for soap and the power source 1003. The power source 1003 can be a disposable power source, such as a battery. The power source 1003 can include electrical contacts 1006 that engage with pump unit electrical contacts 1007 to complete a circuit and provide power to the pump unit 1001. The electrical contacts 1006 and 1007 can be traditional battery contacts such as electrically conducting springs, plates, etc. The pump unit 1001 can be powered off when the cartridge 1002 is disengaged.

In some embodiments, the amount of soap and the stored power within the power source 1003 can be designed to be exhausted at about the same time. The time to exhaust the soap and the power source 1003 can be from about 3 months to about 12 months during normal use (operations of the about 10 times a day) of the dispenser 10E. In some embodiments, the amount of soap dispensed by the dispenser 10E is fixed so that the number of dispenses of soap from the reservoir 1008 is known. The amount of electric capacity within the power source 1003 can then be configured to be exhausted at about the same time as the amount of soap in the reservoir 1008. In some embodiments, the amount of soap dispensed can be varied and the amount of soap and the power within the power source 1003 can be exhausted at different times. The user replaces the cartridge 1002 when either the soap or power source 1003 (or both) is exhausted. The simple replacement of the cartridge 1002 allows the user from having to manually replenish the soap or having to replace the batteries in the dispenser 10E, which occur most likely at different times.

Figure 42:
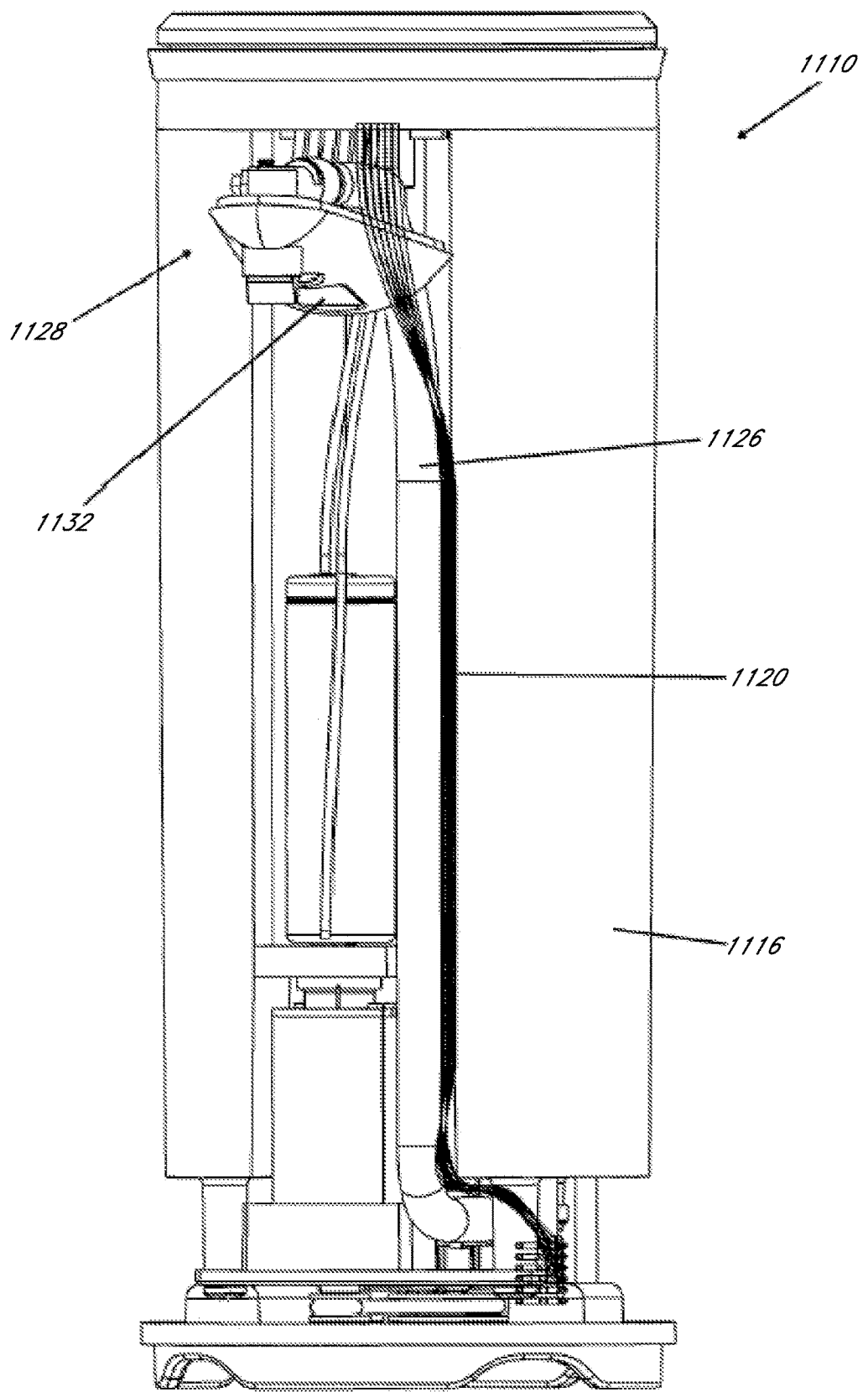
FIG. 42 illustrates a front view of the embodiment of FIG. 39 with a portion of the housing removed.

With reference to FIGS. 39-44, another embodiment of a dispenser is identified generally by the reference numeral 1110. The dispenser 1100 can include a housing portion 1112, which in turn can include a reservoir 1116, a pump 1118, and a nozzle 1128. In some embodiments, a sensor 1132 is positioned on the housing portion, for example, near the nozzle 1128 as shown in FIG. 42 or any other position described herein. Some of the components of the dispenser 1110 can be the same, similar, or identical to the corresponding components of the dispensers discussed above.

Figure 39:
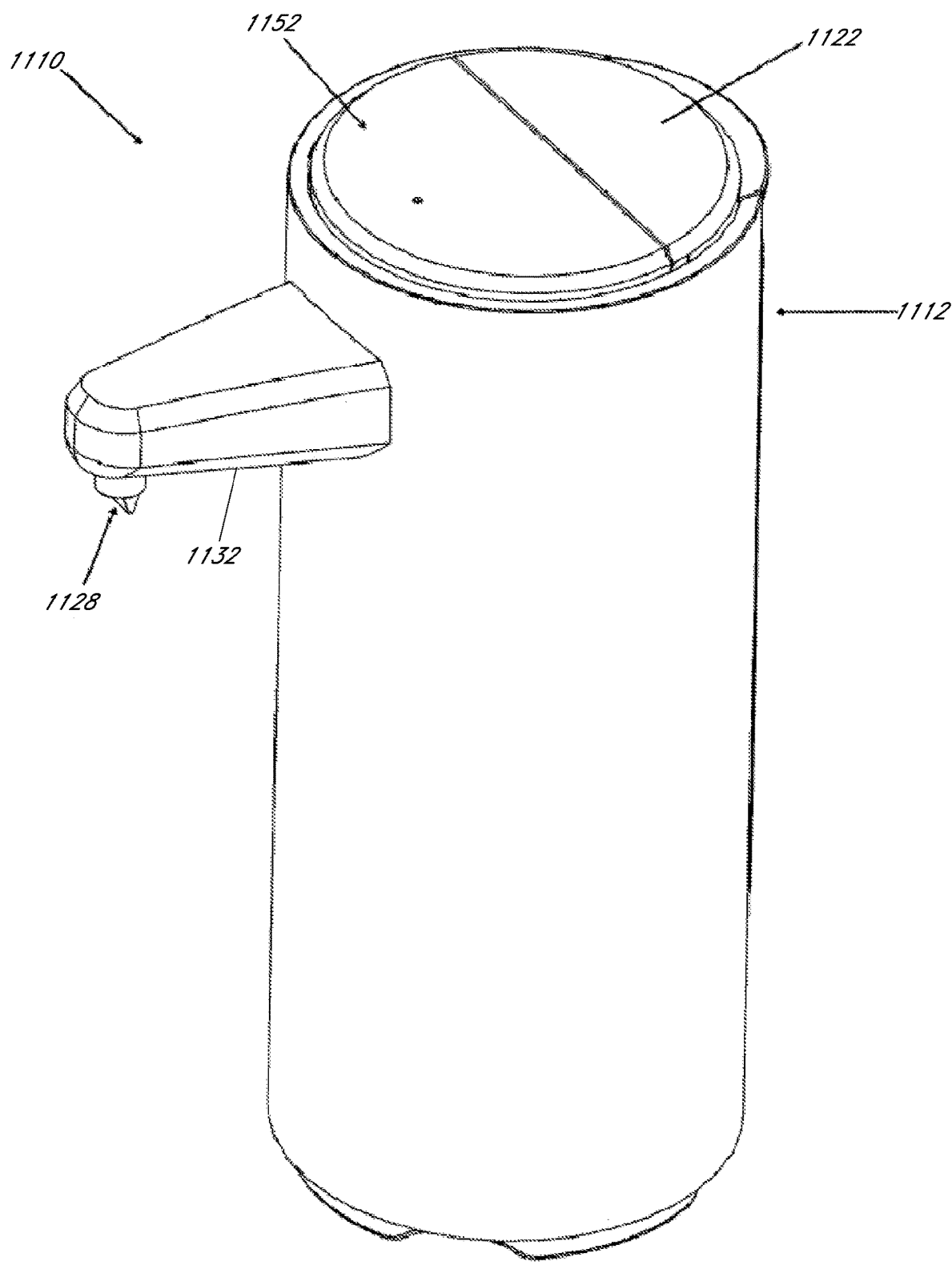
FIG. 39 illustrates an embodiment of a soap dispenser, including a lid.
Figure 43:
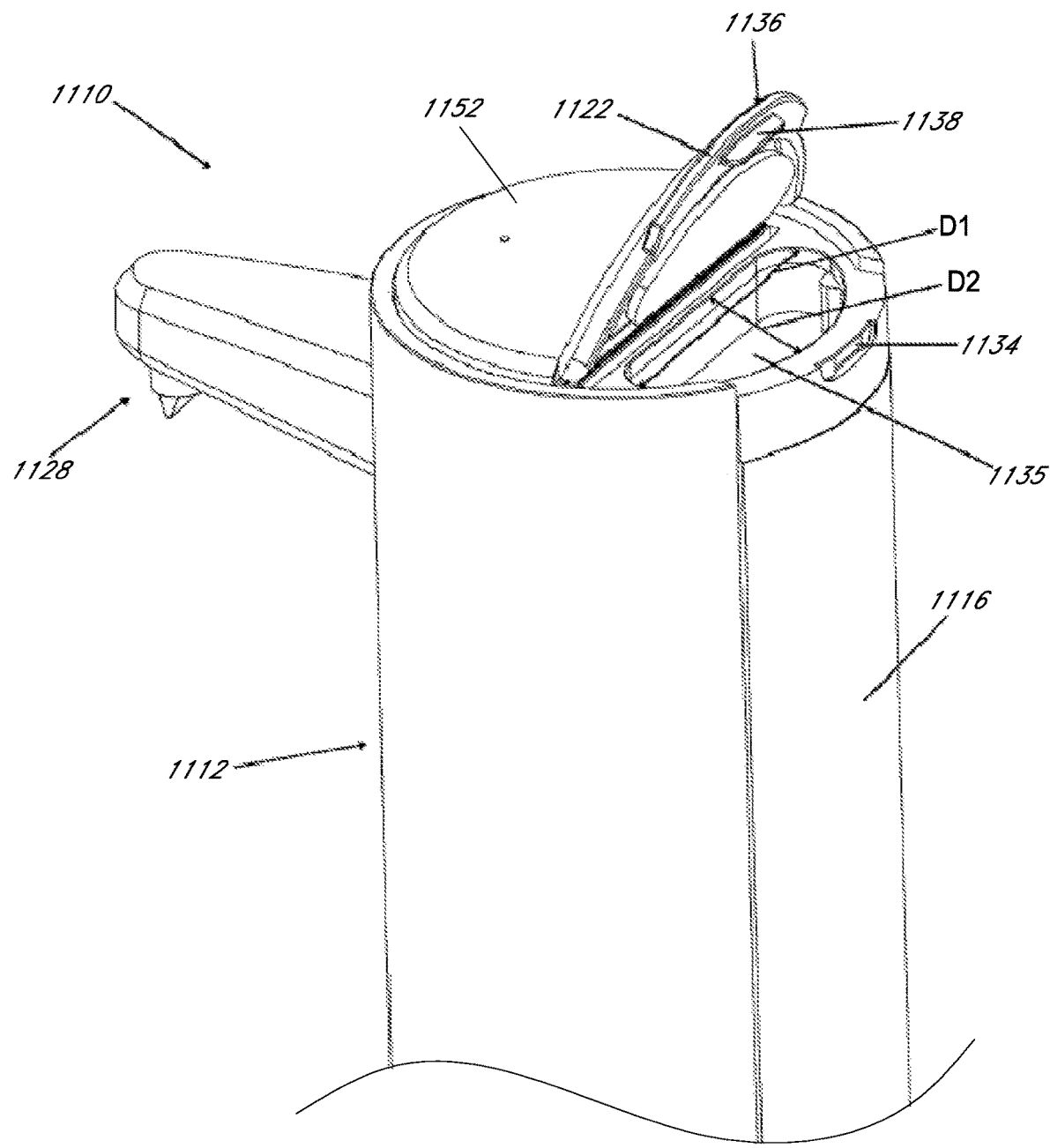
FIG. 43 illustrates a partial view of the embodiment of FIG. 39 with the lid in an open position.

As discussed above, in several embodiments the dispenser 1100 can include a lid 1122, as shown in FIG. 39, which can be configured to form a seal at the top of the reservoir 1116 for maintaining the liquid soap L within the reservoir 1116. In some embodiments, the lid 1122 can include an air vent (not shown), which can allow air to enter the reservoir 1116 as the level of liquid soap L falls within the reservoir 1116 such as during the course of use of the dispenser 1100. In some embodiments, the lid 1122 can be movable but generally non-removable from the dispenser 1100. For example, the lid 1122 can be a pivotable, as shown in FIG. 43. A non-removable lid can be desirable as it can reduce the chance that the user will misplace the lid. When the lid 1122 is moved to an open position, the user can refill the reservoir 1116. A portion of the lid 1122 may include an engagement member, such as protruding portion 1138 that engages (e.g., snaps together) with a recess 1134, to keep the lid 1122 from opening unintentionally. The protruding portion 1138 may be offset or protrude from the outer edge 1136 of the lid, so the user can readily manipulate (e.g., push or pull on the outer edge 1136 of the lid). In some embodiments, the lid 1122 may be opened with the press of a button or by triggering a sensor.

Figure 44:
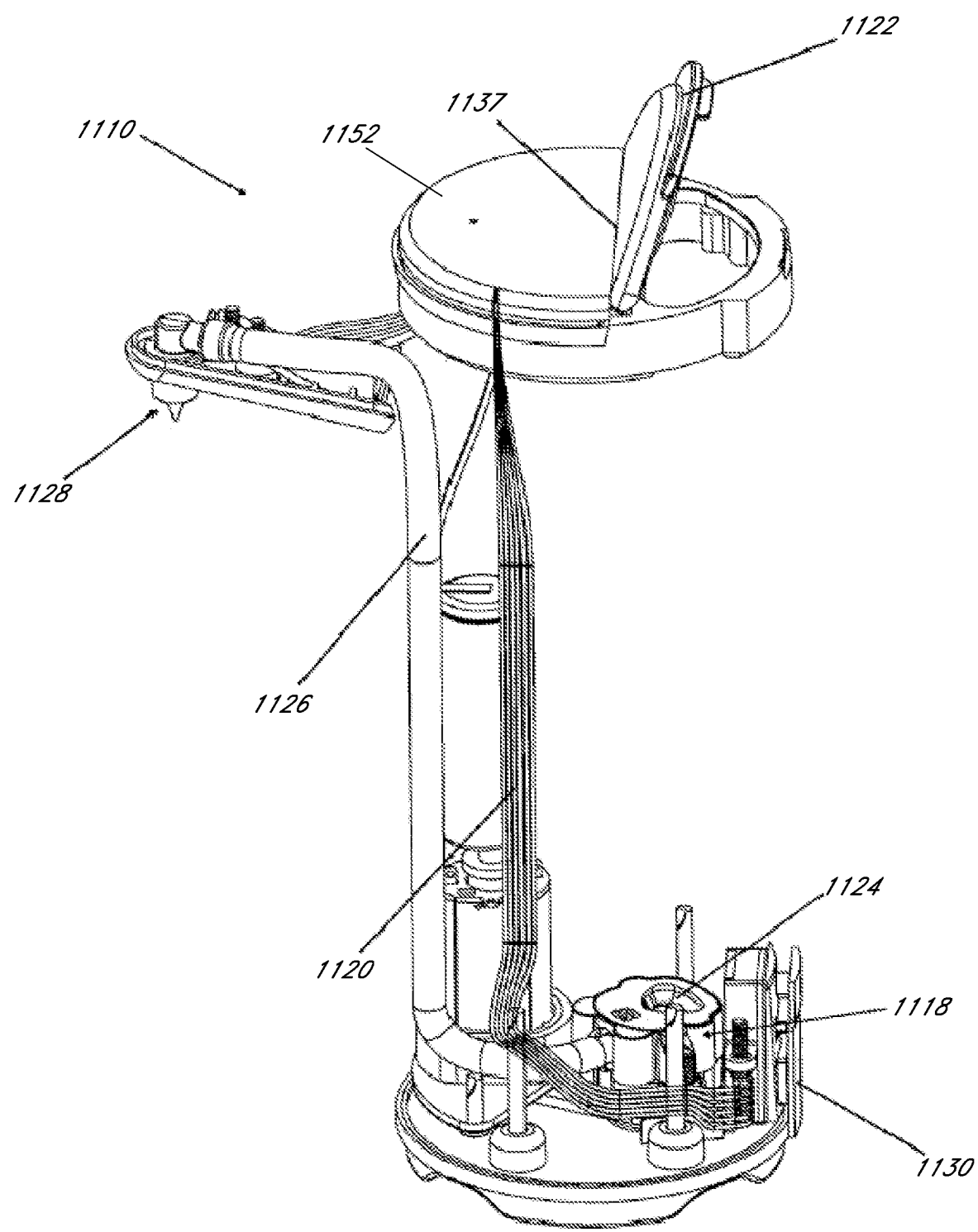
FIG. 44 illustrates a side view of the embodiment of FIG. 39 with a portion of the housing removed.
Figure 45:
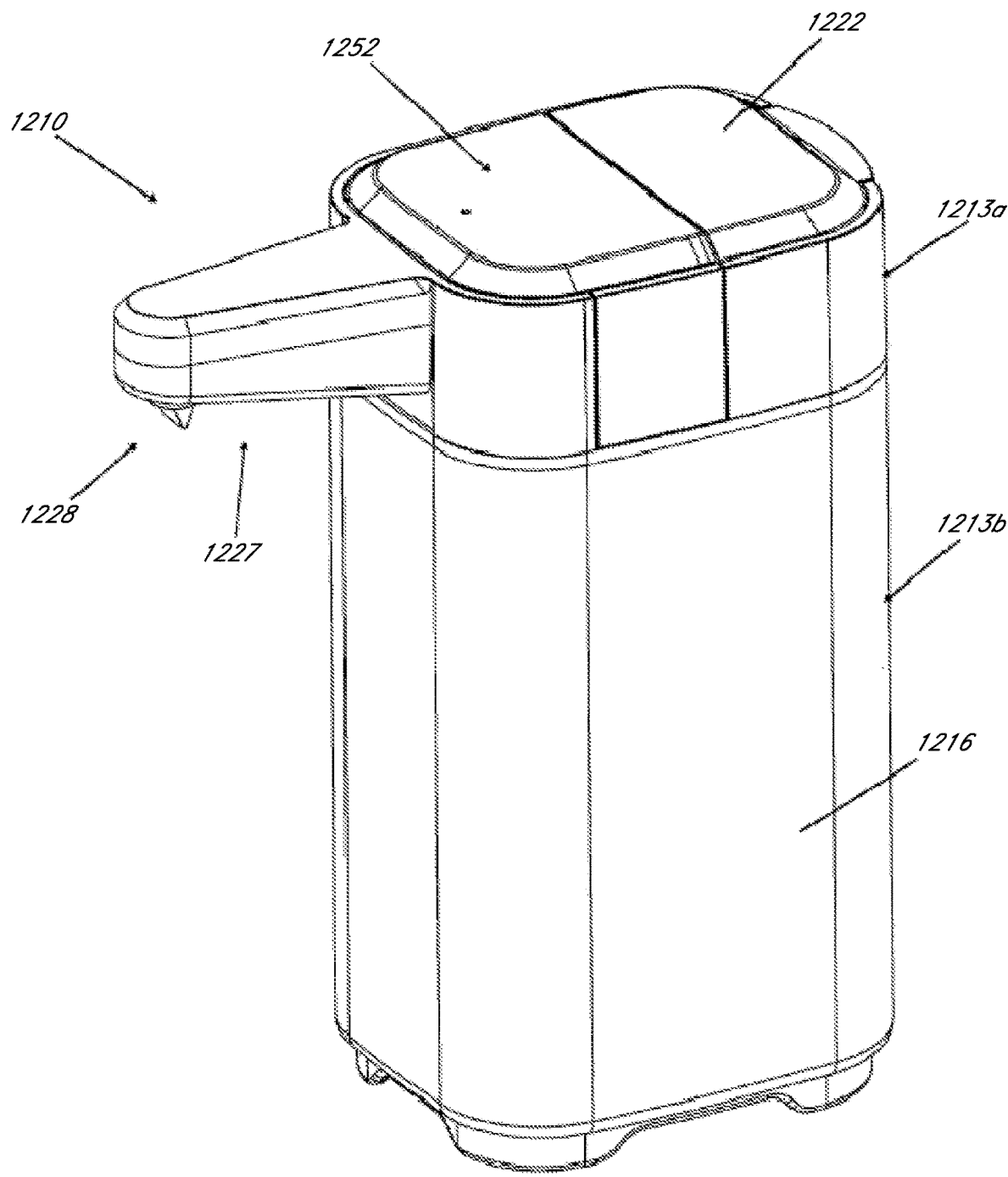
FIG. 45 illustrates an embodiment of a soap dispenser, including an upper portion and a lower portion.

In certain embodiments, the lid 1122 can be biased (e.g. by a spring). For example, in some embodiments, the lid 1122 can be biased toward the open position. In some variants, the lid can be biased toward the closed position. In certain embodiments, the lid can be configured to open when a user pushes on the lid 1122. In some embodiments, the reservoir 1116 can include an opening 1135 configured to be partly or entirely covered by the lid 1122. Some embodiments of the opening 1135 can be configured to facilitate loading of liquid soap L into the reservoir 1116 via the opening 1135. For example, the opening 1135 can have a first dimension D1 (e.g., generally parallel with the front of the dispenser 1110) that is greater than or equal to a second dimension D2 (e.g., generally perpendicular to the front of the dispenser 1110). In some embodiments, the first diameter D1 or widest dimension of the opening 1135 is at least about 1 inch, about 2 inches, or about equal to the length of a frontward edge 1137 (FIG. 44). In some embodiments, as illustrated, the lid 1122 encompasses less than the entire top surface of the dispenser 1110, such as less than or equal to about half of the top surface of the dispenser. In some embodiments, the lid 1122 can have at least a portion that corresponds to an outer shape (e.g., a curve) of the top region or other adjacent portion of the dispenser 1110, and/or the lid 1122 has at least a portion (e.g., a generally straight line) that does not correspond to an outer shape of the top region or other adjacent portion of the dispenser 1110.

As noted above, in several embodiments, the dispenser 1110 can include a processor, which can control and/or report, by various components, schemes, and algorithms, input and output characteristics and functions of the dispenser 1110. In some embodiments, as shown in FIG. 42, one or more wires 1120 can carry signals between, for example, the processor and the sensor 1132. In some variants, based on the signal received from the sensor, the processor can signal the pump 1118 to dispense different volumes of liquid soap L, activate different duty cycle characteristics, increase or decrease the dispensation speeds, operate for greater or lesser durations of time, or other appropriate parameters.

In some embodiments, the dispenser 1110 can include a user input device 1152, such as a button, dial, switch, or otherwise. The user input device 1152 can provide a signal to the processor, such as to manually operate the dispenser 1110 to continuously discharge or discharge larger amounts of liquid soap L when desired. For example, if a user of the dispenser 1110 wishes to fill a sink full of soapy water for washing dishes, the user can simply push the user input device 1152 and dispense a larger amount of soap than would normally be used for washing one's hands, such as at least about 3 milliliters or at least about 4 milliliters. In certain configurations, the input device 1152 can have a generally low profile. For example, an upper surface of the user input device 1152 can be flush or about flush with an upper surface of the lid 1122 when the lid 1122 is closed. In some embodiments, the surface area of the upper surface of the user input device 1152 can be greater than or equal to the surface area of the upper surface of the lid 1122, which can provide for ready manipulation of the user input device 1152.

In some embodiments, the dispenser 1110 can include memory, such as firmware, to store the various control schemes and algorithms, as well certain instructions and/or settings related to various characteristics of the dispenser 1110. For example, the memory can include instructions and/or settings regarding the size of the sensing regions, the sensitivity of the sensors, the volume and/or rate of liquid soap dispensed, duty cycle characteristics, the length of various timers, and otherwise.

In some embodiments, the dispenser 1110 can include a power adjustment device, such as a button 1131. In some implementations, alternatingly toggling (e.g., pressing) the button 1131 energizes and de-energizes the dispenser 1110. In some variants, momentary toggling of the button 1131 results in the dispenser 1110 entering a lower power consumption mode, which can enhance the life of the power source.

Figure 40:
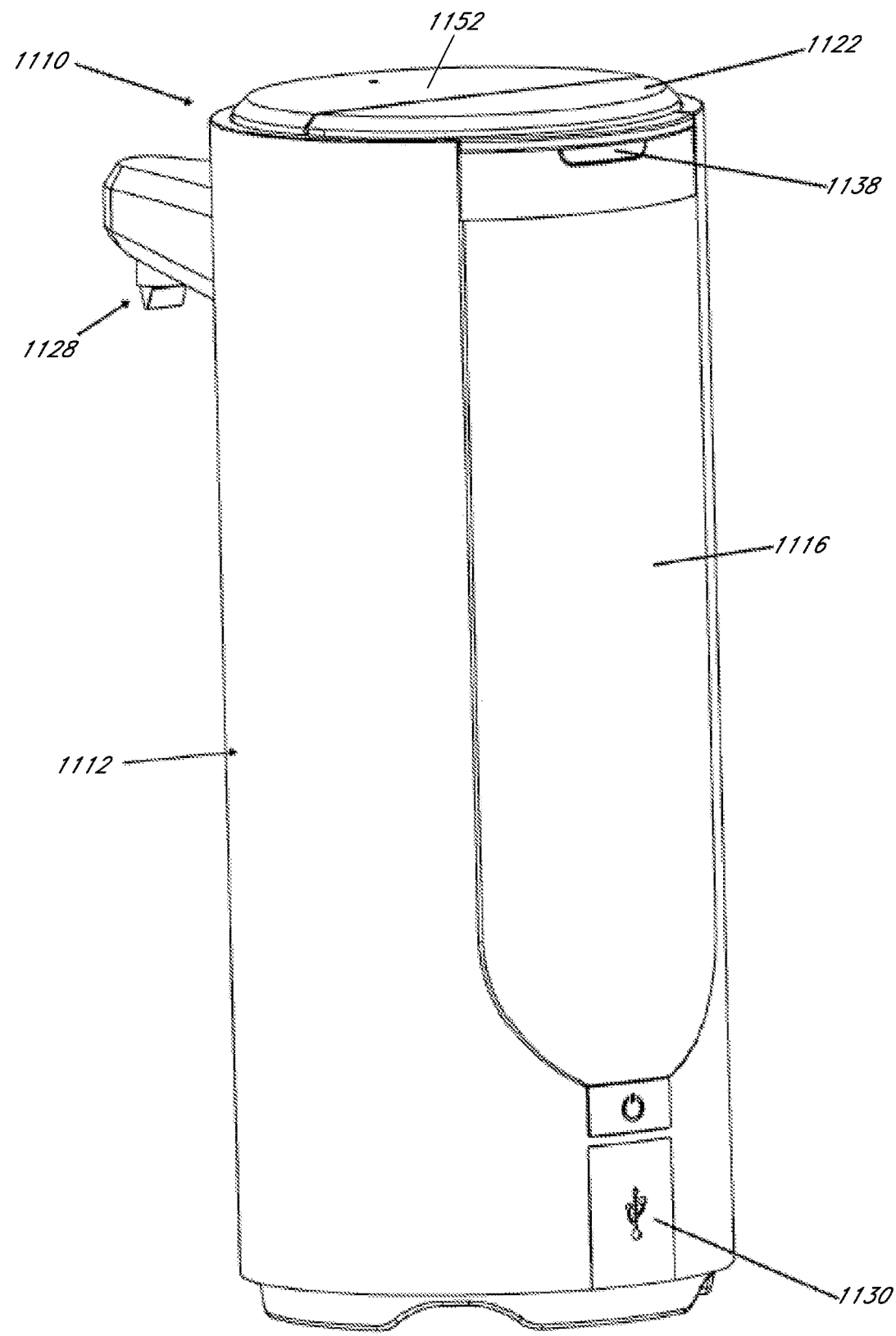
FIG. 40 illustrates a rear view of the embodiment of FIG. 39, including a port.
Figure 41:
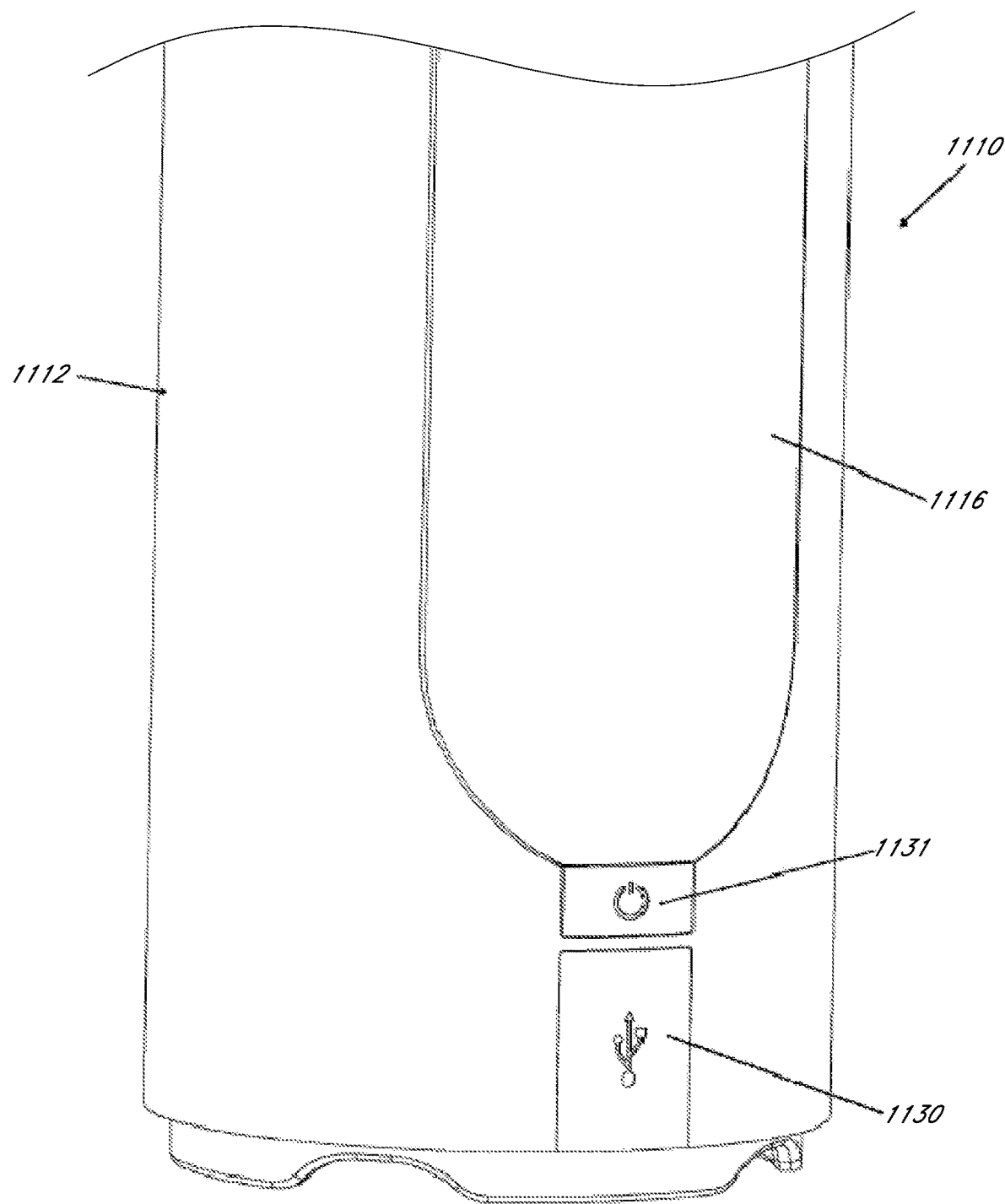
FIG. 41 illustrates a focused view of the embodiment of FIG. 39 showing the port.

In several embodiments, the dispenser 1110 can include a port 1130, such as a universal serial bus (USB) port, as shown in FIG. 40. The port 1130 can be configured to permanently or removably receive a connector coupled with a wire or cable (not shown). In some embodiments, the port 1130 is configured to allow electrical potential to pass to a soap dispenser power source via the connector. In some embodiments, the port is configured to facilitate charging or recharging of the soap dispenser power source.

In some embodiments, the dispenser 1110 can be configured such that a user can modify (e.g., update, program, or otherwise) the memory, such as by connecting the dispenser 1110 to a computer. In some embodiments, the dispenser 1110 can be communicatively connected with a computer via the port 1130 (e.g., using a USB/cable). In certain instances, data can be transferred between the computer and the dispenser 1110 via the port 1130. In some embodiments, the dispenser 1110 is configured to communicate with a computer wirelessly, such as by a cellular, Wi-Fi, or Bluetooth® network, infrared, or otherwise.

In some embodiments, when the dispenser 1110 is in communication with the computer, a control panel may be displayed on a display device associated with the computer. The control panel may allow the user to adjust various input and output characteristics for the dispenser 1110. For example, in some embodiments, a user can use the control panel to adjust the volume of liquid soap dispensed from nozzle 1128. In certain embodiments, the dispenser 1110 can include first and second sensing regions and the user can configure the volumes of liquid soap associated with the first and second sensing regions. In some examples, the user can adjust the size (e.g., depth, width, and/or height) of one or more of the sensing regions. In some implementations, the user can use the control panel to modify the operation and output (e.g., volume or rate) of soap dispensed based on certain conditions, such as the amount of battery power remaining, the amount of liquid soap estimated to be remaining in the reservoir 1116, and otherwise. In certain variants, the ability to modify the operational parameters of the dispenser 1110 with the control panel can reduce or obviate the need for one or more adjustment devices (e.g., buttons, knobs, switches, or the like) on the dispenser 1110, thereby providing a generally uniform exterior surface of dispenser 1110 (which can facilitate cleaning) and reducing the chance of unintentional adjustment of the operational parameters (such as when transporting the dispenser 1110).

In some embodiments, when the dispenser 1110 is in communication with the computer, data can be transferred from the dispenser 1110 to the computer. For example, in some embodiments, the dispenser 1110 can transfer data, such as power consumption, estimated remaining battery power, the number of activations of the dispenser 1110, rate, amount, and/or frequency of soap consumption, and otherwise. In certain embodiments, software can be used to analyze the transferred data, such as to calculate usage statistics (e.g., during specific periods), recognize and/or draw attention to unusual activity, and produce graphical representations of the data (e.g., charts, graphs, or the like). Transferring usage statistics from the dispenser 1110 to the computer can allow the user to monitor usage and enables the user to calibrate different characteristics of the dispenser 1110 (e.g., based on previous usage and parameters). In certain embodiments, transferring data from the dispenser 1110 to the computer can reduce or avoid the need for one or more adjustment or display devices on the dispenser 1110 itself.

In some embodiments, when the dispenser 1110 is in communication with the computer, the dispenser 1110 can transfer data to the computer and the computer transfers data to the dispenser 1110. Furthermore, in some embodiments, when the dispenser 1110 is in communication with the computer, electrical potential can be provided to the soap dispenser power source before, during, or after such two-way data transfer. The electronic interfacing, control, and/or reporting described herein in connection with the dispenser can be used with many other electrical devices, including houseware devices, such as trashcans, mirrors, cooking devices (e.g., ovens, stones, toasters, etc.), refrigerators, etc.

With reference to FIGS. 45-54, another embodiment of a dispenser is identified generally by the reference numeral 1210. The dispenser 1210 can include a lower portion 1213b, an upper portion 1213a, a reservoir 1216, and dispensing portion 1227 with a nozzle 1228. In some embodiments, a sensor 1232 can be positioned on the dispenser 1210, for example, on the bottom portion of the dispensing portion 1227 as shown in FIG. 46. In several embodiments, the lower portion 1213b comprises the reservoir 1216. In some embodiments, the entire lower portion 1213b can be the reservoir 1216. The reservoir 1216 can be configured for disposable, one-time use with a temporarily sealed soap-containing portion that is discarded when the soap supply is exhausted. Some of the components of the dispenser 1210 can be the same, similar, or identical to the corresponding components of the dispensers discussed above.

In some embodiments, the upper portion 1213a comprises a lid 1222 configured to open to allow access to the reservoir 1216 (e.g., for adding liquid soap L to the reservoir 1216) and to close (e.g., for maintaining the liquid soap L within the reservoir 1216). In some embodiments, the lid 1222 can be pivotable. For example, in some embodiments, the lid 1222 can be pivotable about an axis generally parallel to the front of the dispenser 1210. The lid 1222 may be opened by any of the mechanisms discussed above, such as by pushing or pulling on the lid 1222, pressing a button, triggering a sensor, or otherwise.

In several embodiments, the upper portion 1213a comprises some or all of the components that draw, pump, dispense the soap, and/or that power and control the dispenser 1210. For example, in certain variants, the upper portion 1213a can include the nozzle 1228, the sensor 1232, a pump 1218, a conduit 1226, a power supply, an actuator, and/or an electronic control unit. As shown in FIG. 46, a cover 1240 can partly cover certain components, such as the pump 1218, power supply, actuator, and/or electronic control unit. As described above, the electronic control unit may comprise control circuits, a processor, and memory devices for storing and performing control routines.

In some embodiments, the dispenser 1210 can include a user input device 1252, such as a button, dial, switch, or otherwise. The user input device 1252 can provide a signal to the processor, such as to manually operate the dispenser 1210 to continuously discharge or discharge larger amounts of liquid soap L when desired. For example, if a user of the dispenser 1210 wishes to fill a sink full of soapy water for washing dishes, the user can simply push the user input device 1252 and dispense a larger amount of soap than would normally be used for washing one's hands, such as at least about 3 milliliters or at least about 4 milliliters. In certain configurations, the input device 1252 can have a generally low profile. For example, an upper surface of the user input device 1252 can be flush or about flush with an upper surface of the lid 1222 when the lid 1222 is closed. In some embodiments, the surface area of the upper surface of the user input device 1252 is greater than or equal to the surface area of the upper surface of the lid 1222, which can provide for ready manipulation of the user input device 1252.

Figure 46A:
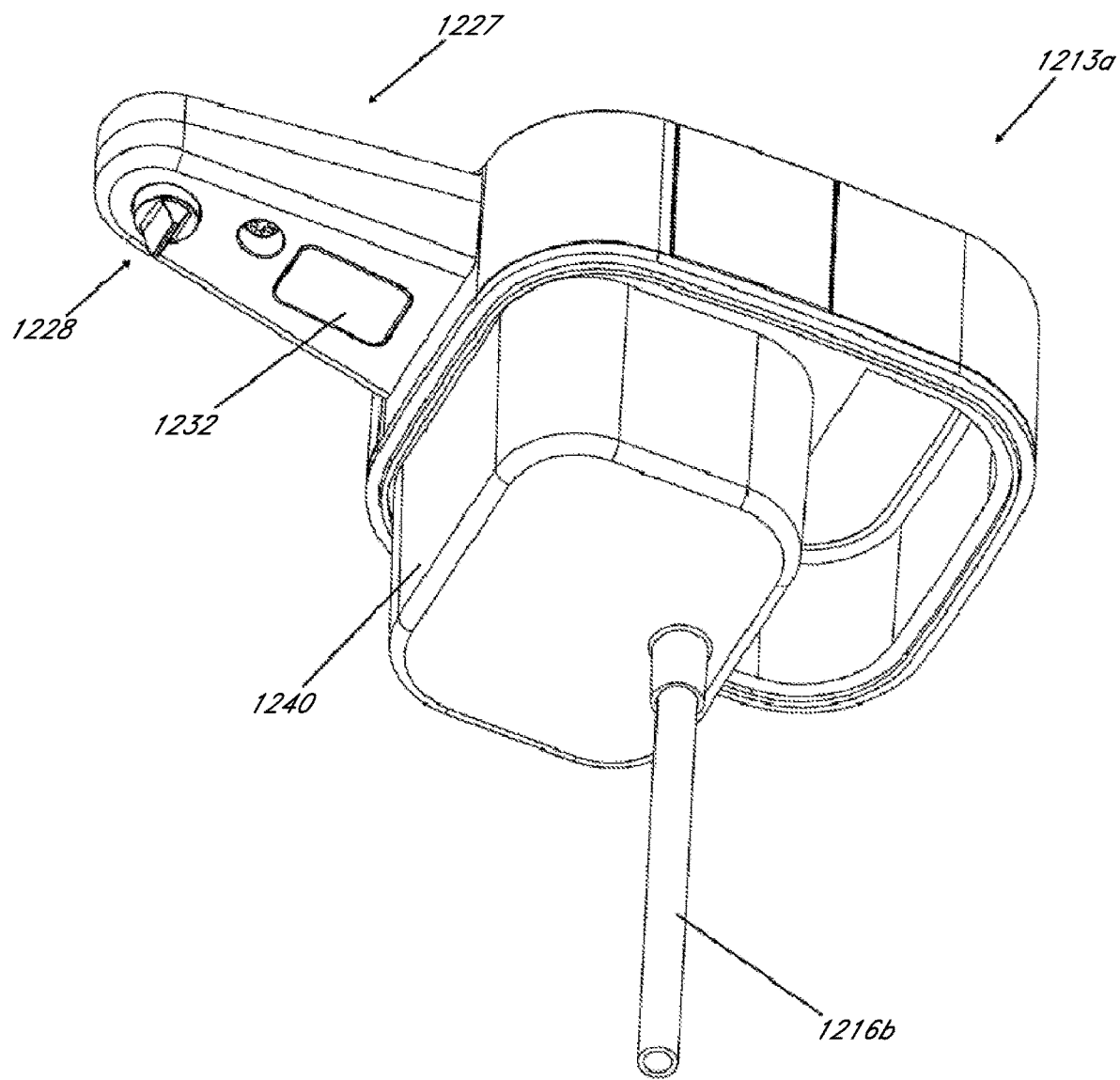
FIG. 46A illustrates the upper portion of the embodiment of FIG. 45.
Figure 46B:
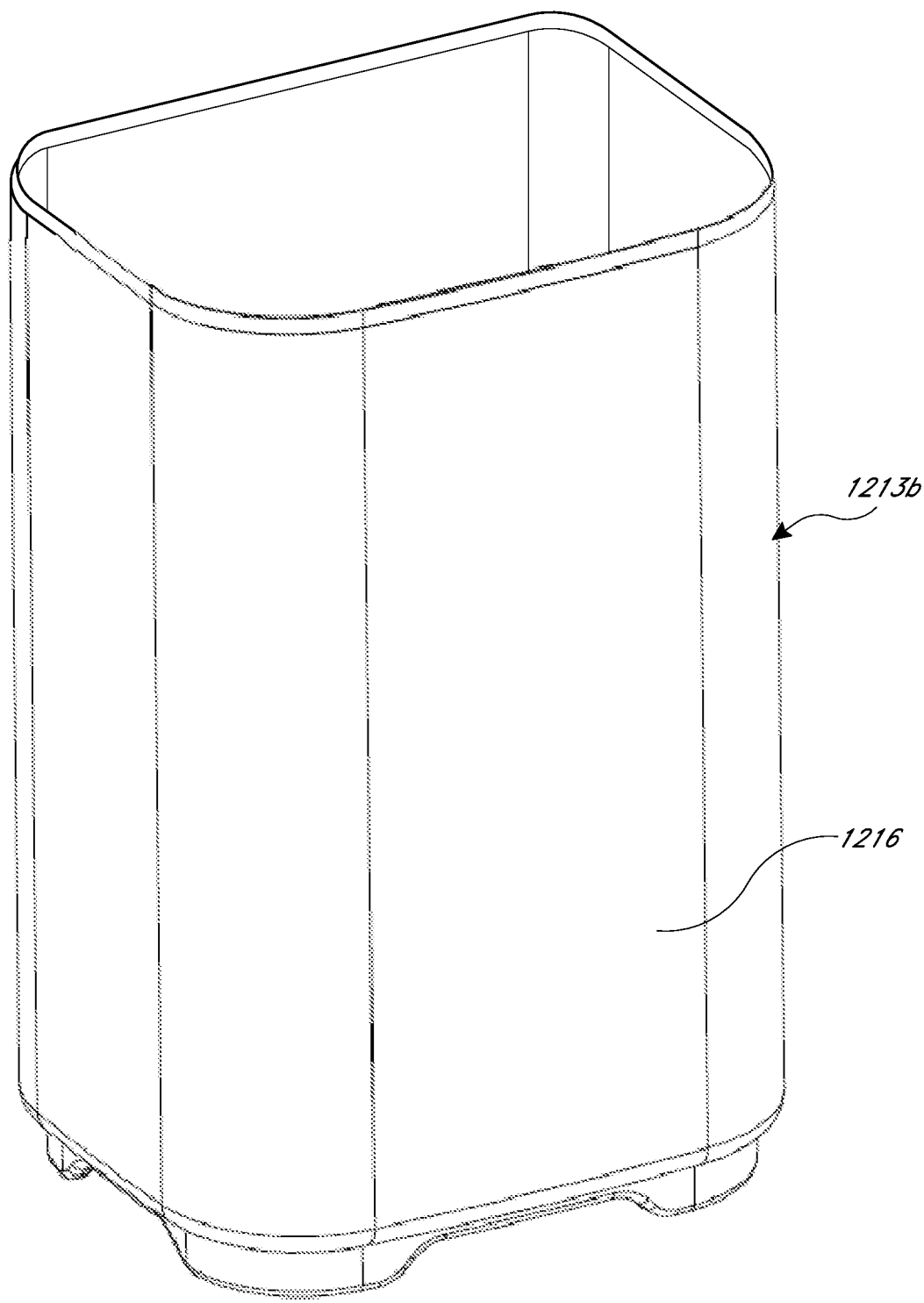
FIG. 46B illustrates the lower portion of the embodiment of FIG. 45.
Figure 47:
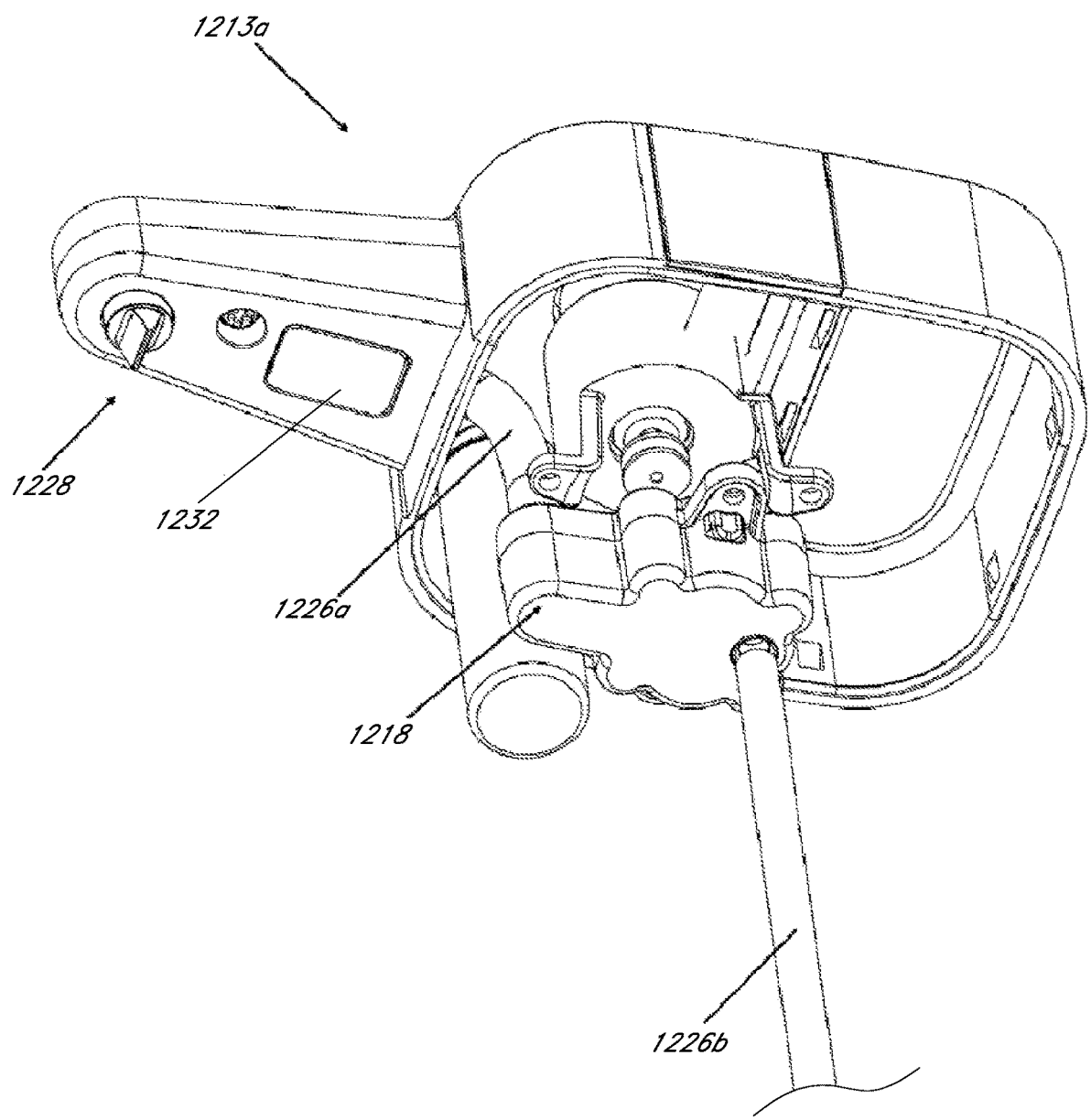
FIG. 47 illustrates a bottom view of the upper portion of the embodiment of FIG. 45 with a portion of a housing removed.
Figure 48:
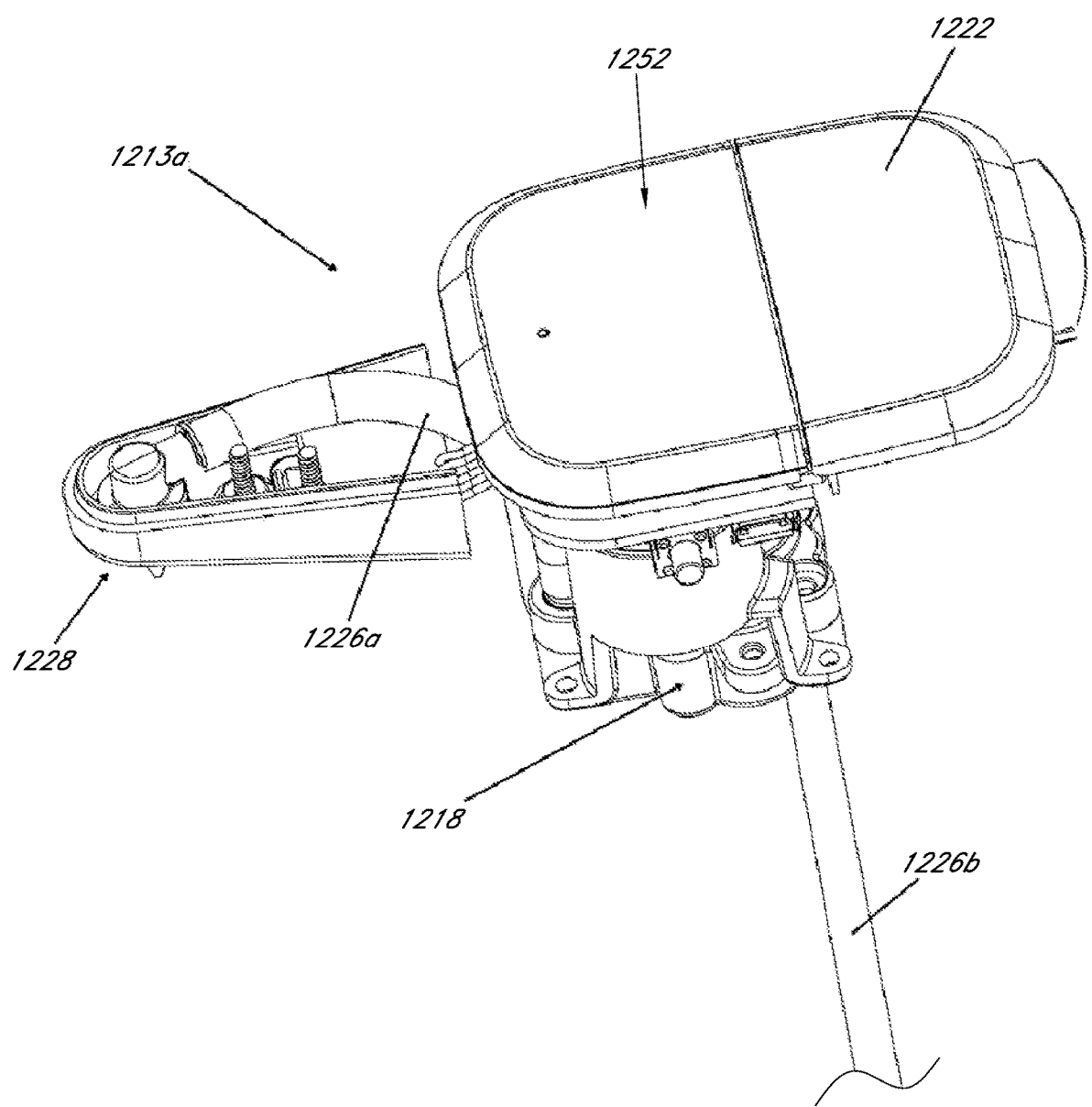
FIG. 48 illustrates a top view of the upper portion of the embodiment of FIG. 45 with a portion of the housing removed.

As illustrated in FIGS. 46A-B, in some embodiments, the upper portion 1213a and the lower portion 1213b can detach from each other. In several embodiments, it may be desirable to have a detachable reservoir 1216. For example, the detachable reservoir 1216 can allow the user to replace the lower portion 1213b with a new, fresh, or pre-filled lower portion 1213b. For example, a user may purchase several lower portions 1213b, which may be pre-filled with liquid soap. When a particular lower portion 1213b has been spent (e.g., the soap of the lower portion 1213b has been consumed) then the user may remove the upper portion 1213a from the used lower portion 1213b and engage the upper portion 1213a with an unused or at least not empty lower portion 1213b, thereby providing a generally uninterrupted supply of soap. As some embodiments house the components for pumping and dispensing soap in the upper portion 1213a, the same upper portion 1213a can be used again and again with various lower portions 1213b. Further, the arrangement of having the components for pumping soap in the upper portion 1213a can provide a convenient assembly (e.g., a single generally contained unit) to move between lower portions 1213b. Thus, certain embodiments can allow users to replenish the liquid soap L without pouring any liquid soap L out of a container and potentially creating a mess. In some embodiments, the dispenser can indicate (such as visibly or audibly, by a light or a speaker) that the soap supply has diminished to a pre-determined level so that a new disposable portion, pre-filled with soap can be purchased in the near future.

Figure 55:
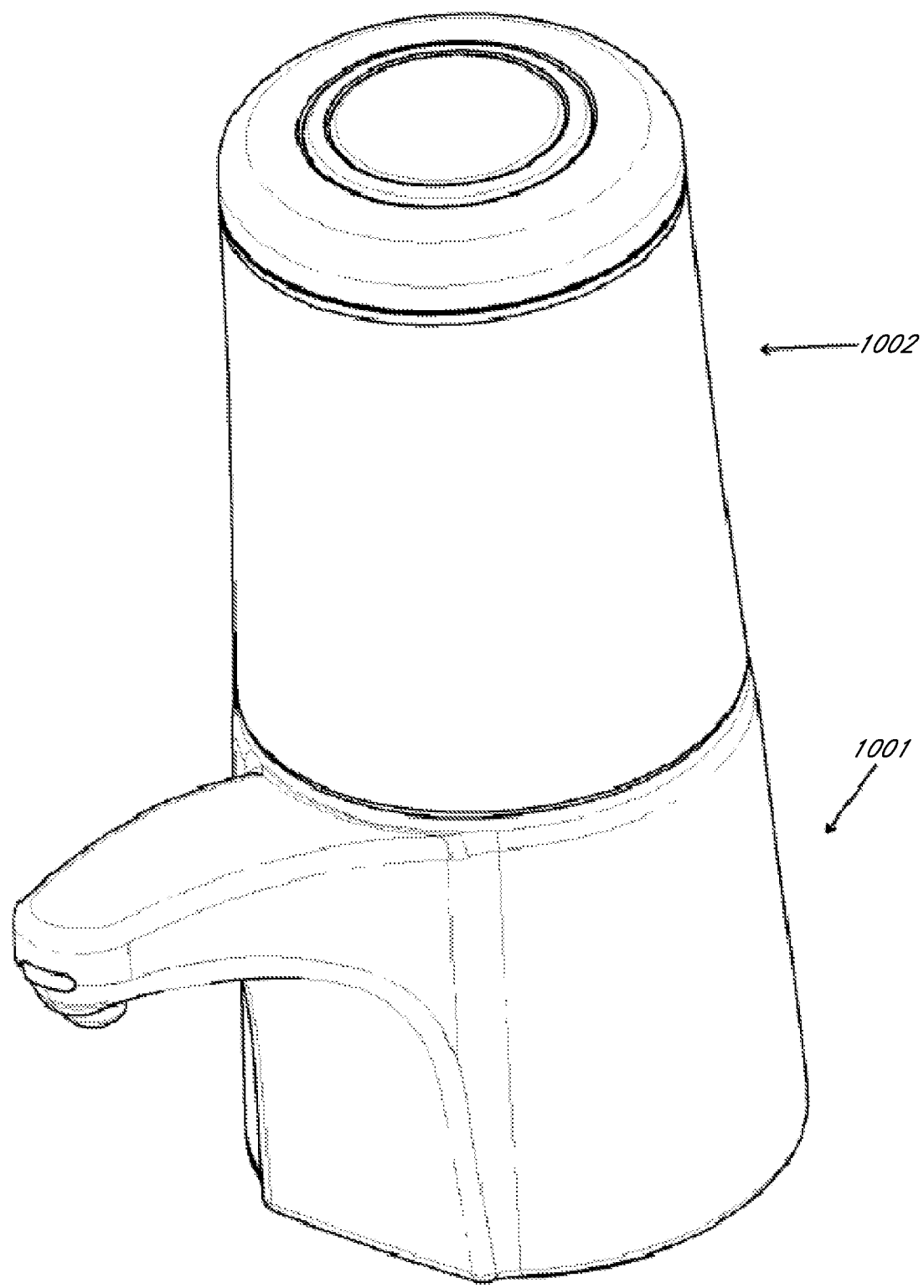
FIG. 55 illustrates another embodiment of a soap dispenser, with a cartridge and a pump unit.

In several embodiments, it may be desirable to have a dispenser 1210 with a detachable lower portion 1213b, as shown in FIG. 55. In some embodiments, the lower portion 1213b comprises a reservoir 1216 configured to receive liquid soap L. In these embodiments, the user is able to replace the lower portion 1213b when the soap is exhausted. In certain scenarios, it may be desirable to position the reservoir 1216 in a lower portion of the dispenser 1210, so the reservoir 1216 is easier to access and replace.

In some embodiments, the lower portion 1213b includes a power source. In some embodiments, the power source can be disposable. In some embodiments, the power source comprises one or more batteries. In certain variants, the batteries are charged by, an electrical connection to a domestic power supply, such as a standard wall outlet. The power source can include electrical contacts that engage with the upper portion 1213a to complete a circuit and provide electrical power to the dispenser 1210. In some embodiments, the dispenser 1210 can be de-powered when the upper and lower portions 1213 a, 1213b are disengaged.

In several embodiments, the lower portion 1213b can be configured to engage with the upper portion 1213a. The upper portion 1213a and lower portion 1213b can include engagement features configured to maintain the lower portion 1213b in engagement the upper portion 1213a. For example, one or both of the upper and lower portions can include mating tabs and slots, ball detents, or otherwise. As illustrated, the outer shape and contours of the lower portion 1213b can generally correspond to the outer shape and controls of the upper portion 1213a.

Figure 49:
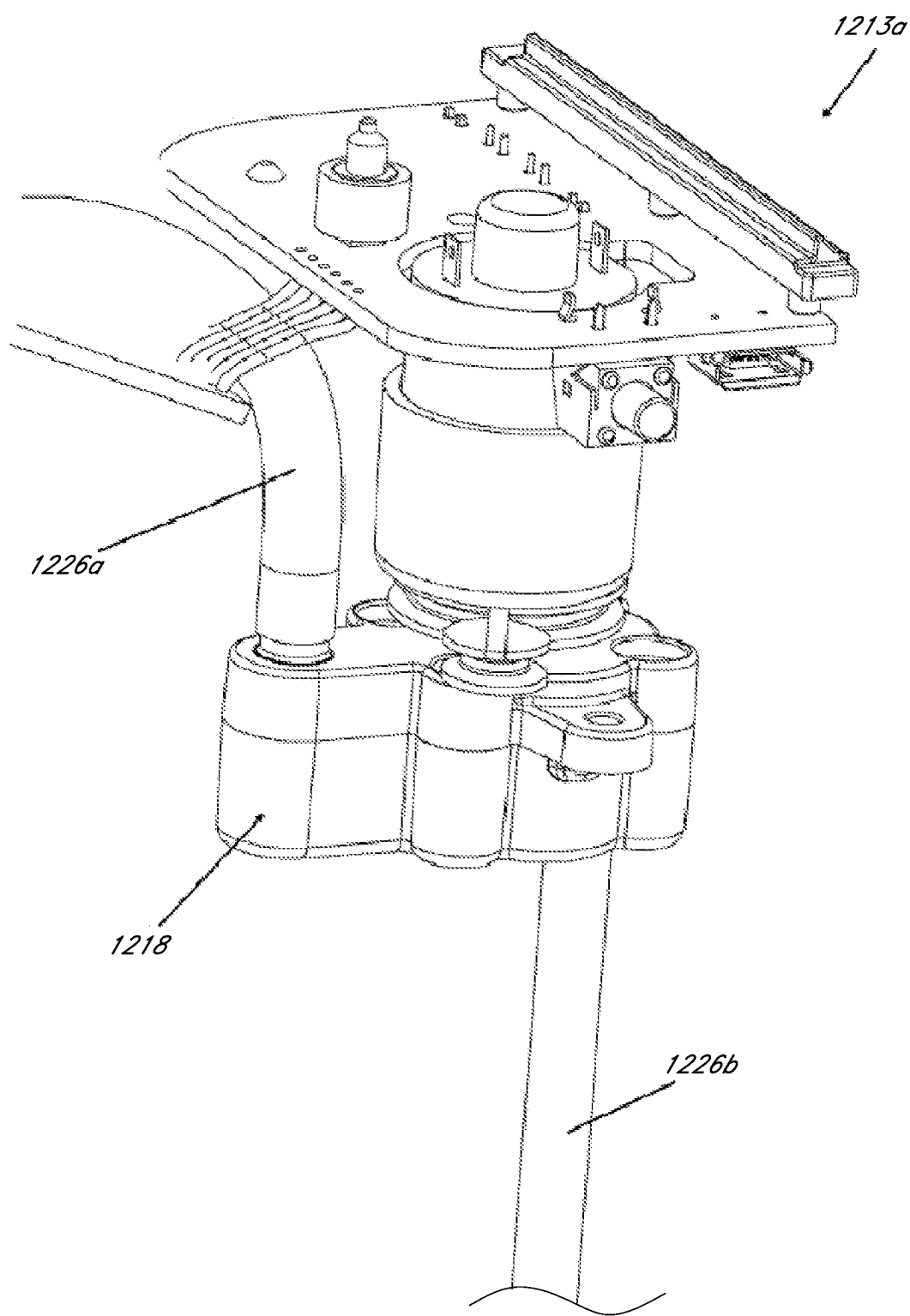
FIGS. 49-50 illustrate a side view of the upper portion of the embodiment of FIG. 45 with the housing removed.
Figure 50:
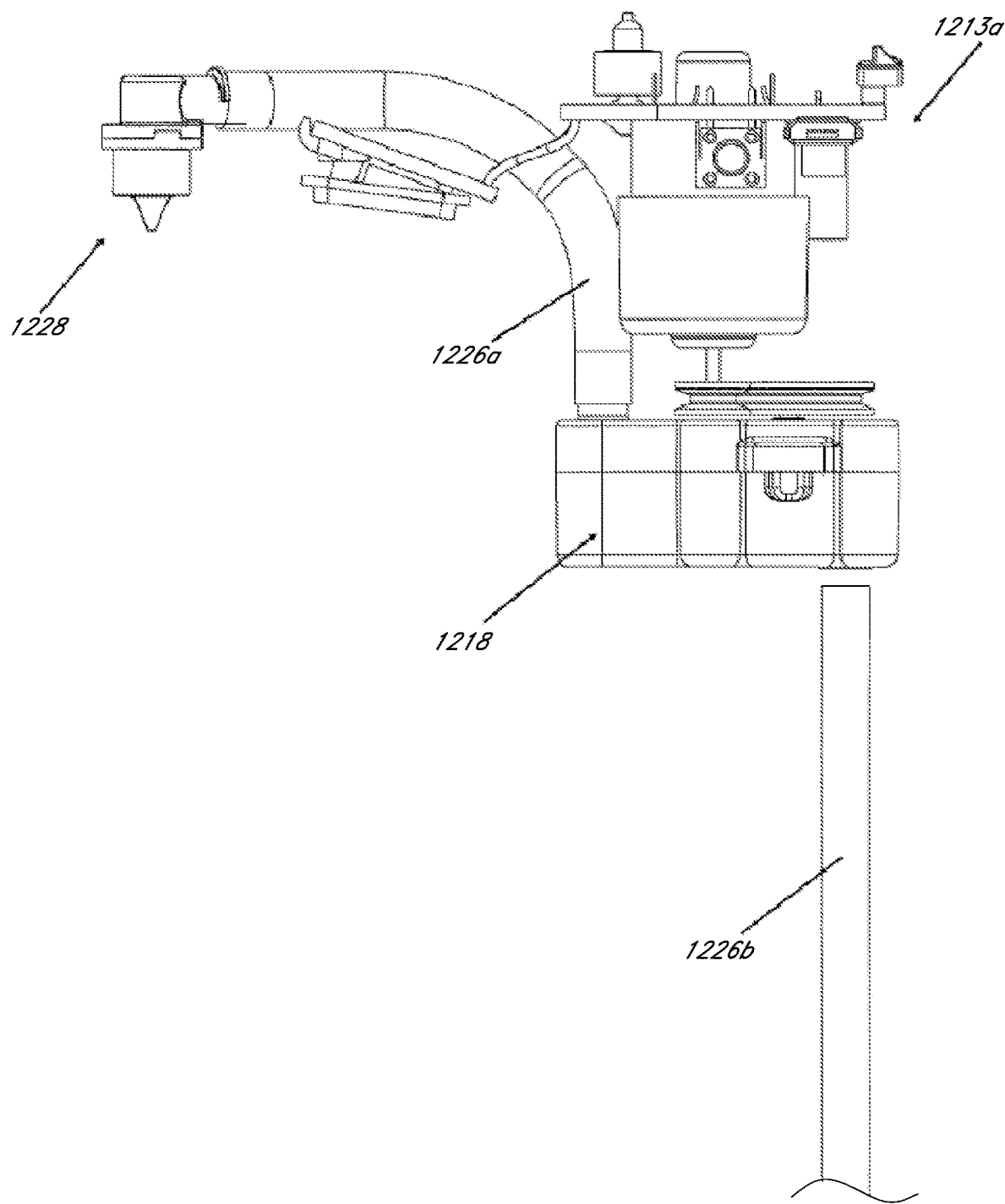
Figure 51:
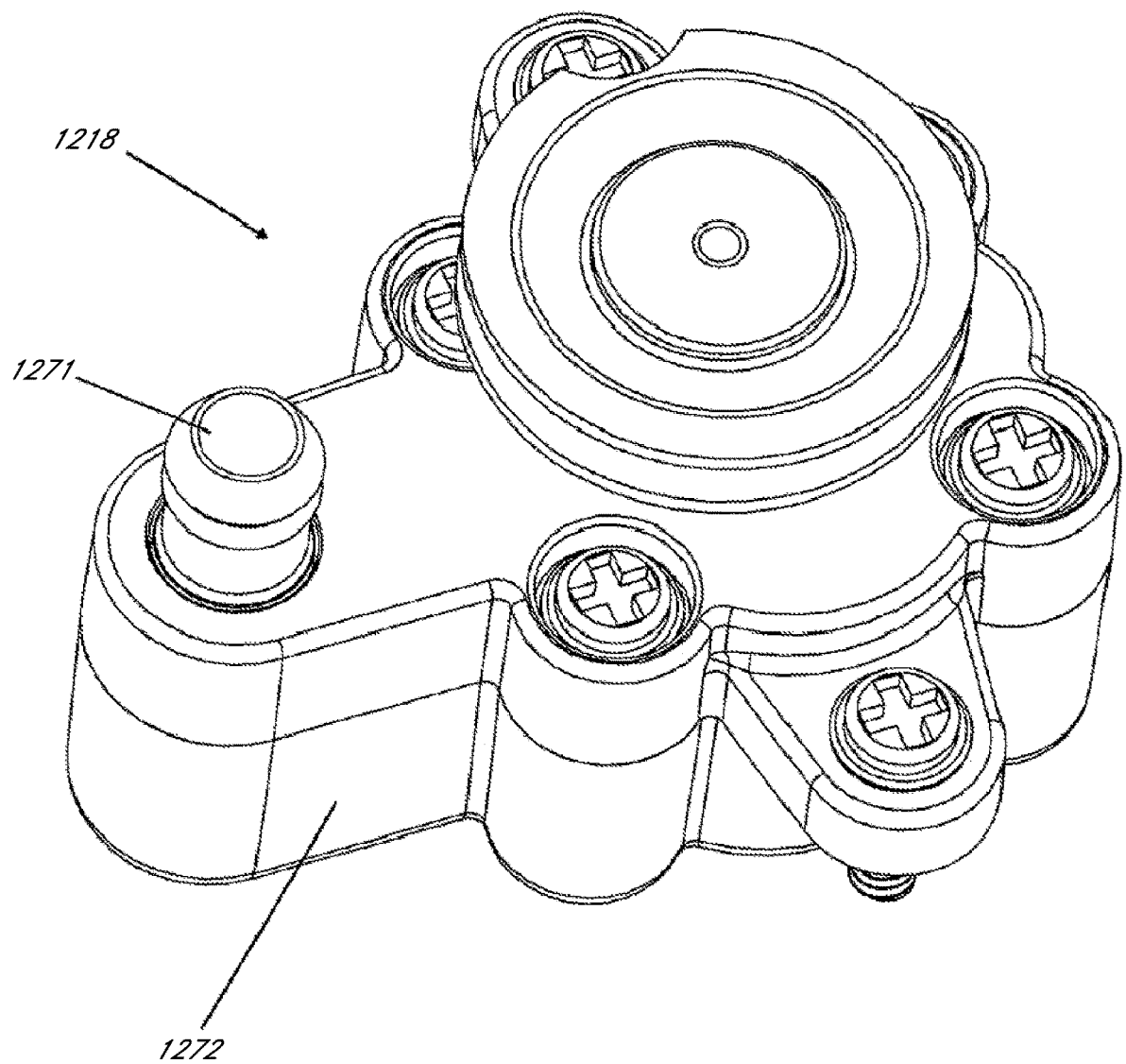
FIG. 51 illustrates an embodiment of a pump.
Figure 52:
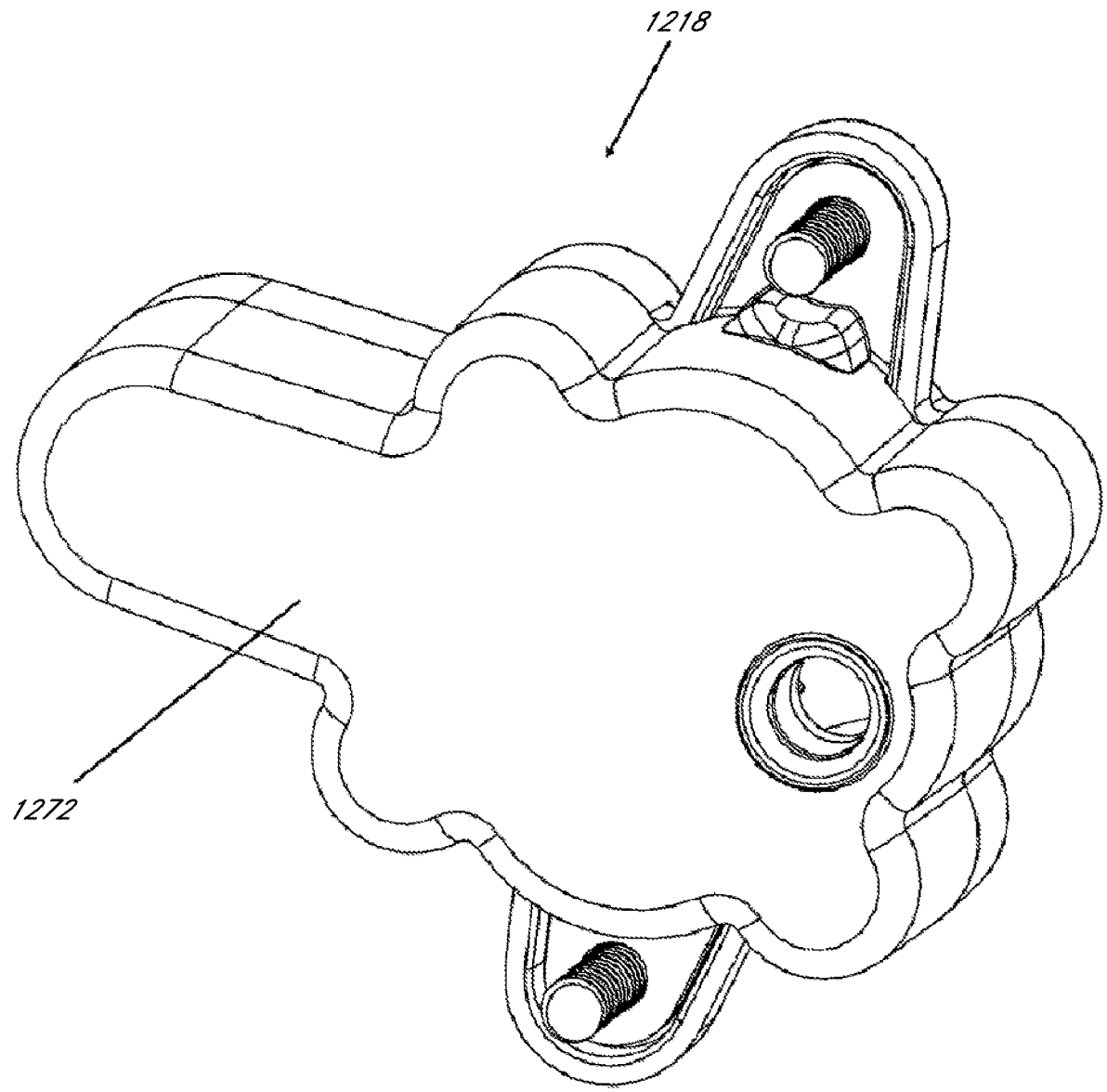
FIG. 52 illustrates a bottom view of the embodiment of FIG. 51.
Figure 53:
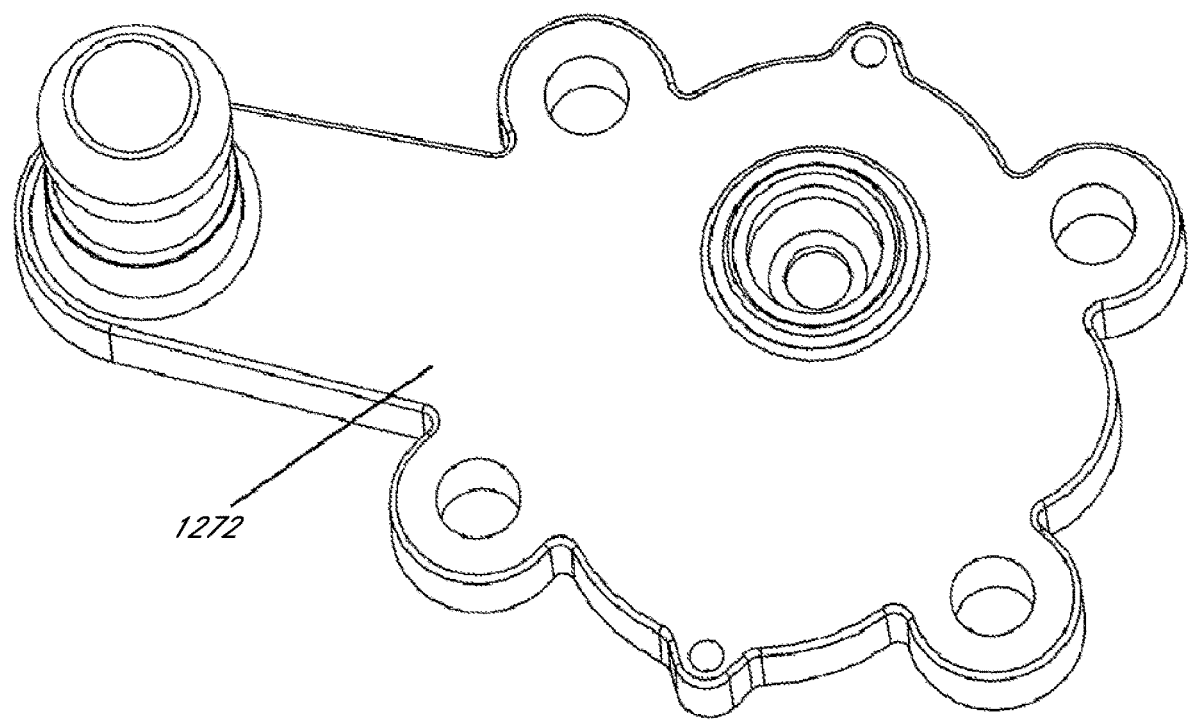
FIG. 53 illustrates a portion of the pump body of the embodiment of FIG. 51.
Figure 54:
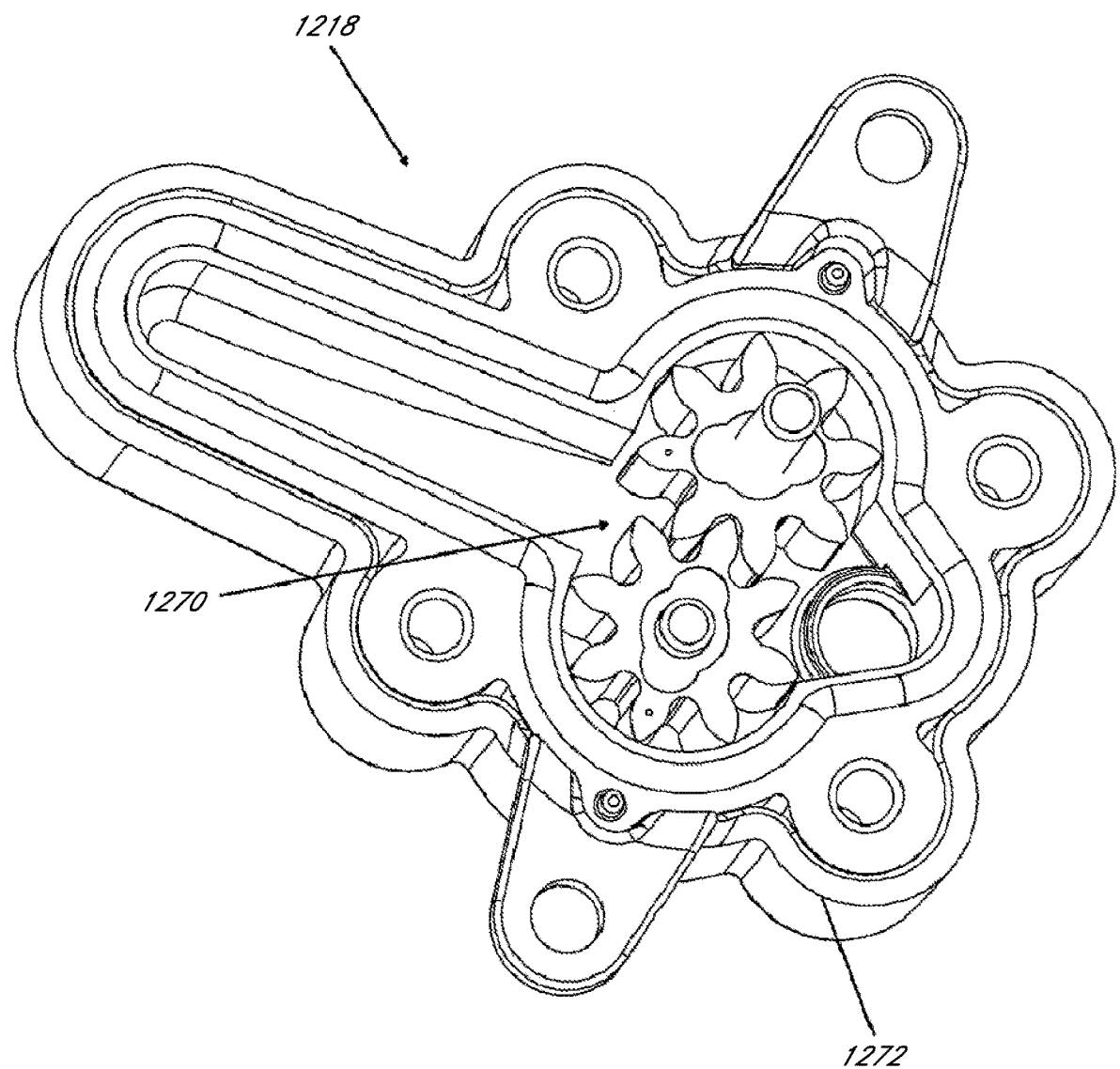
FIG. 54 illustrates a gear mechanism of the embodiment of FIG. 54.

FIGS. 51-54 illustrate an embodiment of the pump 1218. In several embodiments, the pump 1218 can be a gear pump and can comprise a pair of gears 1270 and a pump body 1272. In some embodiments, other type of pumps can be used, such as diaphragm pumps, centrifugal pumps, etc. In some embodiments, the pump 1218 can include an inlet and an outlet. The inlet can connect to a conduit 1226b for receiving liquid soap L from the reservoir 1216. The outlet can connect to a conduit 1226a for delivering liquid soap L to the nozzle 1228d. In some embodiments, as shown in FIGS. 49-50, liquid soap L is encouraged out of the pump 1218 in generally a vertical pathway from the conduit 1226a. In some embodiments, the soap dispenser 1210 can be taller than it is wide (e.g., front to back), thus horizontal space may be more at a premium than vertical space. Accordingly, in certain variants, arranging the liquid soap to exit via a connector 1271 that extends generally vertical can provide a more efficient use of space compared to embodiments having a connector that extends generally horizontally. In some embodiments, the generally vertically extending connector 1271 may be desirable to help decrease the size of the soap dispenser 1220.

In several embodiments, when the upper portion 1213a is engaged with the lower portion 1213b, conduit 1226b extends into the liquid soap L in reservoir 1216. The conduit 1226b can be configured such that an end of the conduit 1226b is positioned at or near the bottom of the lower portion 1213b when the upper and lower portions are coupled together. In this configuration, the pump 1218 can be disposed generally above the liquid soap L. The pump 1218 drives liquid soap L from the reservoir, through the pump 1218, and out of the nozzle 1228.

With reference to FIG. 55, another embodiment is illustrated with a removable fluid-containing cartridge. As with other embodiments disclosed herein, the features, structures, steps, and/or processes of the embodiments of FIG. 55 and related disclosure can be used in addition to or instead of those in other embodiments, such as the embodiment shown in FIG. 38. Some dispensers include a pump unit 1001 and a removable cartridge 1002. In some embodiments, the cartridge can be configured to be disposable, such as after a single use or after the use of a certain volume of soap.

In some embodiments, the dispenser can be replenished by replacing or at least partially refilling the cartridge. For example, when a fluid volume of liquid (e.g., liquid soap) in a first cartridge is exhausted or at least drops below a limit, then the first cartridge can be removed and/or replaced with a second cartridge. In some variants, when the first cartridge includes a power source, such as a battery, and can be replaced when a condition occurs (e.g., a certain number of dispensations has occurred, the amount of power remaining in the power source is determined to be below a limit, etc.).

The cartridge 1002 can be configured to engage with the pump unit 1001 in various configurations. For example, the cartridge 1002 can engage a bottom portion of the pump unit 1001 (see FIG. 38), a top portion of the pump unit 1001 (see FIG. 55), or any other portion or combination of portions of the pump unit 1001, such as the front, rear, and/or side. The cartridge 1002 can engage the pump unit 1001 using any type of removable connection, such as with magnets, clips, snaps, a screw-fit, an interference fit, one or more spring-loaded buttons or sliders, or otherwise. In some embodiments, the cartridge 1002 or pump unit 1001 can includes one or more first attachment structures such as arms, fins, ribs, struts, detents, bosses, or the like that are configured to be received in corresponding second attachment structures such as recesses, notches, grooves, or the like in the other of the cartridge 1002 and pump unit 1001. Generally, the cartridge 1002 engages the pump unit 1001 such that a fluid or a liquid, and/or electrical power, can flow from the cartridge 1002 and into the pump unit 1001.

In some embodiments, the cartridge 1002 contains at least one fluid, such as soap, lotion, and/or sanitizer. In certain implementations, the cartridge 1002 can include a power source, such as a battery. Some variants of the cartridge 1002 can indicate one or more properties of the cartridge 1002 contents to the pump unit 1001. For example, in some embodiments, the cartridge 1002 can indicate the contents of the cartridge 1002 (e.g., the type of fluid: soap, lotion, sanitizer, etc.). In certain implementations, the cartridge 1002 can indicate one or more characteristics of the contents of the cartridge 1002, such as the brand of the fluid, the viscosity of the fluid, the moisture content of the fluid, the volume of the fluid contained, and/or battery capacity (e.g., beginning and/or real-time voltage or current of the power source). For example, in some embodiments, the cartridge 1002 can indicate that it contains about 100 milliliters of liquid hand soap and a power source with about 15 watts of power (e.g., about 1.5 volts and about 10 amps). In some implementations, the cartridge 1002 can indicate to the pump unit 1001 whether the cartridge 1002 is for home, commercial, or industrial use. The soap pump 1001 can be configured with a display for showing the user one or more characteristics of the fluid or the soap pump 1001 can be configured to obtain the information for internal processing without displaying the information to a user.

In certain variants, the pump unit 1001 and/or the cartridge 1002 can have an engagement indication element (not shown), such as an internal indicator in electrical communication with a processor in the pump 1001 or an external indicator, such as a speaker, a colored window, a moveable indicating component, a light, etc. The engagement indication element can be configured to signify that the pump unit 1001 and the cartridge 1002 have been properly engaged. Some variants of the engagement indication element can be configured to indicate that data regarding the cartridge 1002 has been received by the pump unit 1001.

Some embodiments of the pump unit 1001 can be configured to detect the cartridge 1002. For example, the pump unit 1001 can include a sensing element (not shown) that is configured to detect the cartridge 1002 when the cartridge 1002 and the pump unit 1001 are engaged. In some embodiments, the sensing element can be configured to detect one or more detection characteristics such as: a magnetic field, capacitance, resistance, a particular electrical voltage or current or a particular range or pattern of voltages or currents, conductivity, pressure, vibration, sound, light, or otherwise. For example, the sensing element can be configured to detect the strength presence and/or strength of a magnetic field emanating from the cartridge 1002. In certain variants, the sensing element can be configured to detect patterns of light, or disruptions thereof, when the cartridge 1002 is engaged with the pump 1001. In certain variants, the pump 1001 can be configured to receive an indication of a feature of the cartridge 1002 and to change a characteristic (e.g., output) of the configuration and/or performance of the pump unit 1001 based at least in part on that indication.

In certain implementations, the sensing element can be configured to detect the engagement of the pump unit 1001 with one or more mechanical or electrical indication members of the cartridge 1002. For example, in some embodiments, the combination of the pump unit 1001 and the cartridge 1002 comprises an engagement system, such as one or more receiving members, such as recesses, slots, or otherwise, on one of the pump unit 1001 or cartridge 1002 that are configured to engage with a series of projection members, such as clips, pins, ribs, or otherwise, on the other of the pump unit 1001 or cartridge 1002.

Figure 56C:
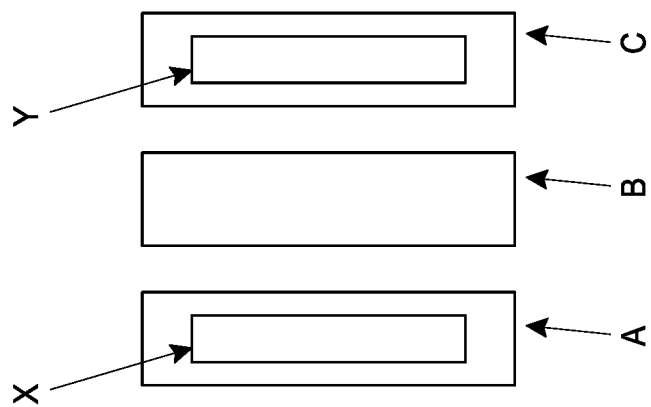
FIG. 56C illustrates a third indication engagement configuration of the cartridge and the pump unit of FIG. 55.
Figure 56B:
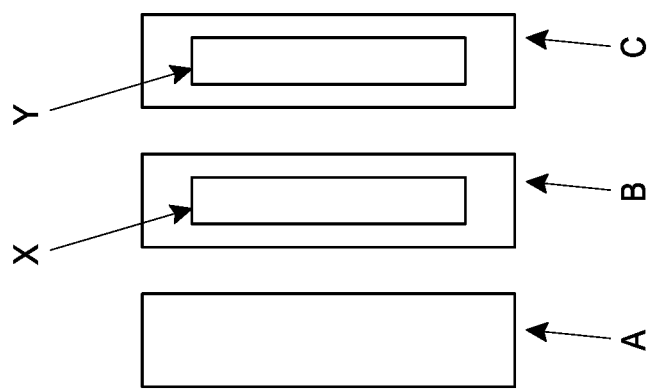
FIG. 56B illustrates a second indication engagement configuration of the cartridge and the pump unit of FIG. 55.
Figure 56A:
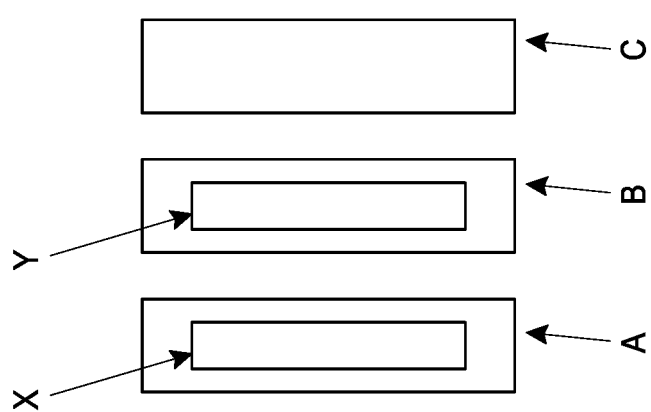
FIG. 56A illustrates a first indication engagement configuration of the cartridge and the pump unit of FIG. 55.

In some embodiments, the sensing element can comprise a mechanical configuration or array to provide an indication of one or more characteristics of the cartridge 1002. In some implementations, the number, type, position, shape, arrangement, orientation, and/or other characteristics of the mechanical configuration or array (e.g., projection members) can be used to discern one or more characteristics of the cartridge 1002 and/or the contents thereof. For example, with reference to the embodiments of FIGS. 56A-56C, the sensing element comprises a plurality of slots, such as three slots, A, B, and C, and the cartridge 1002 comprises a plurality of pins, such as two pins X, Y configured to engage two of the slots. As shown in FIG. 56A, a first characteristic of the cartridge 1002 and/or the contents thereof can be discerned when the pins X, Y engage slots A and B. As illustrated in FIG. 56B, a second characteristic of the cartridge 1002 and/or the contents thereof can be discerned when the pins X, Y engage slots B and C. As shown in FIG. 56C, a third characteristic of the cartridge 1002 and/or the contents thereof can be discerned when the pins X, Y engage slots A and C.

In some embodiments, the cartridge 1002 comprises electrical contacts that can engage with corresponding electrical contacts of the sensing element of the pump unit 1001, thereby allowing for one or more characteristics of the cartridge 1002 to be determined based on which of the corresponding electrical contacts are engaged. In some embodiments, the sensing element can comprise electronic circuitry configured to produce one or more electronic signals, such as a specific resistance value in the cartridge or a specific voltage or current output (including a range of outputs) generated by a power source in the cartridge, that can be sensed by the pump unit 1001 upon engagement therewith to determine one or more characteristics of the cartridge 1002. For example, a first electronic characteristic, such as a first resistance value or voltage or current value (e.g., 100 ohms, 1 volt, or 5 amps), can indicate a first characteristic (e.g., the cartridge contains soap), and a second electronic characteristic, such as a second resistance value or voltage or current value (e.g., 300 ohms, 5 volts, or 10 amps), can indicate a second characteristic (e.g., the cartridge contains a hand sanitizer), etc. There can be any number of electronic signals correlated to different cartridge characteristics (e.g., at least 2, at least 3, etc.).

In some embodiments, the pump unit 1001 contains memory, such as firmware. The memory can contain subroutines for performing any of the processes or steps disclosed herein and/or data, such as a cross-reference, that can be used to determine what the various cartridge 1002 indications represent in terms of the characteristics of the contents of the cartridge 1002 (e.g., fluid type, volume, power source voltage, and otherwise). For example, in the embodiments of FIGS. 56A-56C, when pins X, Y are found to engage slots A and B, the memory could be accessed to determine that such a configuration indicates that the cartridge contains a predetermine quantity of liquid hand soap; when pins X, Y are found to engage slots B and C, the memory could be accessed to determine that such a configuration indicates that the cartridge contains a different predetermined quantity of liquid hand soap; and when pins X, Y are found to engage slots A and C, the memory could be accessed to determine that such a configuration indicates that the cartridge contains a predetermined quantity of lotion.

In some embodiments, one or more of the output characteristics of the pump unit 1001 can be adjusted based on, in whole or in part, the indication from the cartridge 1002 to the pump unit 1001. For example, the dispensation volume, dispensation period, motor duty cycle, pumping pressure, operational voltage, and/or other characteristics can be adjusted based on the indication of the cartridge 1002 to the pump unit 1001 regarding one or more characteristics of the contents of the cartridge 1002. For example, in some implementations, if the cartridge 1002 is determined to contain a first type of fluid (e.g., liquid soap), then the pump unit 1001 can be automatically adjusted to dispense a first volume (e.g., about 1.0 milliliter) of the first fluid when the pump unit 1001 is activated. In some variants, if the cartridge 1002 is determined to contain a second fluid that is different from the first fluid (e.g., lotion), then the pump unit 1001 can be adjusted to dispense a second volume that is different from the first volume (e.g., 2.0 milliliters) of the second fluid when the pump unit 1001 is activated. In some embodiments, the output characteristic adjustments can be contained in the memory of the pump unit 1001. For example, when the memory is accessed to determine the contents of the cartridge 1002, the memory can be accessed to determine what adjustments to the pump unit 1001 should be made for such contents. In some embodiments, a manual adjustment of a characteristic (such as liquid dispensing volume control) is not required when an automatic adjustment of that characteristic is performed.

In certain embodiments, the output characteristics of the pump unit 1001 can be adjusted based on the viscosity of the fluid contained in the cartridge 1002. For example, in some variants, the pumping pressure and/or amount of power applied to the motor can be changed as a function of the viscosity of the fluid contained in the cartridge 1002. For example, when the pump unit 1001 determines that the cartridge 1002 contains a first fluid (e.g., a liquid soap) with a first viscosity, the pump unit can adjust the motor's duty cycle to a first setting (e.g., 60%), and when the pump unit 1001 determines that a second cartridge 1002 contains a second fluid (e.g., a second type of liquid soap) with a second viscosity (e.g., different than the first viscosity), the pump unit can adjust the motor's duty cycle to a second setting that is different from the first setting (e.g., 80%). In certain variants, the pump unit can be programmed to increase the volume of fluid dispensed or to dispense liquid for a longer period of time, such as by increasing the number of duty cycles of the motor.

In some embodiments, the pump unit 1001 and/or the cartridge 1002 can be configured such that the power source (e.g., one or more batteries) and the fluid contents are exhausted at about the same time. Thus, the cartridge 1002 can be discarded with little or no unused fluid and/or power reserve. Such a configuration can, for example, promote efficiency by reducing the amount of fluid and/or power reserve that is unused yet discarded.

In certain implementations, the amount of fluid in the cartridge 1002 is described as a "fluid rating," which is a percentage of the initial fluid level remaining in the cartridge. In some variants, the amount of power in the cartridge 1002 is described as a "power rating," which is a percentage of the initial amount of power remaining in the power source. Generally, the cartridge 1002 initially includes a 100% fluid rating and a 100% power rating. In some embodiments, after half of the fluid and half of the power have been expended, the cartridge 1002 has a 50% fluid rating and a 50% power rating. In certain implementations, the cartridge 1002 can be configured such that the fluid rating and the power rating decrease approximately in unison. In some embodiments, the cartridge 1002 can be configured such that the fluid rating and the power rating are proportionally related. In some embodiments, the fluid rating and the power rating each decrease in a generally linear manner.

Certain variants have a fluid rating and power rating that decrease at different rates. Such a configuration can be beneficial, for example, in embodiments in which the amount of power needed to expel an amount of fluid increases as the fluid rating decreases (e.g., to overcome head pressure, gravity, friction, or otherwise). In some embodiments, the cartridge 1002 can be configured such that the fluid rating reaches approximately 0% before the power rating reaches approximately 0%, thereby providing a small reserve of power for expelling the last of the fluid. In certain implementations, the fluid rating decreases in a generally linear manner and the power rating decreases in a generally exponential manner. In some variants, the fluid rating and the power rating each decrease in generally linearly, but with different slopes.

In some embodiments, the pump unit 1001 can be programmed with different settings for the same cartridge contents. For example, the dispenser may include one or more sensing regions similar or identical to the sensing regions discussed in reference to FIGS. 33-36. If a signal is detected in a sensing region, the sensor can trigger the dispenser to perform a specific operation based on the particular signal. For example, the specific operation may vary based on the distance between a hand H and the sensor, and/or other parameters such as angle, duration, repetition, path of motion, and/or speed of motion. The different settings can be activated using different input or selector devices, such as buttons, knobs, or other devices. The settings triggered by the sensor or input device can change depending on the type of cartridge 1002 connected to the pump 1001.

The dispenser can include one or more indicators configured to issue a visual, audible, or other type of indication to a user of the dispenser. For example, the dispenser may indicate the type (e.g., soap or lotion) of dispensing fluid contained in the cartridge 1002, the actual or estimated volume of dispensing fluid remaining in the cartridge 1002, or otherwise. Certain embodiments are configured to indicate the actual or estimated power source voltage, remaining capacity, life expectancy (e.g., in terms of time or number of dispensations), or otherwise.

Figure 57:
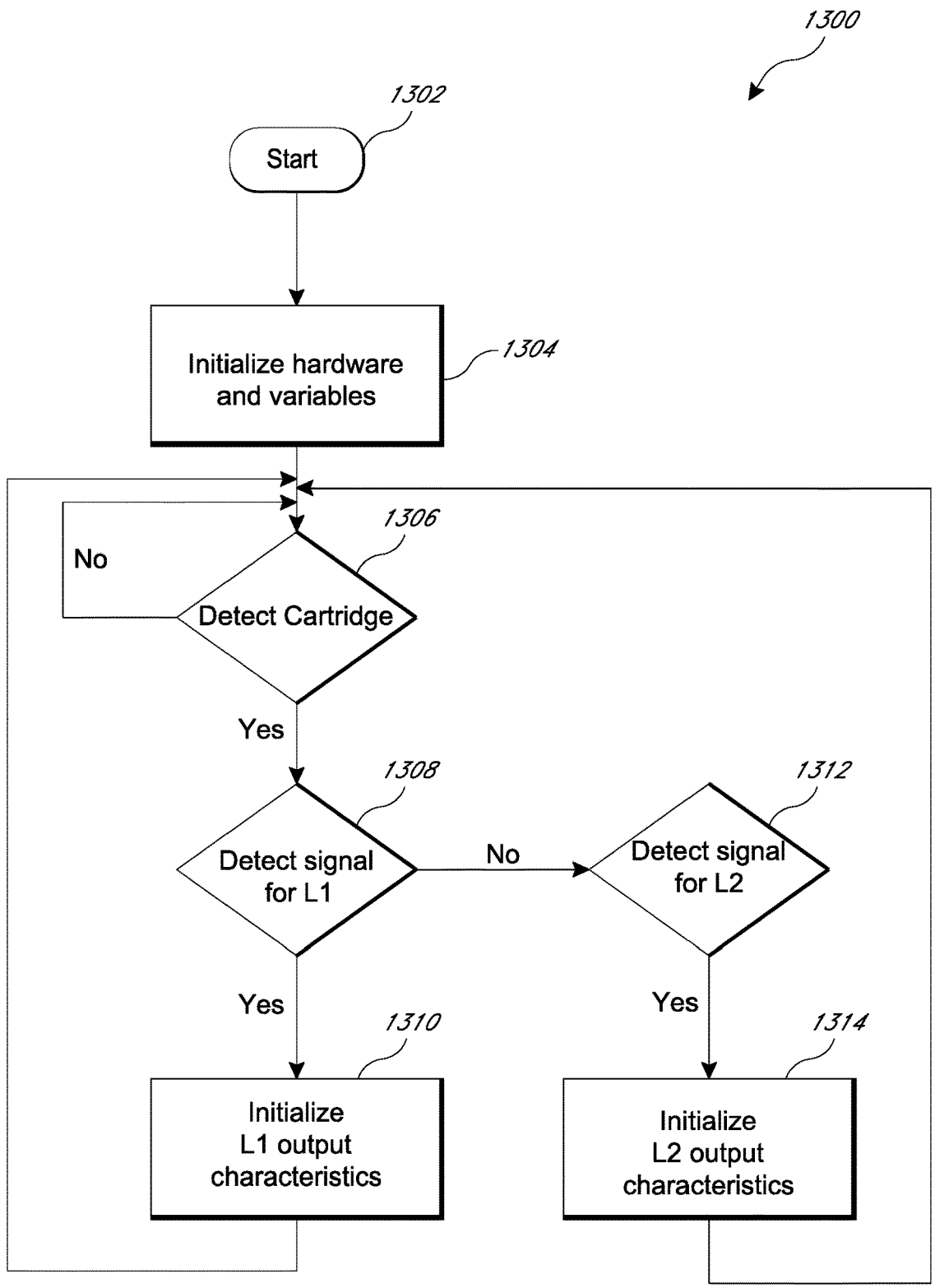
FIG. 57 illustrates an algorithm for controlling a soap dispenser, such as the embodiment of FIG. 55.

In some embodiments, the soap dispenser can include a controller (e.g., a processor) configured to implement one or more algorithms. The algorithms can be configured to send commands to control one or more aspects of the liquid dispenser, such as one or more commands to dispense the fluid from the cartridge 1002 according to the discerned characteristics of the cartridge 1002. An example of such an algorithm is illustrated in FIG. 57. Beginning at start block 1302, in operation block 1304, the module 1300 initializes hardware and variables. The algorithm can then proceed to decision block 1306, in which the module 1300 determines whether a cartridge 1002 is connected to the pump unit 1001. Next, in decision block 1308, the module 1300 can determine whether the sensing element of the pump unit has determined that the cartridge 1002 contains a first feature (e.g., a particular type of liquid soap) L1. If L1 is detected, then, in operation block 1310, the module 1300 can initiate output characteristics pre-programmed for feature L1. For example, the pump unit 1001 can set the soap dispensation time and/or volume of to a level appropriate for L1. The adjusted output characteristics may include any combination of output characteristics described above. The algorithm can then return to block 1306 to repeat the logic loop. If L1 is not detected, then the algorithm can proceed to decision block 1312, in which the module 1300 can determine whether the cartridge 1002 contains a second feature L2 (e.g., a different type of liquid than L1, such as lotion or hand sanitizer). If L2 is detected, then, in operation block 1314, the module 1300 can initiate output characteristics pre-programmed for liquid L2. For example, the pump unit 1001 can set the liquid dispensation time and/or volume to a level appropriate for L2. As shown, the algorithm can then return to block 1306 to repeat the logic loop. Module 1300 does not need to include all of the blocks described above, or it may include more or different blocks to account for additional and/or different features (e.g., fluid viscosity, fluid volume, power supply type and/or voltage, cartridge life expectancy and/or expiration, or otherwise).

Although the soap dispenser has been disclosed in the context of certain embodiments and examples, it will be understood by those skilled in the art that the soap dispenser extends beyond the specifically disclosed embodiments to other alternative embodiments and/or uses of the embodiments and certain modifications and equivalents thereof. For example, some embodiments can be configured to use a fluid other than soap, e.g., hand sanitizer, shampoo, hair conditioner, skin moisturizer or other lotions, toothpaste, or other fluids. It should be understood that various features and aspects of the disclosed embodiments can be combined with or substituted for one another in order to form varying modes of the soap dispenser. Accordingly, it is intended that the scope of the soap dispenser herein-disclosed should not be limited by the particular disclosed embodiments described above, but should be determined only by a fair reading of the claims that follow.

The following is claimed:

1. A fluid dispenser comprising:
   a housing;
   a reservoir configured to store a fluid;
   a fluid passage disposed in the housing, the fluid passage having an inlet and an outlet;
   a sensor configured to generate a signal indicative of a distance to an object that is located under the sensor and under the outlet;
   a pump unit disposed in the housing; and
   an electronic processor configured to:
   calculate a dispensation amount, wherein the dispensation amount increases as the distance to the object increases, wherein the object is the same object; and energize the pump unit to dispense the dispensation amount.

2. The fluid dispenser of claim 1, wherein the fluid dispenser comprises a soap dispenser.

3. The fluid dispenser of claim 1, wherein the processor is further configured to drive the pump unit to dispense the dispensation amount in a single dispensation.

4. The fluid dispenser of claim 1, wherein the distance is a vertical distance.

5. The fluid dispenser of claim 1, further comprising a second sensor configured to generate a signal in response to the object being within a sensing region of the second sensor.

6. The fluid dispenser of claim 5, wherein the electronic processor is further configured to receive the signal from the second sensor and, in response, to control the pump unit to dispense approximately an upper dispensation amount of fluid, the upper dispensation amount being greater than the dispensation amount.

7. The fluid dispenser of claim 1, further comprising a port configured to connect the fluid dispenser to a computer.

8. The fluid dispenser of claim 1, further comprising a user input device configured to transmit, to the processor, a signal to dispense a volume of the liquid.

9. The fluid dispenser of claim 1, wherein the liquid comprises liquid soap.

10. The fluid dispenser of claim 1, wherein the pump unit is configured to dispense a first volume of the fluid when the object is within a first distance from the sensor and dispense a second volume of the fluid when the object is within a second distance from the sensor, the first volume being less than the second volume and the first distance being less than the second distance.

11. The fluid dispenser of claim 1, wherein the pump unit comprises an opening in fluid communication with the reservoir, and wherein the pump unit is configured to allow air disposed in the reservoir to pass through the opening.

12. The fluid dispenser of claim 1, wherein the reservoir comprises a removable cartridge.

13. The fluid dispenser of claim 1, wherein the pump unit comprises a gearpump with at least two gears.

14. The fluid dispenser of claim 1, wherein the pump unit is configured to discharge fluid generally vertically from a pump outlet.

15. The fluid dispenser of claim 1, wherein the object is a user's hand or other body part.

16. The fluid dispenser of claim 1, wherein the electronic processor is further configured such that the dispensation amount increases as the distance to the object increases while the object is maintained in a detection zone of the sensor.

17. The fluid dispenser of claim 1, wherein the sensor is positioned lower on the dispenser than the outlet.

18. The fluid dispenser of claim 1, wherein the sensor comprises at least one of a light emitting portion and a light receiving portion.

19. The fluid dispenser of claim 1, wherein the sensor comprises a proximity sensor or a reflective type sensor.

20. The fluid dispenser of claim 1, further comprising a cantilevered portion having a lower surface, the outlet and the sensor being located on the lower surface of the cantilevered portion.

21. A method of operating a fluid dispenser, the method comprising:
sensing, with a sensor of the fluid dispenser, a distance to an object that is located under the sensor and under an outlet of the fluid dispenser;
generating a signal indicative of the distance to the object;
determining, with an electronic processor, a dispensation amount based on the distance to the object, wherein the dispensation amount decreases as the distance to the object decreases, and wherein the object is the same object;
energizing a pump unit disposed in a housing of the fluid dispenser; and
dispensing a volume of fluid based on the dispensation amount.

22. The method of claim 21, wherein the fluid dispenser comprises a soap dispenser.

23. The method of claim 21, wherein dispensing the volume of fluid comprises dispensing the volume of fluid in a single dispensation.

24. The method of claim 21, wherein the distance to the object is a vertical distance.

25. The method of claim 21, further comprising drawing fluid from a reservoir that comprises a removable cartridge.

26. The method of claim 21, wherein the dispensation amount increases as the distance to the object increases.

27. The method of claim 21, wherein determining the dispensation amount based on the distance to the object further comprises:
identifying which one of a plurality of sensing regions the object is positioned in; and
determining the dispensation amount based on the identified sensing region.

28. A fluid dispenser configured to dispense soap in response to detecting an object, the fluid dispenser comprising:
a housing;
a reservoir configured to store soap;
a liquid passage disposed in the housing, the liquid passage having an inlet and an outlet;
a nozzle connected with the outlet;
a sensor that is configured to detect a distance to the object when the object is below the outlet, wherein the sensor is the fluid dispenser's one and only sensor that is configured to detect the distance to the object;
a pump unit disposed in the housing; and
an electronic processor configured to:
calculate a dispensation amount of soap based at least partially on the distance to the object, wherein the dispensation amount of soap varies as the distance to the object varies, and wherein the object is the same object; and
energize the pump unit to dispense the dispensation amount of soap.

29. The fluid dispenser of claim 28, wherein the nozzle is configured to dispense the soap in a dispensation direction, and wherein the sensor is configured to detect the distance to the object in a direction that is substantially parallel to the dispensation direction.

30. The fluid dispenser of claim 29, wherein the dispensation direction is generally vertically downward.

31. The fluid dispenser of claim 28, further comprising a cantilevered portion, the nozzle and the sensor being located on a lower surface of the cantilevered portion.

32. A method of operating a soap dispenser comprising a sensor, a pump, and an electronic processor, the method comprising:
detecting a user's hand a first distance below the sensor;
determining, with the electronic processor, a first dispensation amount of soap based on the first distance;
dispensing, using the pump, the first dispensation amount of soap onto the user's hand;

detecting the user's same hand a second distance from the sensor, the second distance being greater than the first distance;

determining, with the electronic processor, a second dispensation amount of soap based on the second distance, the second dispensation amount of soap being greater than the first dispensation amount of soap; and dispensing, using the pump, the second dispensation amount of soap onto the user's same hand.

\* \* \* \* \*